(12) United States Patent
Knoefler et al.

(10) Patent No.: US 7,915,667 B2
(45) Date of Patent: Mar. 29, 2011

(54) INTEGRATED CIRCUITS HAVING A CONTACT REGION AND METHODS FOR MANUFACTURING THE SAME

(75) Inventors: Roman Knoefler, Dresden (DE); Michael Specht, Munich (DE); Franz Hofmann, Munich (DE); Florian Beug, Dresden (DE); Dirk Manger, Dresden (DE); Stephan Riedel, Dresden (DE)

(73) Assignee: Qimonda AG, Munich (DE)

( * ) Notice: Subject to any disclaimer, the term of this patent is extended or adjusted under 35 U.S.C. 154(b) by 332 days.

(21) Appl. No.: 12/137,388

(22) Filed: Jun. 11, 2008

(65) Prior Publication Data

US 2009/0309152 A1    Dec. 17, 2009

(51) Int. Cl.
*H01L 29/792* (2006.01)
*H01L 29/788* (2006.01)
*H01L 21/336* (2006.01)

(52) U.S. Cl. ........ 257/324; 257/206; 257/211; 257/314; 257/390; 257/E29.309; 257/E21.613; 257/E21.614; 257/E21.409; 257/E21.656; 257/E21.679; 438/257

(58) Field of Classification Search .................. 257/314, 257/324, E21.409, E29.309, 206, 211, 390, 257/E21.613–E21.614, E21.656, E21.679–E21.68; 438/257
See application file for complete search history.

(56) References Cited

U.S. PATENT DOCUMENTS

| | | | |
|---|---|---|---|
| 6,362,056 B1 * | 3/2002 | Tonti et al. ................ | 438/275 |
| 7,714,377 B2 * | 5/2010 | Specht et al. ............... | 257/316 |
| 2004/0206996 A1 | 10/2004 | Lee et al. | |
| 2005/0133916 A1 | 6/2005 | Karnezos | |
| 2006/0102952 A1 * | 5/2006 | Lee ............................ | 257/324 |
| 2007/0018201 A1 * | 1/2007 | Specht et al. ............... | 257/204 |
| 2007/0252201 A1 * | 11/2007 | Kito et al. ................... | 257/331 |
| 2008/0067583 A1 * | 3/2008 | Kidoh et al. ............... | 257/326 |
| 2008/0073635 A1 * | 3/2008 | Kiyotoshi et al. .......... | 257/2 |
| 2008/0149913 A1 * | 6/2008 | Tanaka et al. .............. | 257/5 |
| 2008/0173932 A1 * | 7/2008 | Kidoh et al. ............... | 257/324 |
| 2008/0180994 A1 * | 7/2008 | Katsumata et al. ......... | 365/174 |
| 2008/0259687 A1 * | 10/2008 | Specht et al. ............... | 365/185.17 |
| 2008/0315291 A1 * | 12/2008 | Kito et al. ................... | 257/324 |
| 2009/0230449 A1 * | 9/2009 | Sakaguchi et al. ......... | 257/298 |
| 2009/0267135 A1 * | 10/2009 | Tanaka et al. .............. | 257/324 |
| 2010/0059811 A1 * | 3/2010 | Sekine et al. ............... | 257/324 |
| 2010/0109071 A1 * | 5/2010 | Tanaka et al. .............. | 257/324 |
| 2010/0155818 A1 * | 6/2010 | Cho et al. ................... | 257/324 |

OTHER PUBLICATIONS

Lee, Y.K., et al., "Multi-Level Vertical Channel SONOS Nonvolatile Memory on SOI," IEEE, Symposium on VLSI Technology Digest of Technical Papers, 2002, 2 pages.

* cited by examiner

*Primary Examiner* — Zandra Smith
*Assistant Examiner* — Jeremy J Joy
(74) *Attorney, Agent, or Firm* — John S. Economou

(57) ABSTRACT

In an embodiment, an integrated circuit having a memory cell arrangement is provided. The memory cell arrangement may include a substrate, a fin structure disposed above the substrate, and a memory cell contacting region. The fin structure may include a memory cell region having a plurality of memory cell structures being disposed above one another, each memory cell structure having an active region of a respective memory cell. Furthermore, the memory cell contacting region may be configured to electrically contact each of the memory cell structures, wherein the memory cell contacting region may include a plurality of contact regions, which are at least partially displaced with respect to each other in a direction parallel to the main processing surface of the substrate.

20 Claims, 39 Drawing Sheets

INTEGRATED CIRCUITS HAVING A CONTACT REGION AND METHODS FOR MANUFACTURING THE SAME

TECHNICAL FIELD

Embodiments relate generally to integrated circuits having a contact region and to methods for manufacturing the same.

BACKGROUND

The market pressure to increase the memory cell density is continuously growing. This results in a higher demand in contacting the memory cells in a memory cell arrangement, for example, in case of a three-dimensional integration of memory cells in an integrated circuit.

SUMMARY OF THE INVENTION

An embodiment provides an integrated circuit having a memory cell arrangement. The memory cell arrangement may include a substrate, a fin structure disposed above the substrate, and a memory cell contacting region. The fin structure may include a memory cell region having a plurality of memory cell structures being disposed above one another, wherein each memory cell structure may have an active region of a respective memory cell. Furthermore, the memory cell contacting region may be configured to electrically contact each of the memory cell structures, wherein the memory cell contacting region may include a plurality of contact regions, which are at least partially displaced with respect to each other in a direction parallel to the main processing surface of the substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

As used herein the terms connected and coupled are intended to include both direct and indirect connection and coupling, respectively. Furthermore, in an embodiment, the terms connected and coupled are intended to include a resistive connection or resistive coupling.

Figure 1:
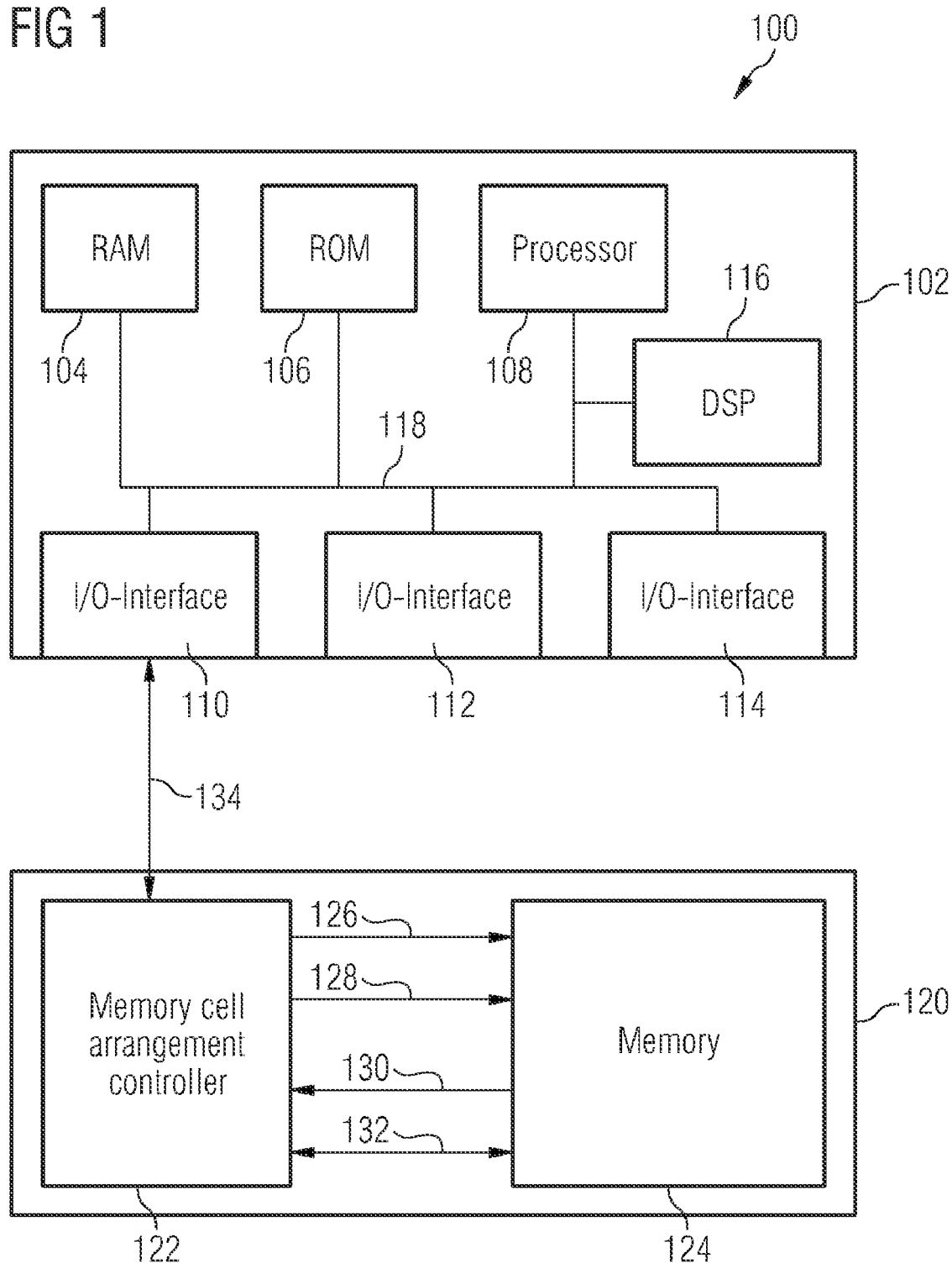
FIG. 1 shows a computer system having a memory cell arrangement in accordance with an embodiment.

FIG. 1 shows a computer system 100 having a computer arrangement 102 and a memory cell arrangement 120 in accordance with an embodiment.

In various embodiments, the computer arrangement 102 may be configured as or may include any device having a processor, e.g., having a programmable processor such as, e.g., a microprocessor (e.g., a CISC (complex instruction set computer) microprocessor or a RISC (reduced instruction set computer) microprocessor). In various embodiments, the computer arrangement 102 may be configured as or may include a personal computer, a workstation, a laptop, a notebook, a personal digital assistant (PDA), a radio telephone (e.g., a wireless radio telephone or a mobile radio telephone), a camera (e.g., an analog camera or a digital camera), or another device having a processor (such as, e.g., a household appliance (such as, e.g., a washing machine, a dishwashing machine, etc.)).

In an embodiment, the computer arrangement 102 may include one or a plurality of computer arrangement-internal random access memories (RAM) 104, e.g., one or a plurality of computer arrangement-internal dynamic random access memories (DRAM), in which, for example, data to be processed may be stored. Furthermore, the computer arrangement 102 may include one or a plurality of computer arrangement-internal read only memories (ROM) 106, in which, for example, the program code may be stored, which should be executed by a processor 108 (e.g., a processor as described above), which may also be provided in the computer arrangement 102.

Furthermore, in an embodiment, one or a plurality of input/output interfaces 110, 112, 114 (in FIG. 1, there are shown three input/output interfaces, in alternative embodiments, e.g., one, two, four, or even more than four input/output interfaces may be provided) configured to connect one or a plurality of computer arrangement-external devices (such as, e.g., additional memory, one or a plurality of communication devices, one or a plurality of additional processors) to the computer arrangement 102, may be provided in the computer arrangement 102.

The input/output interfaces 110, 112, 114 may be implemented as analog interfaces and/or as digital interfaces. The input/output interfaces 110, 112, 114 may be implemented as serial interfaces and/or as parallel interfaces. The input/output interfaces 110, 112, 114 may be implemented as one or a plurality of circuits, which implements or implement a respective communication protocol stack in its functionality in accordance with the communication protocol which is respectively used for data transmission. Each of the input/output interfaces 110, 112, 114 may be configured in accordance with any communication protocol. In an embodiment, each of the input/output interfaces 110, 112, 114 may be implemented in accordance with one of the following communication protocols:

an ad hoc communication protocol such as, e.g., Firewire or Bluetooth;
a communication protocol for a serial data transmission such as, e.g., RS-232, Universal Serial Bus (USB) (e.g., USB 1.0, USB 1.1, USB 2.0, USB 3.0);
any other communication protocol such as, e.g., Infrared Data Association (IrDA).

In an embodiment, the first input/output interface 110 is a USB interface (in alternative embodiments, the first input/output interface 110 may be configured in accordance with any other communication protocol such as, e.g., in accordance with a communication protocol which has been described above).

In an embodiment, the computer arrangement 102 optionally may include an additional digital signal processor (DSP) 116, which may be provided, e.g., for digital signal processing. Furthermore, the computer arrangement 102 may include additional communication modules (not shown) such as, e.g., one or a plurality of transmitters, one or a plurality of receivers, one or a plurality of antennas, and so on.

The computer arrangement 102 may also include additional components (not shown), which are desired or required in the respective application.

In an embodiment, some or all of the circuits or components provided in the computer arrangement 102 may be coupled with each other by means of one or a plurality of computer arrangement-internal connections 118 (for example, by means of one or a plurality of computer busses) configured to transmit data and/or control signals between the respectively coupled circuits or components.

Furthermore, as has been described above, the computer system 100, in accordance with an embodiment, may include the memory cell arrangement 120.

The memory cell arrangement 120 may in an embodiment be configured as an integrated circuit. The memory cell arrangement 120 may further be provided in a memory module having a plurality of integrated circuits, wherein at least one integrated circuit of the plurality of integrated circuits includes a memory cell arrangement 120, as will be described in more detail below. The memory module may be a stackable memory module, wherein some of the integrated circuit may be stacked one above the other. In an embodiment, the memory cell arrangement 120 is configured as a memory card.

In an embodiment, the memory cell arrangement 120 may include a memory cell arrangement controller 122 (for example, implemented by means of hard wired logic and/or by means of one or a plurality of programmable processors, e.g., by means of one or a plurality of programmable processors such as, e.g., one or a plurality of programmable microprocessors (e.g., CISC (complex instruction set computer) microprocessor(s) or RISC (reduced instruction set computer) microprocessor(s)).

The memory cell arrangement 120 may further include a memory 124 having a plurality of memory cells. The memory 124 will be described in more detail below.

In an embodiment, the memory cell arrangement controller 122 may be coupled with the memory 124 by means of various connections. Each of the connections may include one or a plurality of lines and may thus have a bus width of one or a plurality of bits. Thus, by way of example, an address bus 126 may be provided, by means of which one or a plurality of addresses of one or a plurality of memory cells may be provided by the memory cell arrangement controller 122 to the memory 124, on which an operation (e.g., an erase operation, a write operation, a read operation, an erase verify operation, or a write verify operation, etc.) should be carried out. Furthermore, a data write connection 128 may be provided, by means of which the information to be written into the respectively addressed memory cell may be supplied by the memory cell arrangement controller 122 to the memory 124. Furthermore, a data read connection 130 may be provided, by means of which the information stored in the respectively addressed memory cell may be read out of the memory 124 and may be supplied from the memory 124 to the memory cell arrangement controller 122 and via the memory cell arrangement controller 122 to the computer arrangement 102, or, alternatively, directly to the computer arrangement 102 (in which case the first input/output interface 110 would directly be connected to the memory 124). A bidirectional control/state connection 132 may be used for providing control signals from the memory cell arrangement controller 122 to the memory 124 or for supplying state signals representing the state of the memory 124 from the memory 124 to the memory cell arrangement controller 122.

In an embodiment, the memory cell arrangement controller 122 may be coupled to the first input/output interface 110 by means of a communication connection 134 (e.g., by means of a USB communication connection).

In an embodiment, the memory 124 may include one chip or a plurality of chips. Furthermore, the memory cell arrangement controller 122 may be implemented on the same chip (or die) as the components of the memory 124 or on a separate chip (or die).

Figure 2:
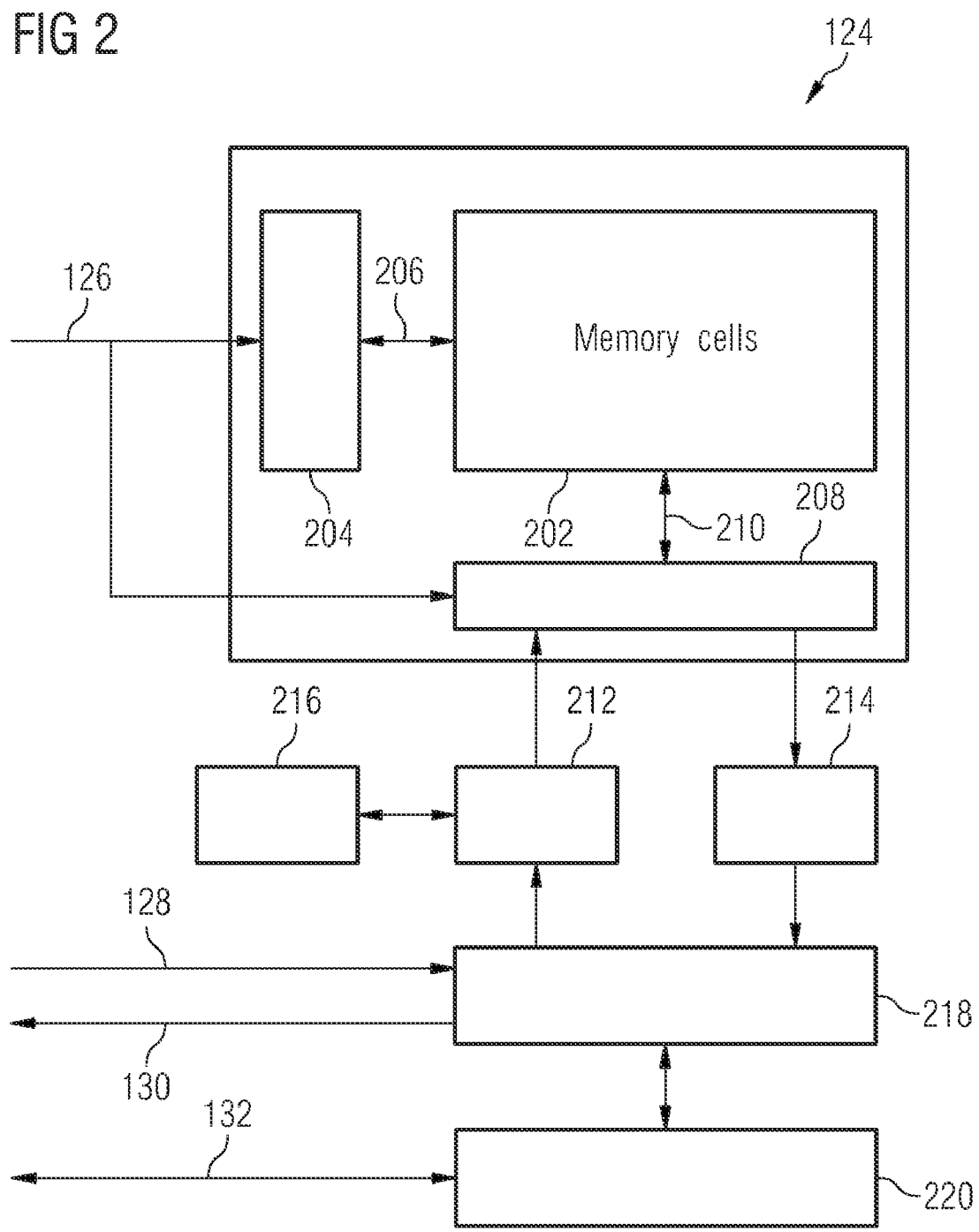
FIG. 2 shows a memory in accordance with an embodiment.

FIG. 2 shows the memory 124 of FIG. 1 in accordance with an embodiment in more detail.

In an embodiment, the memory 124 may include a memory cell field (e.g., a memory cell array) 202 having a plurality of memory cells. The memory cells may be arranged in the memory cell field 202 in the form of a matrix in rows and columns, or, alternatively, for example, in zig zag form. In other embodiments, the memory cells may be arranged within the memory cell field 202 in any other manner or architecture.

In general, each memory cell may, for example, be coupled with a first control line (e.g., a word line) and with at least one second control line (e.g., at least one bit line).

In an embodiment, in which the memory cells are arranged in the memory cell field 202 in the form of a matrix in rows and columns, a row decoder circuit 204 configured to select at least one row control line (e.g., a word line) of a plurality of row control lines 206 in the memory cell field 202 may be provided as well as a column decoder circuit 208 configured to select at least one column control line (e.g., a bit line) of a plurality of column control lines 210 in the memory cell field 202.

In an embodiment, the memory cells are non-volatile memory cells.

A "non-volatile memory cell" may be understood as a memory cell storing data even if it is not active. In an embodiment, a memory cell may be understood as being not active, e.g., if current access to the content of the memory cell is inactive. In another embodiment, a memory cell may be understood as being not active, e.g., if the power supply is inactive. Furthermore, the stored data may be refreshed on a regular timely basis, but not, as with a "volatile memory cell" every few picoseconds or nanoseconds or milliseconds, but rather in a range of hours, days, weeks or months. Alternatively, the data may not need to be refreshed at all in some designs.

The non-volatile memory cells may be, e.g., charge storing random access memory cells (e.g., floating gate memory cells or charge trapping memory cells).

In alternative embodiments, also other types of non-volatile memory cells may be used.

Furthermore, the memory cells may be electrically erasable read only memory cells (EEPROM).

In an embodiment, each charge trapping memory cell includes a charge trapping layer structure for trapping electrical charge carriers. The charge trapping layer structure may include one or a plurality of two separate charge trapping regions. In an embodiment, the charge trapping layer structure includes a dielectric layer stack including at least one dielectric layer or at least two dielectric layers being formed above one another, wherein charge carriers can be trapped in at least one dielectric layer. By way of example, the charge trapping layer structure includes a charge trapping layer, which may include or consist of one or more materials being selected from a group of materials that consists of: aluminum oxide ($Al_2O_3$), yttrium oxide ($Y_2O_3$), silicon nitride ($Si_3N_4$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In one embodiment, the charge trapping layer structure includes a dielectric layer stack including three dielectric layers being formed above one another, e.g., a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. In an alternative embodiment, the charge trapping layer structure includes two, four or even more dielectric layers being formed above one another. In another embodiment, the charge trapping layer structure may include a so-called TANOS layer stack, which may include a substrate, an oxide layer (e.g., silicon oxide) on the substrate (the oxide layer, e.g., having a layer thickness in the range from about 3 nm to about 6 nm), a nitride layer (e.g., silicon nitride) on the oxide layer (the nitride layer, e.g., having a layer thickness in the range from about 3 nm to about 10 nm), a high-k dielectric layer (e.g., having a dielectric constant higher than 3.9) on the nitride layer (the high-k dielectric layer including, e.g., aluminum oxide, and the high-k dielectric layer, e.g., having a layer thickness in the range from about 5 nm to about 15 nm), and a metal gate layer (e.g., made of tantalum nitride (TaN) or another metal having a high work function) on the high-k dielectric layer (the metal gate layer, e.g., having a layer thickness in the range from about 20 nm to about 300 nm).

In an embodiment, the memory cells may be multi-bit memory cells. As used herein the term "multi-bit" memory cell is intended to, e.g., include memory cells which are configured to store a plurality of bits by spatially separated electric charge storage regions or current conductivity regions, thereby representing a plurality of logic states.

In another embodiment, the memory cells may be multi-level memory cells. As used herein the term "multi-level" memory cell is intended to, e.g., include memory cells which are configured to store a plurality of bits by showing distinguishable voltage or current levels dependent on the amount of electric charge stored in the memory cell or the amount of electric current flowing through the memory cell, thereby representing a plurality of logic states.

In an embodiment, address signals are supplied to the row decoder circuit 204 and the column decoder circuit 208 by means of the address bus 126, which is coupled to the row decoder circuit 204 and to the column decoder circuit 208. The address signals uniquely identify at least one memory cell to be selected for an access operation (e.g., for one of the above described operations). The row decoder circuit 204 selects at least one row and thus at least one row control line 206 in accordance with the supplied address signal. Furthermore, the column decoder circuit 208 selects at least one column and thus at least one column control line 210 in accordance with the supplied address signal.

The electrical voltages that are provided in accordance with the selected operation, e.g., for reading, programming (e.g., writing) or erasing of one memory cell or of a plurality of memory cells, are applied to the selected at least one row control line 206 and to the at least one column control line 210.

In the case that each memory cell is configured in the form of a field effect transistor (e.g., in the case of a charge storing memory cell), in an embodiment, the respective gate terminal is coupled to the row control line 206 and a first source/drain terminal is coupled to a first column control line 210. A second source/drain terminal may be coupled to a second column control line 210. Alternatively, with a first source/drain terminal of an adjacent memory cell, which may then, e.g., also be coupled to the same row control line 206 (this is the case, e.g., in a NAND arrangement of the memory cells in the memory cell field 202).

In an embodiment, by way of example, for reading or for programming, a single row control line 206 and a single column control line 210 are selected at the same time and are appropriately driven for reading or programming of the thus selected memory cell. In an alternative embodiment, it may be provided to respectively select a single row control line 206 and a plurality of column control lines 210 at the same time for reading or for programming, thereby allowing to read or program a plurality of memory cells at the same time.

Furthermore, in an embodiment, the memory 124 includes at least one write buffer memory 212 and at least one read buffer memory 214. The at least one write buffer memory 212 and the at least one read buffer memory 214 are coupled with the column decoder circuit 208. Depending on the type of memory cell, reference memory cells 216 may be provided for reading the memory cells.

In order to program (e.g., write) a memory cell, the data to be programmed may be received by a data register 218, which is coupled with the data write connection 128, by means of the data write connection 128, and may be buffered in the at least one write buffer memory 212 during the write operation.

In order to read a memory cell, the data read from the addressed memory cell (represented, e.g., by means of an electrical current, which flows through the addressed memory cell and the corresponding column control line 210, which may be compared with a current threshold value in order to determine the content of the memory cell, wherein the current threshold value may e.g. be dependent from the reference memory cells 216) are, e.g., buffered in the read buffer memory 214 during the read operation. The result of the comparison und therewith the logic state of the memory cell (wherein the logic state of the memory cell represents the memory content of the memory cell) may then be stored in the data register 218 and may be provided via the data read connection 130, with which the data register 218 may be coupled.

The access operations (e.g. write operations, read operations, or erase operations) may be controlled by a memory-internal controller 220, which in turn may be controlled by the memory cell arrangement controller 122 by means of the bidirectional control/state connection 132. In an alternative embodiment, the data register 218 may directly be connected to the memory cell arrangement controller 122 by means of the bidirectional control/state connection 132 and thus directly controlled thereby. In this example, the memory-internal controller 220 may be omitted.

In an embodiment, the memory cells of the memory cell field may be grouped into memory blocks or memory sectors, which may be commonly erased in an erase operation. In an embodiment, there are so many memory cells included in a memory block or memory sector such that the same amount of data may be stored therein as compared with a conventional hard disk memory sector (e.g., 512 byte), although a memory block or memory sector may alternatively also store another amount of data.

Furthermore, other common memory components (e.g., peripheral circuits such as, e.g., charge pump circuits, etc.) may be provided in the memory 124, but they are neither shown in FIG. 1 nor in FIG. 2 for reasons of clarity.

Figure 3:
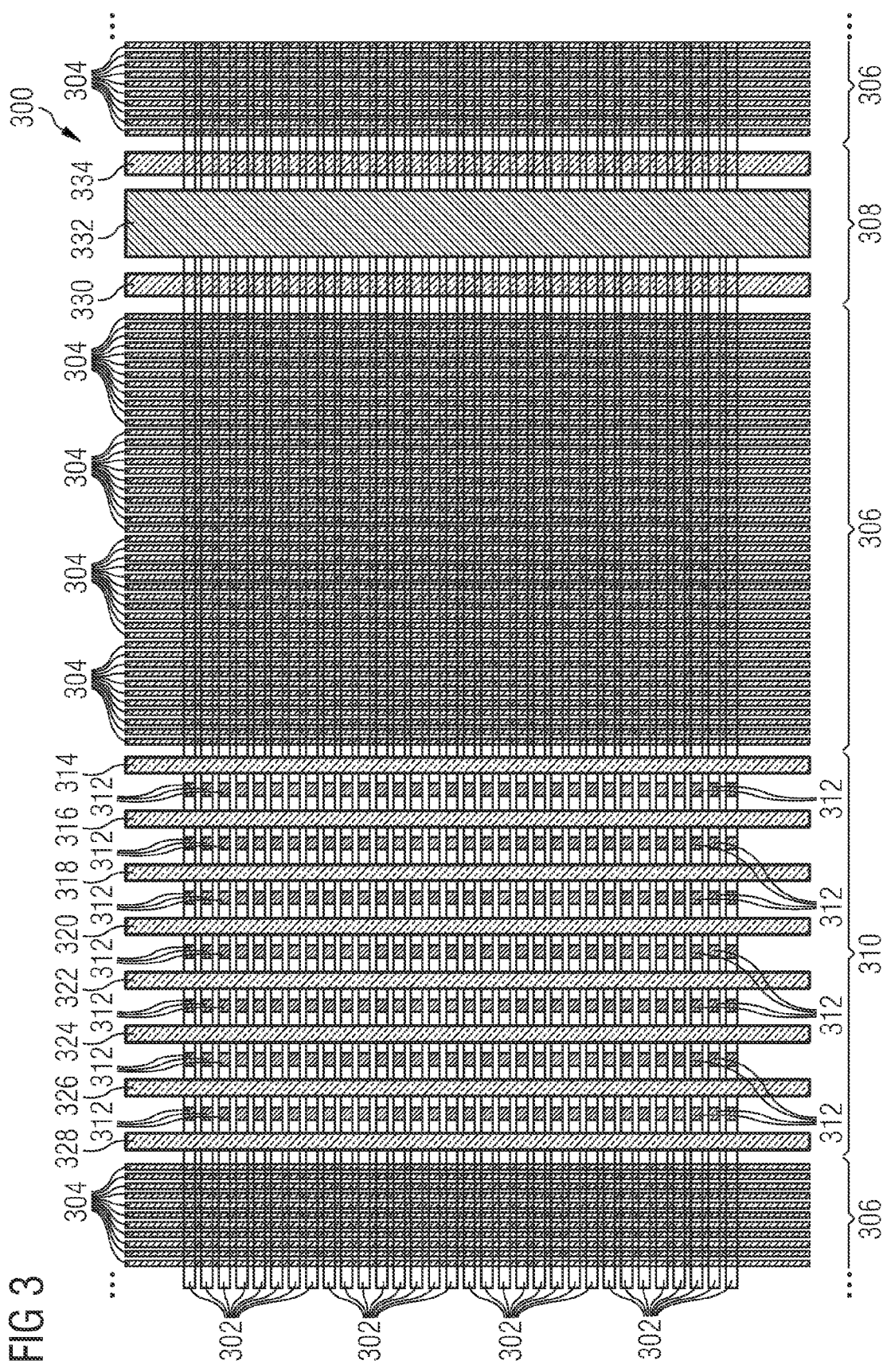
FIG. 3 shows a portion of a memory cell field of FIG. 2 in a top view in accordance with an embodiment.

As shown in FIG. 3, a layout of the portion 300 of the memory cell field 202 in accordance with an embodiment with a plurality of stacked non-volatile memory cells, is shown in a top view. It should be appreciated that FIG. 3 merely serves as an illustration of fabricating stacked non-volatile memory cells. The individual components shown in FIG. 3 are not true to scale.

The stacked non-volatile memory cells are arranged on vertical fins 302. Thirty-two fins 302 are shown in FIG. 3. The thirty-two fins 302 are arranged substantially parallel to each other on a substrate. Selection lines 304 (also referred to as word lines 304) are arranged in a direction within a plane that is perpendicular to a plane that is, e.g., defined by the longitudinal direction and the height direction of the fins 302 and are serving as lines for selecting a certain memory cell within the large number of thousands or millions or even billions or more of provided memory cells. The selection lines 304 are arranged in a memory cell region 306. Fourty-four word lines 304 are shown on top of the thirty-two fins 302 in a first portion of the memory cell region 306 and additional 44 word lines 304 (10 of them are shown in FIG. 3) are provided on the right hand side next to a source line region 308 (which will be described in more detail below) in a second portion of the memory cell region 306 and further additional 44 word lines 304 (10 of them are shown in FIG. 3) are provided on the left hand side next to a switch matrix region 310 (which also will be described in more detail below) in a third portion of the memory cell region 306. In accordance with an embodiment, any number of word lines 304 may be provided, e.g., 16 word lines 304, 32 word lines 304, 64 word lines 304, 128 word lines 304, etc.

The memory cell field 202 may include a plurality of periodically repeatedly occurring portions of the fins 302, wherein each periodically repeatedly occurring portion may include a memory cell region 306, a source line region 308, and a switch matrix region 310.

In an example, the switch matrix region 310 may include a plurality of contact plugs 312, which will be described in more detail below. At least two bit line contact plugs 312 provide an electrical contact to each of the portion of the fins 302. The bit line contact plugs 312 and the word lines 304 can be connected to a readout circuit (not shown), thus enabling individual memory cells to be selected and read out by means of an external circuit, e.g., the readout circuit. In an embodiment, the readout circuit may be implemented on the same die as the memory cells.

Between the two respective bit line contact plugs 312 for addressing a respective memory cell string within each fin 302, there are provided a plurality of (e.g., eigth) switch selection lines 314, 316, 318, 320, 322, 324, 326, 328, wherein the shown four first switch selection lines 314, 316, 318, 320, may be provided to individually address and select a respective memory cell string within a respective fin 302 in the first portion of the memory cell region 306 and the shown four second switch selection lines 322, 324, 326, 328, may be provided to individually address and select a respective memory cell string within a respective fin 302 in the third portion of the memory cell region 306.

The switch selection lines 314, 316, 318, 320, 322, 324, 326, 328, are arranged in a switch matrix in the switch matrix region 310 and may be used to select a certain memory cell along the fins 302, as will be described in more detail below.

As will be described in more detail below, in an alternative embodiment, a first additional switch selection line (not shown in FIG. 3) may be provided between a first selection line 314 of the fin 302 and a first word line 304 of a respective memory cell region 306 including the memory cells. The first additional switch selection line may also be referred to as a string selection line. In an embodiment, the switch matrix may include the string selection line. Furthermore, in an embodiment, a second additional switch selection line 330 may be provided (as part of the source line region 308) next to the word lines 304 opposite to the first additional switch selection line. The second additional switch selection line 330 may also be referred to as ground selection line 330. Moreover, a source line 332 may be provided next to the second additional switch selection line 330 in the source line region 308. Next to the source line 332, there may be provided another second additional switch selection line 334 adjacent to a first word line 304 of the second portion of the memory cell region 306. In other words, the source line 332 may be located between two second additional switch selection lines 330, 334. Moreover, further word lines 304 may be provided next to the other second additional switch selection line 334, optionally followed by another first additional switch selection line (not shown in FIG. 3). In an embodiment, this described structure may be repeatedly provided along the fins 302. The switch selection lines 314, 316, 318, 320, 322, 324, 326, 328, may have associated selection transistors, generally speaking associated selection gates, whose function will be described in more detail below. The additional switch selection lines 330, 334, serve as a switch between the memory cells and the transistors of the switch matrix. The additional switch selection lines 330, 334, may also have associated selection transistors, generally speaking, associated selection gates. Therefore, except for the selection gate of the additional switch selection lines 330, 334, the gate lengths of the selection gates, for example, in the case the first additional switch selection lines are provided, the switch selection lines 314, 316, 318, 320, 322, 324, 326, 328, can be designed having significantly smaller gate lengths, since voltages of about $V_{CC}$ may be applied and the isolation of the floating node during programming inhibition may be done by the selection gate of the respective additional switch selection line 330, 334. In an embodiment, the second additional switch selection lines 330, 334, may be separated from each other. In another embodiment, the second additional switch selection lines 330, 334, can be electrically coupled with one another, in other words, the second additional switch selection lines 330, 334, can be short-circuited. In accordance with an embodiment, the additional switch selection lines 330, 334, represent a gate length that is greater than the gate length of the switch selection lines 314, 316, 318, 320, 322, 324, 326, 328, in order to reduce the leakage current to ensure high boost voltage in the NAND string during program inhibit. In an embodiment, the additional switch selection lines 330, 334, may have a gate length in the range of about 150 nm to about 250 nm, e.g., in the range of about 175 nm to about 225 nm, e.g. of about 200 nm. In an embodiment, the switch selection lines 314, 316, 318, 320, 322, 324, 326, 328, may have a gate length in the range of about 50 nm to about 130 nm, e.g., in the range of about 75 nm to about 120 nm, e.g., of about 100 nm. Furthermore, in an embodiment, the source line 332 may have a width in a range of about 100 nm to about 300 nm.

In an embodiment, the additional switch selection lines 330, 334, may respectively include a charge trapping layer, whereas in an alternative embodiment, the additional switch selection lines 330, 334, have no charge trapping layers. Furthermore, in an embodiment, the switch selection lines 314, 316, 318, 320, 322, 324, 326, 328, may respectively include a charge trapping layer, whereas in an alternative embodiment, the switch selection lines 314, 316, 318, 320, 322, 324, 326, 328, have no charge trapping layers.

By way of example, the programming of a memory cell of the memory cell field 202 can be carried out as follows:

The bit line of the memory cell to be programmed may be provided with, e.g., 0 V, the word line of the memory cell to be programmed may be provided with, e.g., +25 V. Furthermore, the directly adjacent bit lines of the bit line of the memory cell to be programmed may be provided with, e.g., 3.3 V. The additional switch selection lines 330, 334, may be provided with, e.g., 3.3 V. The other word lines 304 corresponding to the memory cells not to be programmed may be provided with a pass voltage of, e.g., 10 V.

In an alternative embodiment, an additional switch matrix formed by additional switch selection lines (not shown) may be arranged between the source line 332 and the second additional switch selection line (e.g., in a similar manner as described above, four switch selection lines) and the source line 332 and the other second additional switch selection line (e.g., in a similar manner as described above, four switch selection lines), respectively.

Figure 4:
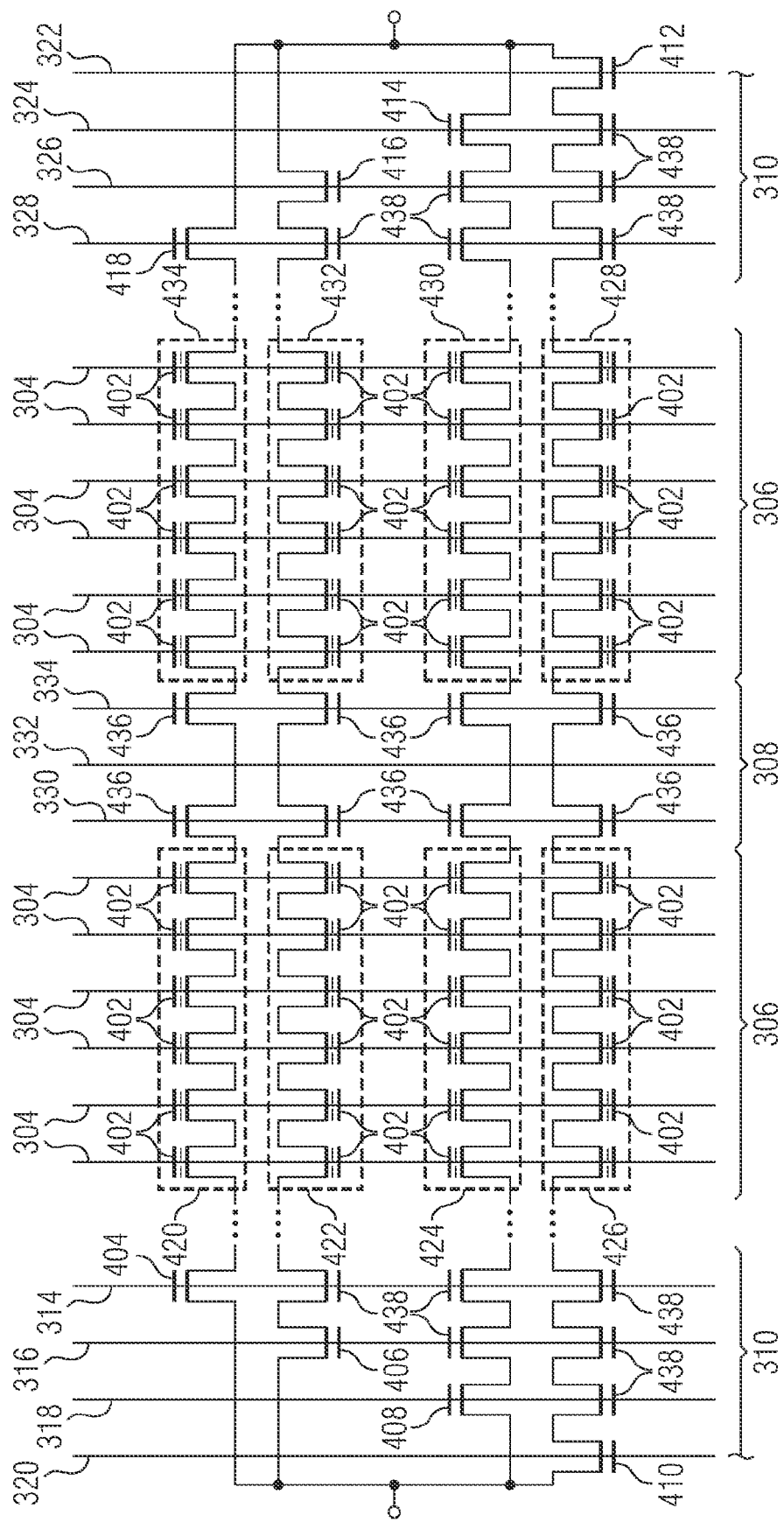
FIG. 4 shows an equivalent circuit diagram of a portion of a memory cell field of FIG. 2 corresponding to the top view of FIG. 3 in accordance with an embodiment.

FIG. 4 shows an equivalent circuit diagram of a portion of a memory cell field of FIG. 2 corresponding to the top view of FIG. 3 in accordance with an embodiment.

The equivalent circuit diagram shows the memory cells 402 of the memory cell region 306, wherein, e.g., the gate terminals of transistors forming the memory cells 402 are coupled with the word lines 304. Furthermore, switch selection gates (e.g., implemented as transistors, e.g. implemented as field effect transistors, e.g., implemented as fin field effect transistors) 404, 406, 408, 410, 412, 414, 416, 418, are provided in the switch matrix region 310 to form the switch matrix. In an example, e.g., the gate terminal of a respective transistor of the transistors forming the switch selection gates 404, 406, 408, 410, 412, 414, 416, 418, may be coupled with a respective one of the switch selection lines 314, 316, 318, 320, 322, 324, 326, 328. In an example, each switch selection gate 404, 406, 408, 410, 412, 414, 416, 418, is configured to select a respective one of a plurality of memory cell strings 420, 422, 424, 426, 428, 430, 432, 434, in other words a respective one of a plurality of memory cells 402 being serially source-to-drain coupled with each other. In an example, each memory cell string 420, 422, 424, 426, 428, 430, 432, 434, is connected between a respective switch selection gate 404, 406, 408, 410, 412, 414, 416, 418, and a gate (e.g., implemented as a transistor, e.g., implemented as a field effect transistor, e.g., implemented as a fin field effect transistor) 436, e.g., the gate terminal of which may be connected to the second additional switch selection line 330 or the other second additional switch selection line 334, for example. Furthermore, as will also be described in more detail below, normally-on structures 438, e.g. normally-on transistors may be provided in the switch matrix region 310, as shown in FIG. 4. All elements shown in FIG. 4 may be implemented in one respective fin structure 302. Thus, each fin structure 302 may include a plurality of memory cell strings 420, 422, 424, 426, 428, 430, 432, 434, for example, which may be formed in a stacked manner above one another, as will be described in more detail below.

Figure 5:
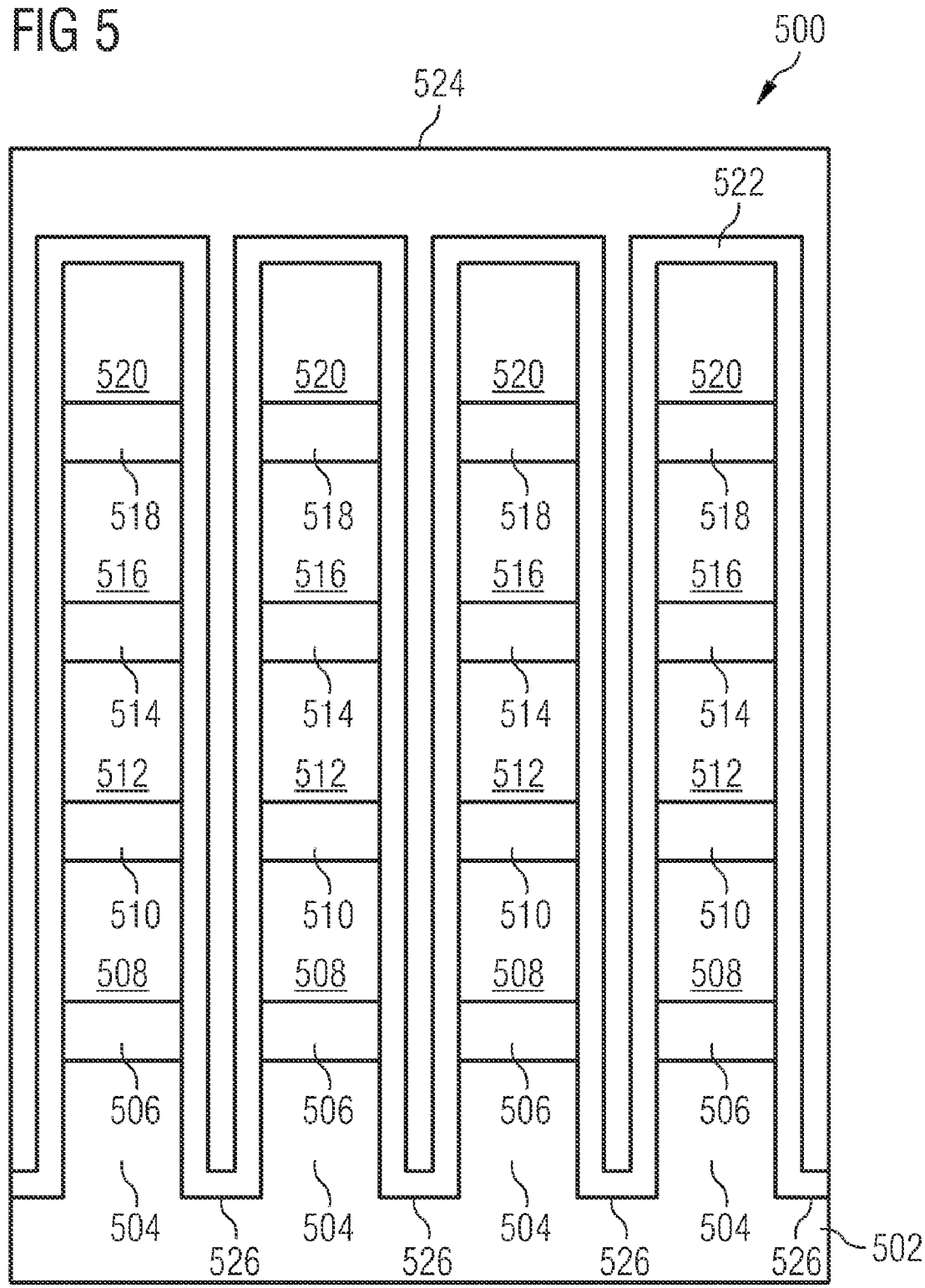
FIG. 5 shows a portion of a fin structure in a cross sectional view in accordance with an embodiment.

FIG. 5 shows a portion 500 of the memory cell field 202 in a cross sectional view in accordance with an embodiment. The cross sectional view is chosen in a direction perpendicular to the semiconductor surface of the substrate (e.g., the wafer) and along a word line 304.

As shown in FIG. 5, the portion 500 of the memory cell field 202 may be arranged on a semiconductor substrate 502. The semiconductor substrate 502 may be part of one or more semiconductor wafers, e.g., of one or more semiconductor wafers including semiconductor material, an insulating layer and another semiconductor layer on top of the insulating layer. As will be discussed in more detail below, the one or more semiconductor layers may be formed by one or more silicon on insulator (SOI) semiconductor wafers. In the case of a plurality of SOI semiconductor wafers, the SOI semiconductor wafers may be coupled together by means of one or more wafer bonding processes.

In an embodiment, each fin structure 504 may include a part of the semiconductor substrate 502, a first insulating layer 506 arranged on or above the upper surface of the semiconductor substrate 502, a first semiconductor layer 508 arranged on or above the upper surface of the first insulating layer 506, a second insulating layer 510 arranged on or above the upper surface of the first semiconductor layer 508, a second semiconductor layer 512 arranged on or above the upper surface of the second insulating layer 510, a third insulating layer 514 arranged on or above the upper surface of the second semiconductor layer 512, a third semiconductor layer 516 arranged on or above the upper surface of the third insulating layer 514, a fourth insulating layer 518 arranged on or above the upper surface of the third semiconductor layer 516, and a fourth semiconductor layer 520 arranged on or above the upper surface of the fourth insulating layer 518. It is to be noted, that in an alternative embodiment, two, three, or even more than four semiconductor layers (respectively insulated from each other by means of a respective insulating layer) may be provided to form respective memory cell strings, as will be described in more detail below. Illustratively, each fin structure 504 thus may include four semiconductor fins formed by the respective semiconductor layers 508, 512, 516, 520, the semiconductor fins being electrically isolated from each other by means of the respective insulating layers 506, 510, 514, 518. A portion of the upper surface of the substrate 502 between the fin structures 504 may be exposed during the manufacturing process, in which the fin structures 504 are formed, as will be described in more detail below.

Furthermore, a patterned charge storage layer structure 522 may be provided. The charge storage layer structure 522 may cover the insulating layers 506, 510, 514, 518, the semiconductor layers 508, 512, 516, 520, as well as the exposed surface portions of the surface of the substrate 502 between the fin structures 504.

In an embodiment, the charge storage layer structure 522 may be a floating gate structure including an insulating layer, e.g., a tunnel oxide layer (e.g., having a thickness in the range from about 5 nm to about 10 nm, e.g., having a thickness of about 5 nm), the insulating layer covering the insulating layers 506, 510, 514, 518, the semiconductor layers 508, 512, 516, 520, as well as the exposed surface portions of the surface of the substrate 502 between the fin structures 504. Further, the floating gate structure includes a floating gate layer, e.g., made of polysilicon, being provided on the insulating layer. In an embodiment, the floating gate layer may include metallically conductive portions forming the floating gates of the respective memory cells, and isolating portions to isolate respectively adjacent floating gates of adjacent memory cells. Furthermore, the floating gate structure may include another insulating layer, e.g., a gate oxide layer (e.g., having a thickness in the range of 5 nm to 15 nm), being provided on the floating gate layer. In an embodiment, the other insulating layer may include a plurality of dielectric layers, e.g. an ONO layer stack (e.g., having an oxide layer (e.g., silicon oxide) e.g., having a layer thickness of about 5 nm on the floating gate layer, a nitride layer (e.g. silicon nitride) e.g., having a layer thickness of about 5 nm on the oxide layer, and another oxide layer (e.g., silicon oxide) e.g., having a layer thickness of about 5 nm on the nitride layer). In an alternative embodiment, the other insulating layer may include a high-k material (e.g., aluminum oxide) e.g., having a layer thickness in the range from about 5 nm to about 15 nm).

In an alternative embodiment, the fin of the uppermost layer may have an additional buffer oxide layer on top of the fin but below the charge storage layer. In this way also the memory cells of the top most layer has only two sidewalls as active area while the conduction via the top layer is suppressed to a large degree. This may ensure more homogeneity of the electrical behavior of the top most active layer compared to the layers below.

In another embodiment, the charge storage layer structure 522 may be a nanocrystalline type layer structure having nanocrystals embedded in a dielectric, the nanocrystals being configured to store electrical charges.

In yet another embodiment, the charge storage layer structure 522 may be a charge trapping layer structure. The charge trapping layer structure may include a dielectric layer stack including one or a plurality of at least two dielectric layers being formed above one another, wherein charge carriers can be trapped in at least one of the at least two dielectric layers. By way of example, the charge trapping layer structure includes a charge trapping layer, which may include or consist of one or more materials being selected from a group of materials that consists of: aluminum oxide ($Al_2O_3$), yttrium oxide ($Y_2O_3$), silicon nitride ($Si_3N_4$), hafnium oxide ($HfO_2$), lanthanum oxide ($LaO_2$), zirconium oxide ($ZrO_2$), amorphous silicon (a-Si), tantalum oxide ($Ta_2O_5$), titanium oxide ($TiO_2$), and/or an aluminate. An example for an aluminate is an alloy of the components aluminum, zirconium and oxygen (AlZrO). In an embodiment, the charge trapping layer structure may include a dielectric layer stack including three dielectric layers being formed above one another, namely a first oxide layer (e.g., silicon oxide), a nitride layer as charge trapping layer (e.g., silicon nitride) on the first oxide layer, and a second oxide layer (e.g., silicon oxide or aluminum oxide) on the nitride layer. This type of dielectric layer stack is also referred to as ONO layer stack. The ONO layer stack may be conformally deposited on the sidewalls of the fins and optionally in addition on the upper surface of the fins, in other words, on the vertical sidewalls of the insulating layers 506, 510, 514, 518 and the semiconductor layers 508, 512, 516, 520, e.g., parallel to a plane that is defined by the longitudinal direction and the height direction of the fins. In another embodiment, the charge trapping layer structure may include a so-called TANOS layer stack, which may include a substrate, an oxide layer (e.g. silicon oxide) on the substrate (the oxide layer e.g. having a layer thickness in the range from about 3 nm to about 6 nm), a nitride layer (e.g., silicon nitride) on the oxide layer (the nitride layer, e.g., having a layer thickness in the range from about 3 nm to about 10 nm), a high-k dielectric layer (e.g., having a dielectric constant higher than 3.9) on the nitride layer (the high-k dielectric layer including, e.g., aluminum oxide, and the high-k dielectric layer, e.g., having a layer thickness in the range from about 5 nm to about 15 nm), and a metal gate layer (e.g., made of tantalum nitride (TaN) or another metal having a high work function) on the high-k dielectric layer (the metal gate layer, e.g., having a layer thickness in the range from about 20 nm to about 300 nm).

In an alternative embodiment, the charge trapping layer structure 522 may include two, four or even more dielectric layers being formed above one another.

On the patterned charge storage layer structure 522, a control gate layer 524 may be provided, e.g., made of polysilicon or a metal such as copper or aluminum. The control gate layer 524 may be conformally deposited on the patterned charge storage layer structure 522.

In an embodiment, each fin structure 504 may extend from a top surface of the control gate layer 524 through the charge storage layer structure 522, the plurality of semiconductor layers 508, 512, 516, 520, and through the plurality of insulating layers 506, 510, 514, 518, at least into the bottommost insulating layer, i.e., the first insulating layer 506, or even into the semiconductor substrate 502, so that a bottom surface 526 may be formed at a predetermined fin depth. As an option, an additional dielectric layer (not shown) may be disposed on the bottom surface 526, e.g., in case that the structure of the semiconductor substrate 502 is also used as a respective NAND string of memory cells. In an embodiment, however, the patterned charge storage layer structure 522 is disposed directly on the bottom surface 526.

In an embodiment, the patterned charge storage layer structure 522 may be arranged in a direction substantially perpendicular to the orientation of the fins. The control gate layer 524 and, after patterning, the word lines formed by the patterned control gate layer 524 are arranged on the charge storage layer structure 522. The word lines 304 may have sidewalls (not shown in FIG. 5) that are optionally covered by a spacer oxide layer, which protects the active regions of the transistors to be formed during the implantation of doping atoms for optionally forming source/drain regions (not shown for reasons of clarity). The source/drain regions may be formed in the semiconductor layers 508, 512, 516, 520, in the fins outside the word lines 304 and the optional spacer oxide layer.

As shown in FIG. 5, each fin structure 504 may include four strings of serially connected memory cells being formed by fin field effect transistors (FinFET). The FinFETs are electrically isolated from the semiconductor substrate 502 e.g. by means of one or more of the insulating layers 506, 510, 514, 518.

The FinFETs are attached to the bottommost layer of the charge storage layer structure 522, e.g., to the tunnel oxide layer (e.g., in the case of a floating gate structure) or to the first oxide layer (e.g., in the case of a charge trapping gate structure).

Thus, there may be four memory cells (with vertical sidewalls included in fins forming an active region) formed one above the other, one respective memory cell being included in a respective memory cell string, the memory cells of which may be connected with each other in accordance with a NAND type connection scheme in the first direction. In general, an arbitrary number of fins may be formed one above the other (in the height direction), each fin being isolated from the adjacent one of the fins by means of a respective insulating layer, thereby forming an arbitrary number of memory cell strings, wherein the memory cells of a respective memory cell string may be connected with each other in accordance with a NAND type connection scheme. If a channel is formed allowing a current flow through a respective FinFET, the current flows through the fin in a direction which is perpendicular to the paper plane of FIG. 5.

The charge storage layer structure 522 may provide non-volatile storage properties.

In an embodiment, the memory cell field may include a further memory cell string, the memory cells of which may be connected with each other in accordance with a NAND type connection scheme. The further memory cell string may be formed by the semiconductor structure formed below the first insulating layer 506, i.e., by the fin-shaped portion of the semiconductor substrate 502. Thus, there may be, e.g., five memory cells formed one above the other with the fin-shaped portion of the bulk material, i.e., with the fin-shaped portion of the semiconductor substrate 502, providing the further NAND memory cell string.

A method for manufacturing a memory cell arrangement in accordance with an embodiment will be described in the following. The following processes also further illustrate possible materials for the individual components and respective geometrical characteristics.

Figure 6:
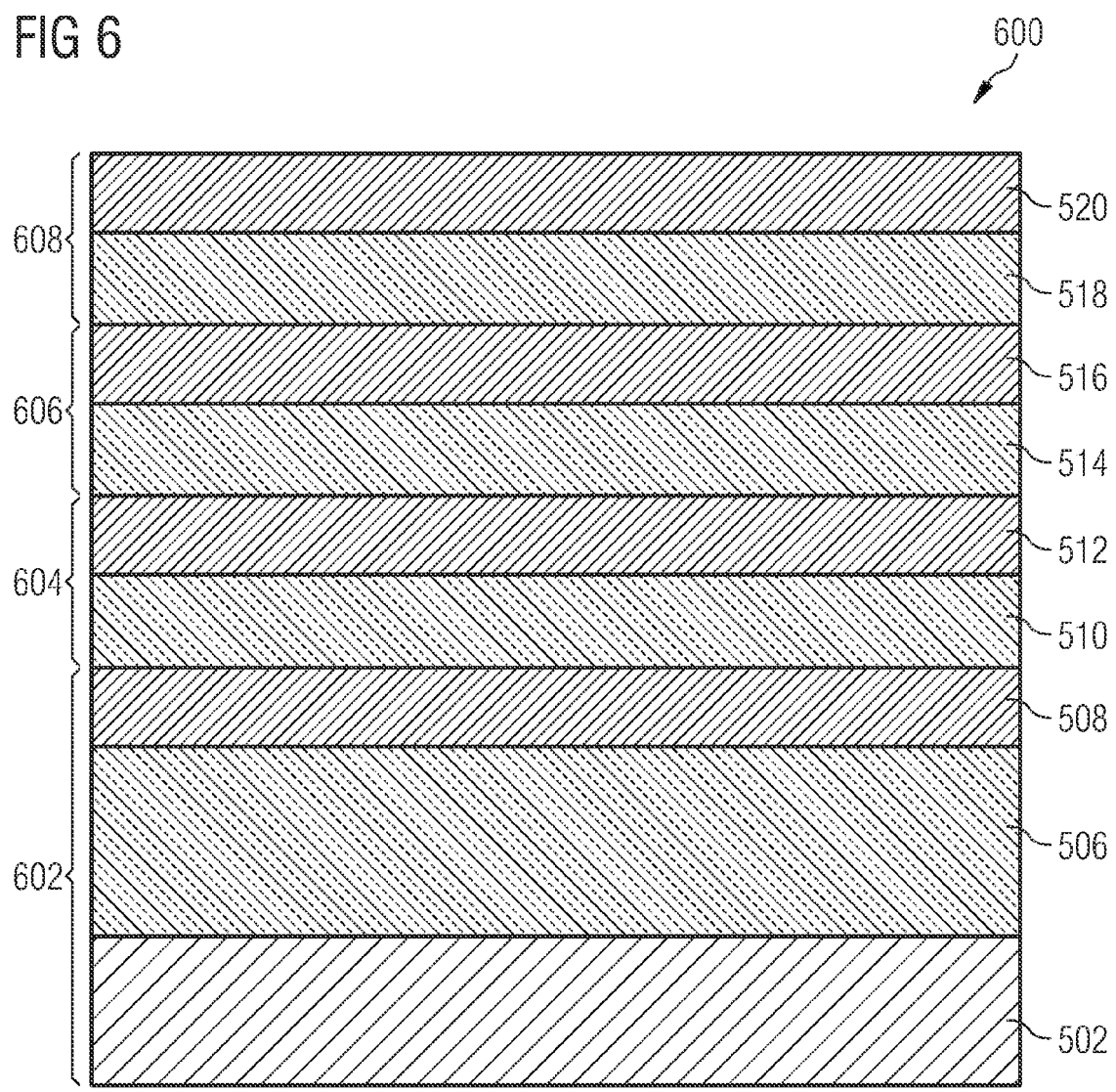
FIG. 6 shows a portion of a memory cell field in a cross sectional view in accordance with an embodiment.

Referring now to FIG. 6, a method for forming a non-volatile stacked memory cell as shown in FIG. 5 is illustrated. In FIG. 6, a wafer arrangement 600 including a plurality of wafers is shown. In an embodiment, a plurality of silicon on insulator wafer (SOI wafer) is provided, e.g., four SOI wafers 602, 604, 606, 608. The SOI wafers 602, 604, 606, 608 of the wafer arrangement 600 may be single crystalline SOI wafers or polycrystalline wafers. The wafer arrangement 600 may be manufactured, e.g., by wafer bonding processes of the four SOI wafers 602, 604, 606, 608. However, any other suitable process can be used to manufacture the stack of multiple SOI wafers 602, 604, 606, 608. In an alternative embodiment, any number, e.g., up to 10 wafers (e.g. SOI wafers) may be stacked above one another.

A bottommost first SOI wafer 602 has a carrier, e.g., semiconductor carrier, e.g., a semiconductor substrate, e.g., the semiconductor substrate 502 (e.g., made of silicon), the first insulating layer 506 arranged on or above the upper surface of the semiconductor substrate 502, and the first semiconductor layer 508 arranged on or above the upper surface of the first insulating layer 506. A second SOI wafer 604 may be disposed on or above the upper surface of the first semiconductor layer 508. The second SOI wafer 604 may include the second insulating layer 510 arranged on or above the upper surface of the first semiconductor layer 508 and the second semiconductor layer 512 arranged on or above the upper surface of the second insulating layer 510. A third SOI wafer 606 may be disposed on or above the upper surface of the second semiconductor layer 512. The third SOI wafer 606 may include the third insulating layer 514 arranged on or above the upper surface of the second semiconductor layer 512 and the third semiconductor layer 516 arranged on or above the upper surface of the third insulating layer 514. A fourth SOI wafer 608 may be disposed on or above the upper surface of the third semiconductor layer 516. The fourth SOI wafer 608 may include the fourth insulating layer 518 arranged on or above the upper surface of the third semiconductor layer 516 and the fourth semiconductor layer 520 arranged on or above the upper surface of the fourth insulating layer 518. In an embodiment, the semiconductor layers 508, 512, 516, 520, may be made of silicon (e.g., p-doped silicon) and the insulating layers 506, 510, 514, 518, may be made of an oxide such, as e.g., silicon dioxide. In an embodiment, the semiconductor layers 508, 512, 516, 520, and the insulating layers 506, 510, 514, 518, may have a respective thickness in the range of about 20 nm to about 1 μm.

In the periphery area of the memory cell arrangement to be manufactured, e.g., of the NAND memory cell arrangement to be manufactured, according to a CMOS process in accordance with an embodiment, high-voltage devices such as charge pumps, may be provided. The parasitic capacitance of such a device should be small. Therefore, an SOI wafer stack is not used as the substrate for the CMOS in the periphery area. In an embodiment, the SOI stack may be removed in the CMOS periphery area. Then, a thin silicon dioxide layer may formed on the remaining semiconductor substrate 502 in the periphery area as well as on the top surface of the wafer arrangement 600, in other words on the upper surface of the fourth semiconductor layer 520 and on the sidewalls of the step between the upper surface of the fourth semiconductor layer 520 and the exposed semiconductor substrate 502 in the periphery area. The silicon dioxide layer may have a thickness in the range of about 50 nm to about 500 nm. Then, the silicon dioxide layer may be anisotropically etched from the top surface of the semiconductor substrate 502 in the CMOS periphery area. Thus, the array and a three dimensional (3D) switch matrix, which will be described in more detail below, as well as the side of the SOI stack part is covered by the silicon dioxide. Then, epitaxial silicon (Epi-Si) may be selectively deposited in the CMOS periphery area. The thickness of the Epi-Si may be given by the height of the SOI stack so that the entire wafer arrangement 600 may have the same thickness all over the NAND memory area and the CMOS periphery area. The shallow trench isolation (STI) in the CMOS periphery area may be formed in a conventional way.

A thermal silicon oxide layer may then be formed on the upper surface of the structure that results in the processes described above. The thermal silicon oxide layer has several functions. It acts as a scattering oxide for the implant processes that follow and as a pad oxide for the silicon nitride hardmask. As will now be described in detail, the well doping (which may be adjusted using ion implantation, for example) for the three dimensional structure may be special compared to a standard NAND process flow for FinFETs.

In the CMOS periphery area, the CMOS well implants may correspond to the standard CMOS well implants.

In the memory cell region 306, in other words, in the memory cell array except for the area in which the switch matrix is to be manufactured, all four semiconductor layers 508, 512, 516, 520, are implanted with doping atoms such as boron (B).

The manufacturing of the switch matrix region 310, which also may have a three dimensional structure (in one embodiment, the switch matrix region 310 is provided in the fins 504), will be described in more detail below.

Figure 7:
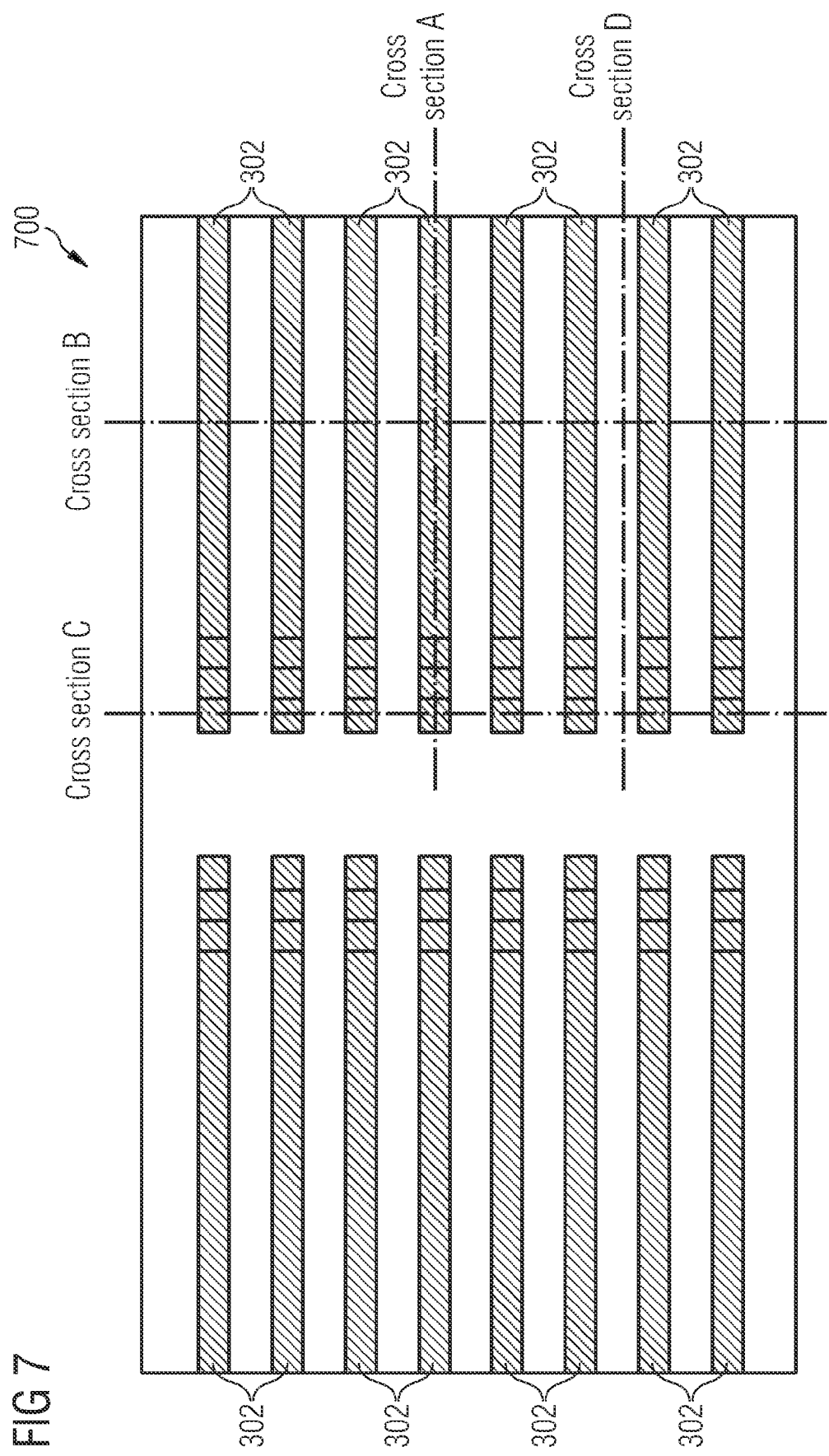
FIG. 7 shows a schematic top view of a portion of a switch matrix region in accordance with an embodiment at a first state of manufacturing.

FIG. 7 shows a schematic top view 700 of a portion of the switch matrix region 310 in accordance with an embodiment at a first state of manufacturing showing the fins 302. As shown in FIG. 7, a plurality of cross sections are illustrated, the corresponding cross sectional views of which will be described in more detail below.

Figure 8:
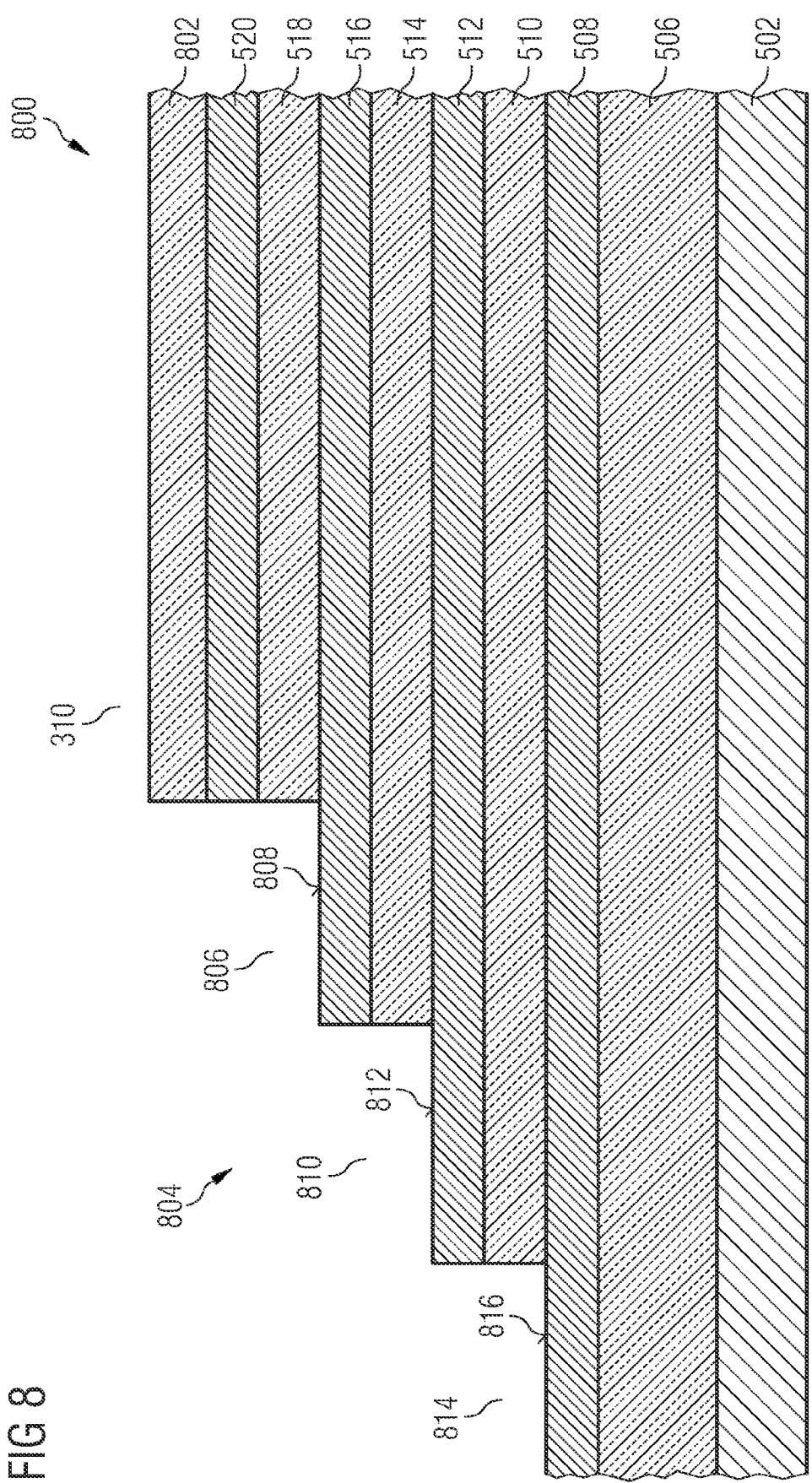
FIG. 8 shows a cross sectional view of a portion of a switch matrix region of FIG. 7 in accordance with an embodiment at a first time of manufacturing.

FIG. 8 shows a cross sectional view 800 of a portion of the switch matrix region 310 of FIG. 7 taken along cross section A of FIG. 7 in accordance with an embodiment at a first time of manufacturing. As shown in FIG. 8, starting with the wafer arrangement 600 of FIG. 6, a staircase structure 804 may be formed (e.g., etched) into the SOI wafers, in other words, into the wafer arrangement 600 of FIG. 6. The formation of the staircase structure 804 may be realized, e.g., by means of a process sequence of lithographic processes and etching processes (e.g., anisotropic etching processes such as e.g. reactive ion etching processes (RIE)). In an alternative embodiment, the formation of the staircase structure 804 may be realized, e.g., by means of a process sequence of lithographic, etching, spacer formation, and etching processes. The processes will be described in more detail below.

As shown in FIG. 8, before forming the staircase structure 804, an insulating layer 802 (which may be used as an auxiliary mask layer such as, e.g., as a hard mask layer), e.g., made of silicon dioxide, silicon nitride or carbon, may be deposited on the upper surface of the fourth semiconductor layer 520.

Then, using a corresponding first lithographic mask and an anisotropic etching process, a first partial staircase structure 806 may be formed by etching the layer stack of the wafer arrangement 600 in the switch matrix region 310, e.g., in an area of the second switch selection line 316 down to the third semiconductor layer 516, thereby exposing the upper surface 808 thereof as well as sidewall portions of the fourth insulating layer 518 and the fourth semiconductor layer 520. Illustratively, a first step of the staircase structure 804 may be formed which may include the exposed upper surface 808 of the third semiconductor layer 516 as the main portion of the first step and the sidewall portions of the fourth insulating layer 518 and the fourth semiconductor layer 520 as the sidewall portion of the first step.

Next, using a corresponding second lithographic mask and an anisotropic etching process, a second partial staircase structure 810 may be formed by further etching the layer stack of the wafer arrangement 600 in the switch matrix region 310, e.g. in an area of the third switch selection line 318 down to the second semiconductor layer 512, thereby exposing the upper surface 812 thereof as well as sidewall portions of the third insulating layer 514 and the third semiconductor layer 516. Illustratively, a second step of the staircase structure 804 may be formed which may include the exposed upper surface 812 of the second semiconductor layer 512 as the main portion of the second step and the sidewall portions of the third insulating layer 514 and the third semiconductor layer 516 as the sidewall portion of the second step.

Then, using a corresponding third lithographic mask and an anisotropic etching process, a third partial staircase structure 814 may be formed by further etching the layer stack of the wafer arrangement 600 in the switch matrix region 310, e.g. in an area of the fourth switch selection line 320 down to the first semiconductor layer 508, thereby exposing the upper surface 816 thereof as well as sidewall portions of the second insulating layer 510 and the second semiconductor layer 512. Illustratively, a third step of the staircase structure 804 may be formed which may include the exposed upper surface 816 of the first semiconductor layer 508 as the main portion of the third step and the sidewall portions of the second insulating layer 510 and the second semiconductor layer 512 as the sidewall portion of the second step.

Figure 9:
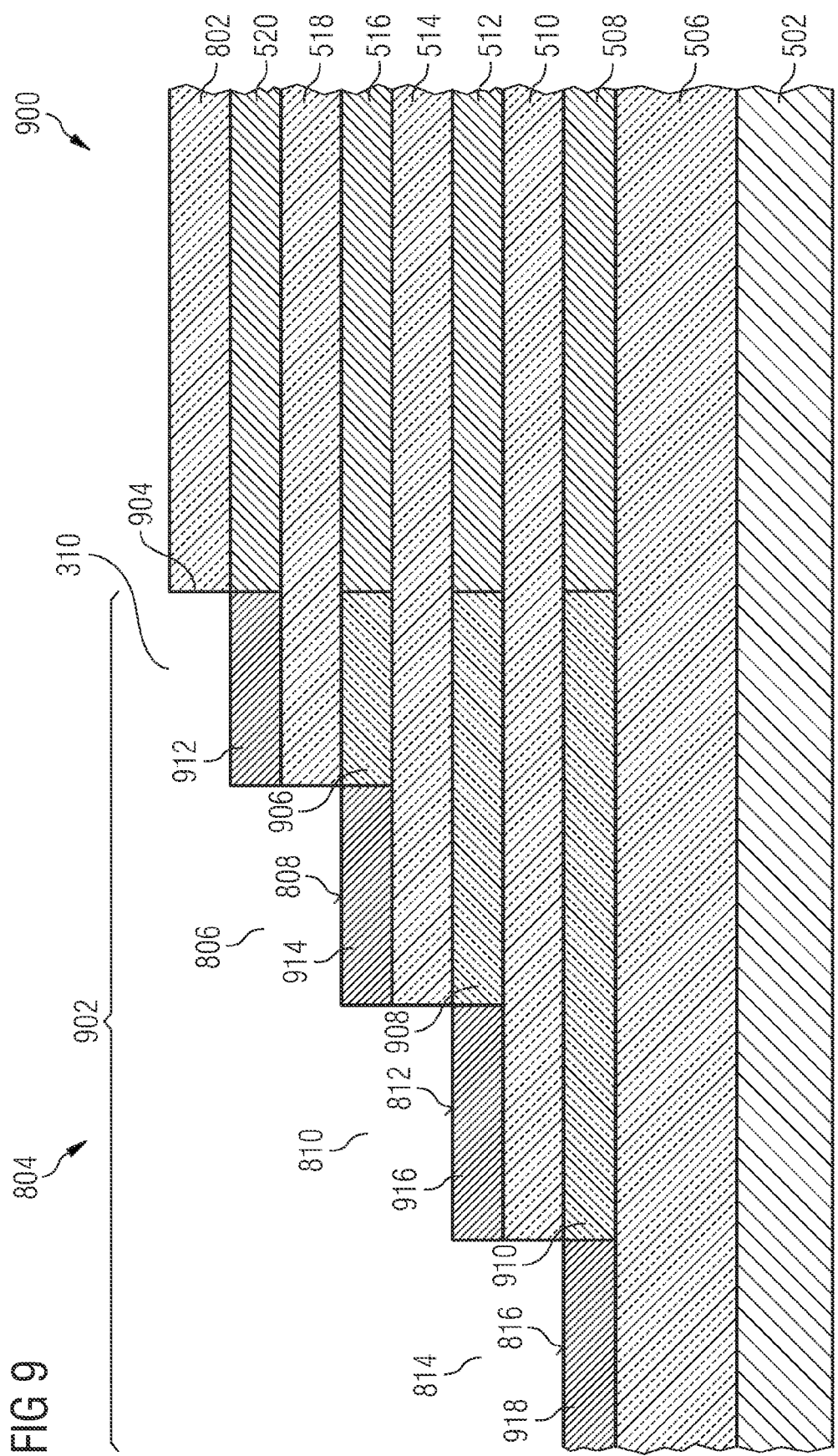
FIG. 9 shows a cross sectional view of a portion of a switch matrix region of FIG. 7 in accordance with an embodiment at a second time of manufacturing.

FIG. 9 shows a cross sectional view 900 of a portion of the switch matrix region 310 of FIG. 7 taken along cross section A of FIG. 7 in accordance with an embodiment at a second time of manufacturing.

Then, an ion implantation process may be carried out using a lithographic mask (e.g., a photo resist mask) which may be opened in a staircase structure area 902, wherein the ion implantation process may include an implantation of, e.g., n-type doping atoms (also referred to as donator atoms, e.g. phosphorous) using a sequence of threshold voltage implantation processes. The implantation energy may be selected such that the portions not covered by the lithographic mask of all semiconductor layers 508, 512, 516, 520 may be doped with the n-type doping atoms. The implantation energy of each single implant step may be selected according to the position of the semiconductor layers 508, 512, 516, 520 to be in the range from about 10 keV to about 1000 keV. Furthermore, the concentration of the doping atoms in the implanted regions may be selected to be in the range from about $10^{17}$ cm$^{-3}$ to about $5*10^{17}$ cm$^{-3}$. In this way, doped regions 904, 906, 908, 910, may be formed in the semiconductor layers 508, 512, 516, 520, in the staircase structure area 902. In an example, phosphorous atoms may be used as doping atoms to form the doped regions 904, 906, 908, 910. In an alternative example, arsenic atoms or antimon atoms may be used as doping atoms to form the doped regions 904, 906, 908, 910. It should be mentioned that the implantation energies used in accordance with the described embodiments are merely to be understood as examples and serve for illustration purposes. The implantation energies used in accordance with the described embodiments may be dependent on the respectively used materials and the layer thicknesses of the respectively provided layers.

Then, in an embodiment, a shallow ion implantation may be carried out to provide a counterdoping of portions of the doped regions 904, 906, 908, 910. The implantation energy in the shallow ion implantation may be set such that the doping atoms may be implanted in the respective uppermost semiconductor layer 508, 512, 516, 520, which is immediately beneath the uppermost and exposed insulating layer. Thus, illustratively, in lateral direction, only one of the semiconductor layers 508, 512, 516, 520, is respectively doped with doping atoms, and the portions of the semiconductor layer 508, 512, 516, 520, which are arranged below a further insulating layer or another semiconductor layer 508, 512, 516, 520, are not doped. Thus, in an example, the respective uppermost semiconductor layer 508, 512, 516, 520, is locally counterdoped in this implantation process, thereby forming counterdoped regions 912, 914, 916, 918. In an example, the counterdoped regions 912, 914, 916, 918, may be laterally displaced with respect to each other and may be arranged in different layers, in other words, also vertically displaced. In an example, the shallow ion implantation may be implemented as a p-type threshold voltage implantation. In an example, the counterdoped regions 912, 914, 916, 918, may be doped in such a manner that normally-off transistors may be formed using the counterdoped regions 912, 914, 916, 918, as the active areas and thus as the channel regions. In an example, the implantation energy for the counter-implantation may be selected to be in the range from about 1 keV to about 10 keV. Furthermore, the concentration of the doping atoms in the counterdoped regions 912, 914, 916, 918, may be selected to be in the range from about $2*10^{17}$ cm$^{-3}$ to about $10^{18}$ cm$^{-3}$. In this way, the counterdoped regions 912, 914, 916, 918, may be formed in the semiconductor layers 508, 512, 516, 520, within and thus in the result next to the doped regions 904, 906, 908, 910. In an example, boron atoms may be used as doping atoms to form the counterdoped regions 912, 914, 916, 918. In an example, the implantation energy used for the counter-implantation may be selected to be smaller than the implantation energy used for the formation of the doped regions 904, 906, 908, 910.

Figure 10:
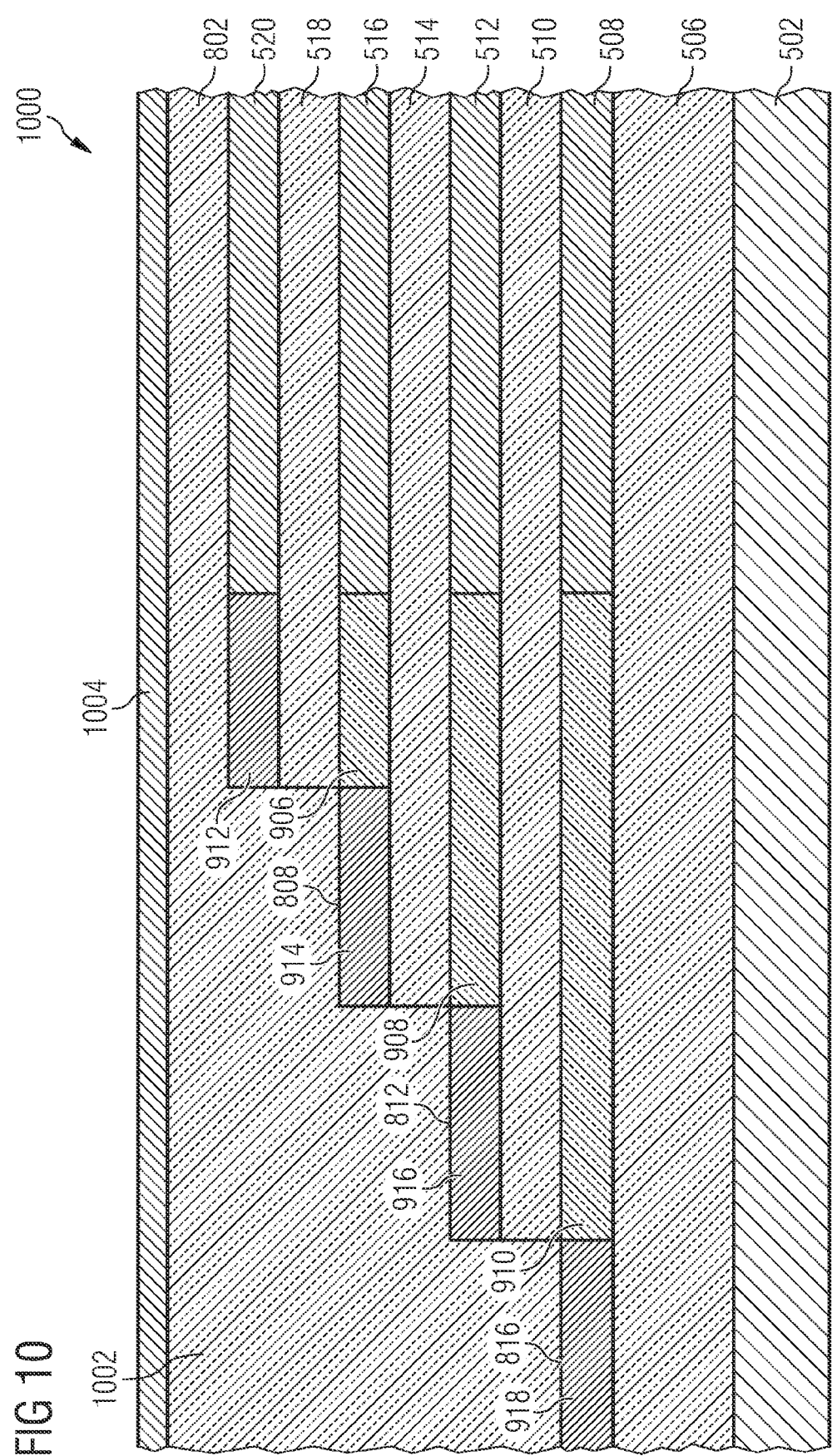
FIG. 10 shows a cross sectional view of a portion of a switch matrix region of FIG. 7 in accordance with an embodiment at a third time of manufacturing.

FIG. 10 shows a cross sectional view 1000 of a portion of the switch matrix region 310 of FIG. 7 taken along cross section A of FIG. 7 in accordance with an embodiment at a third time of manufacturing.

Then, the space above the staircase structure 804 may be "filled" with insulating material 1002. This may be carried out by depositing insulating material (e.g., an oxide material such as, e.g., silicon oxide) on the surface of the previously formed staircase structure 804. In a following process, the upper surface of the insulating material may be planarized, e.g. by means of a polishing process, e.g., a chemical mechanical polishing (CMP) process. Next, an auxiliary mask layer 1004 such as, e.g., a hard mask layer 1004 (e.g., made of a nitride (e.g., silicon nitride) or a carbide (e.g., silicon carbide) may be deposited. The auxiliary mask layer 1004 may be provided as a mask for a following gate contact etching process, as will be described in more detail below.

Figure 11:
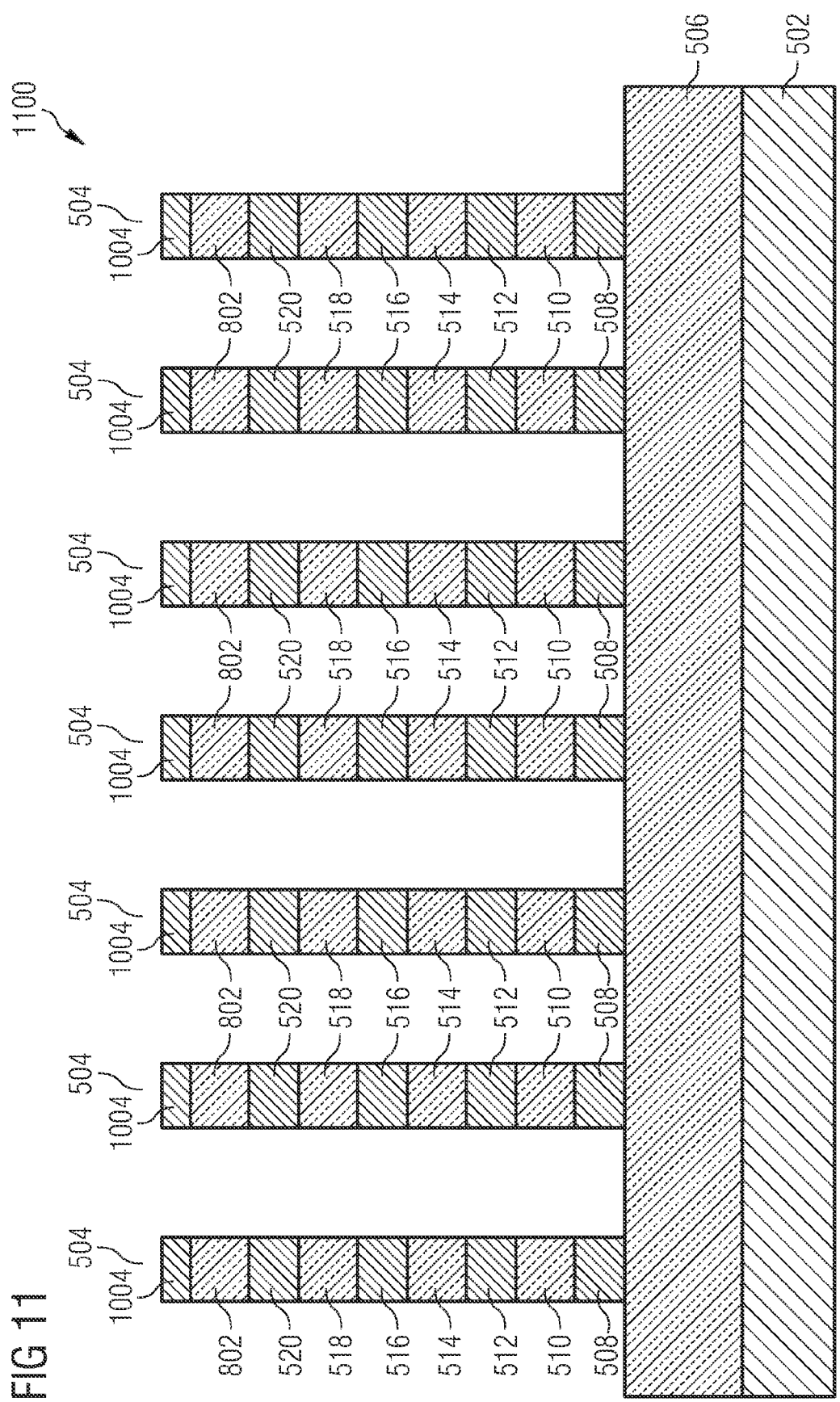
FIG. 11 shows another cross sectional view of a portion of a switch matrix region of FIG. 7 in accordance with an embodiment at the third time of manufacturing.

FIG. 11 shows a cross sectional view 1100 of a portion of the switch matrix region 310 of FIG. 7 taken along cross section B of FIG. 7 in accordance with an embodiment at the third time of manufacturing.

As shown in FIG. 11, by providing an etching process, e.g., an anisotropic etching process such as, e.g., a reactive ion etching (RIE) process using the appropriately patterned (e.g., using a suitable lithographic process) auxiliary mask layer 1004, the fin structures 504 and therewith in the fins 504 active area strings (which are formed by the remaining portions of the semiconductor layer 508, 512, 516, 520) may be formed which may run perpendicular to the staircase structure 804 (in FIG. 11, the active area strings run perpendicular to the paper plane).

Figure 12:
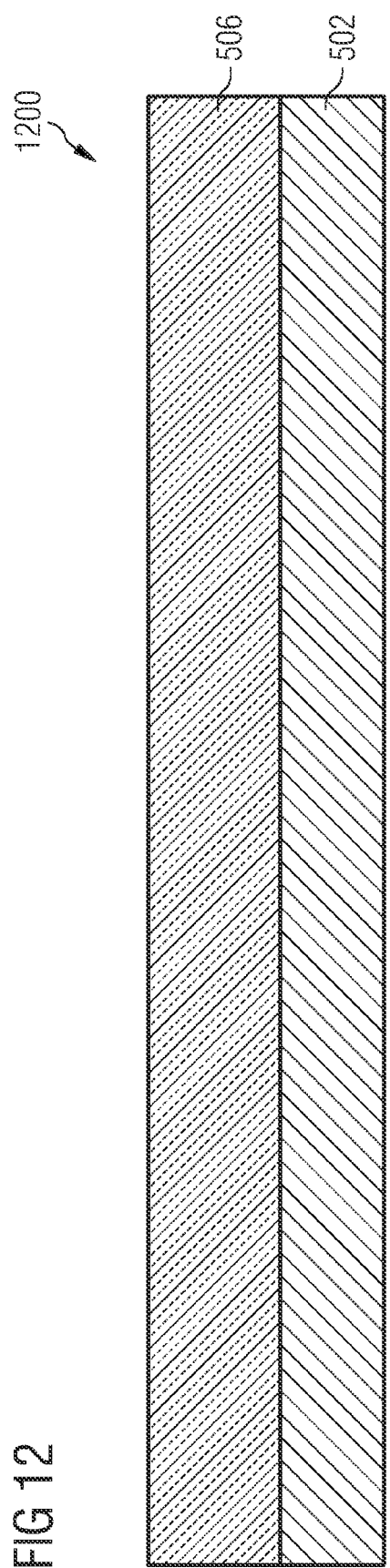
FIG. 12 shows yet another cross sectional view of a portion of a switch matrix region of FIG. 7 in accordance with an embodiment at the third time of manufacturing.

FIG. 12 shows a cross sectional view 1200 of a portion of the switch matrix region 310 of FIG. 7 taken along cross section D of FIG. 7 in accordance with an embodiment at the third time of manufacturing.

As shown in FIG. 12, in the space between the fin structures 504, the structure may include only the semiconductor substrate 502 and the first insulating layer 506 arranged on or above the upper surface of the semiconductor substrate 502.

Figure 13:
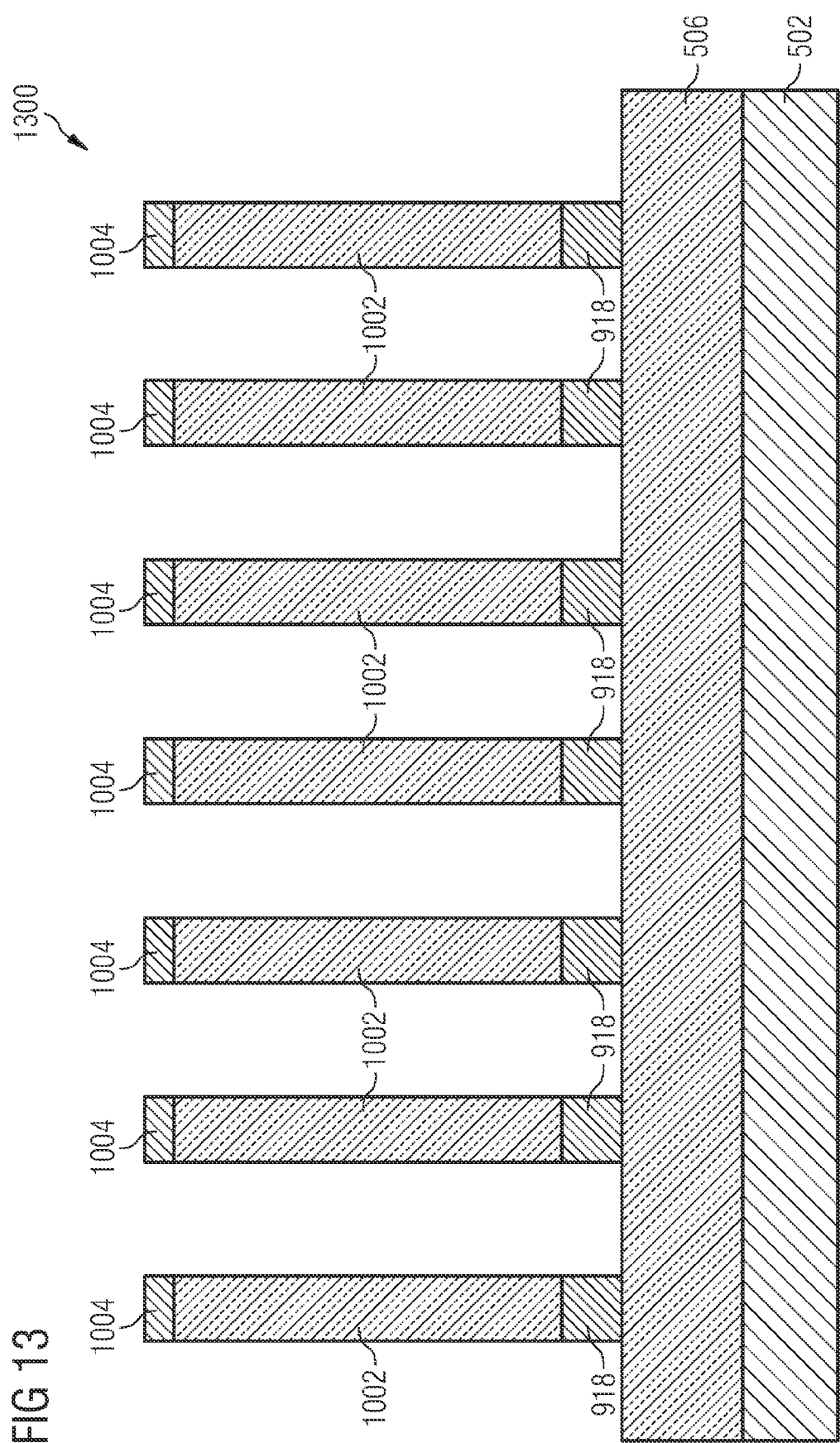
FIG. 13 shows yet another cross sectional view of a portion of a switch matrix region of FIG. 7 in accordance with an embodiment at the third time of manufacturing.

FIG. 13 shows a cross sectional view 1300 of a portion of the switch matrix region 310 of FIG. 7 taken along cross section C of FIG. 7 in accordance with an embodiment at the third time of manufacturing.

As shown in FIG. 13, the bottommost counterdoped region 918 is covered by the insulating material 1002. It should be noted that the other counterdoped region 912, 914, 916, are positioned behind the bottommost counterdoped region 918 seen in a direction perpendicular to the paper plane of FIG. 13.

Figure 14:
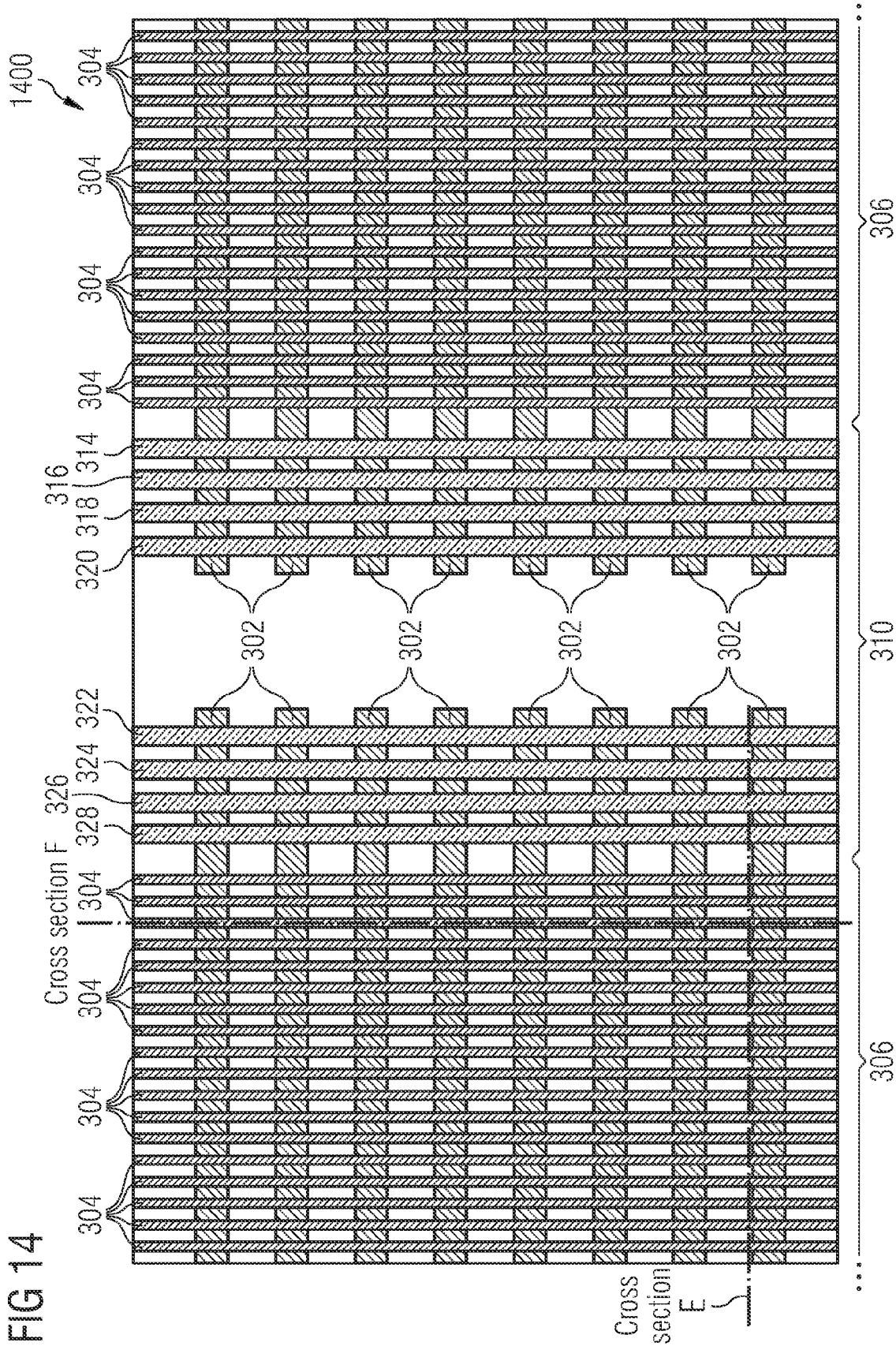
FIG. 14 shows a schematic top view of a portion of a switch matrix region in accordance with an embodiment after the manufacturing of word lines.
Figure 15:
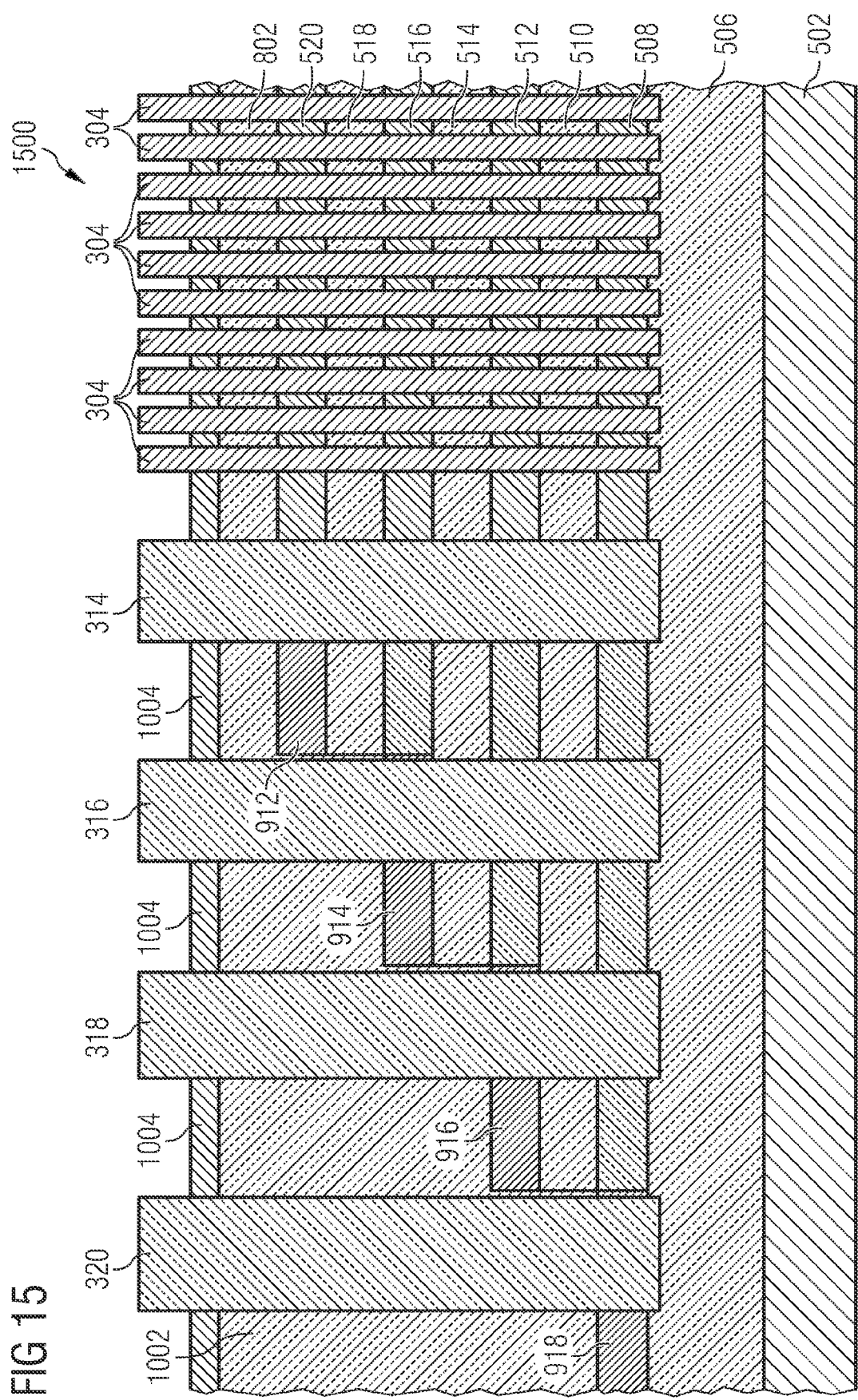
FIG. 15 shows a cross sectional view of a portion of a switch matrix region of FIG. 14 in accordance with an embodiment after the manufacturing of word lines.
Figure 16:
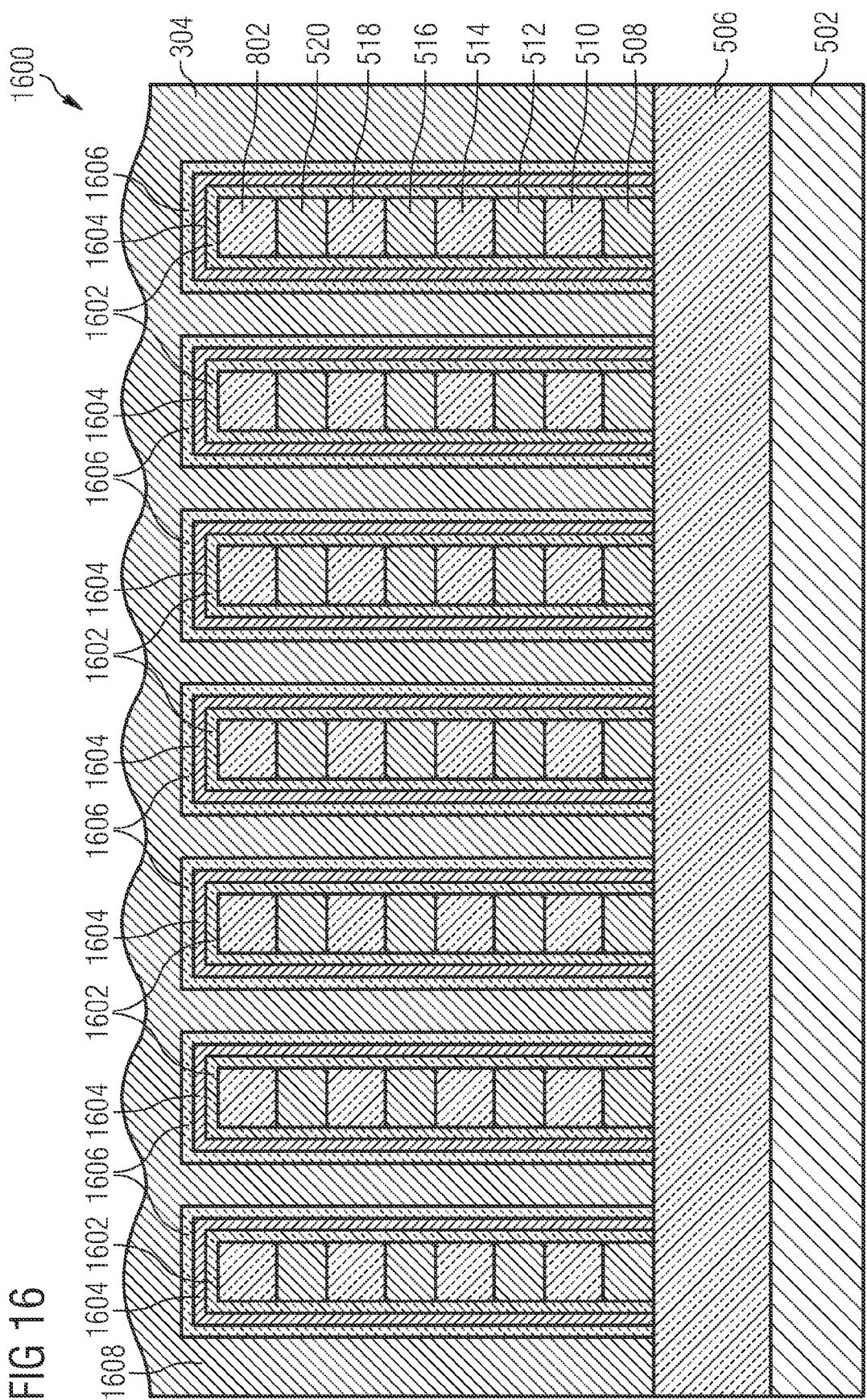
FIG. 16 shows another cross sectional view of a portion of a switch matrix region of FIG. 14 in accordance with an embodiment after the manufacturing of word lines.

FIG. 14 shows a schematic top view 1400 of a portion of the switch matrix region 310 in accordance with an embodiment after the manufacturing of word lines 304. Furthermore, FIG. 15 shows a cross sectional view 1500 of a portion of the switch matrix region 301 of FIG. 13 taken along cross section E of FIG. 13 in accordance with an embodiment after the manufacturing of word lines 304. FIG. 16 shows a cross sectional view 1600 of a portion of the switch matrix region 310 of FIG. 13 taken along cross section F of FIG. 13 in accordance with an embodiment after the manufacturing of word lines 304.

Then, a layer stack which will form a charge storage layer structure of the memory cells to be formed in the memory cell region 306 is deposited. In an example, a charge trapping layer stack as described above may be deposited on the formed fin structures. In an example, a first oxide layer 1602 (e.g. made of silicon oxide) may be (e.g., conformally) deposited on the structure shown in FIG. 13. Then, a charge trapping layer 1604, e.g. a nitride layer 1604 (e.g., made of silicon nitride) may be (e.g., conformally) deposited on the first oxide layer 1602. Furthermore, a second oxide layer 1606 (e.g. made of silicon oxide or aluminum oxide) may be (e.g., conformally) deposited on the charge trapping layer 1604. Next, electrically conductive material 1608 (which will form the gate contacts and the word lines 304) such as, e.g., polysilicon (doped or undoped) may be deposited on the second oxide layer 1606 and thus between and above the fin structures 504 and therewith illustratively being arranged next to the sidewalls of the semiconductor layers 508, 512, 516, 520 and the insulating layers 510, 514 518, 802. Thus, the electrically conductive material 1608 serves as the gates for the memory cells (in the memory cell region 306) as well as for the switch transistors formed in the switch matrix region 310. Then, using a lithographic process and an etching process, for example, the charge storage layer stack and the electrically conductive material 1608 are patterned such that they form the charge storage structure and the gates (and the word lines 304 and the switch selection lines 314, 316, 318, 320, 322, 324, 326, 328).

Figure 17:
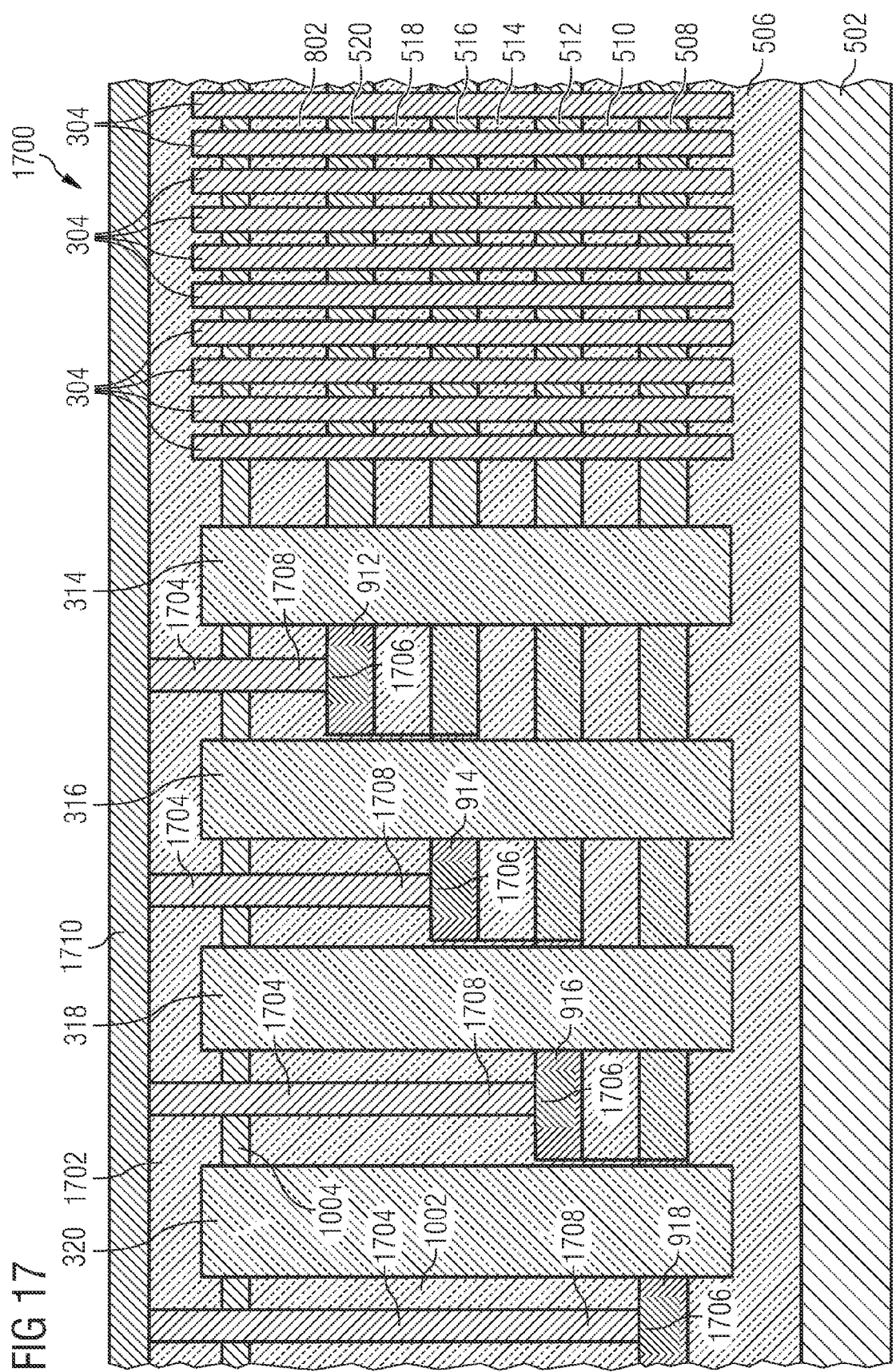
FIG. 17 shows another cross sectional view of a portion of a switch matrix region of FIG. 14 in accordance with an embodiment after the manufacturing of bit lines.

FIG. 17 shows another cross sectional view 1700 of a portion of a switch matrix region of FIG. 14 in accordance with an embodiment after the manufacturing of bit lines. As shown in FIG. 17, after the formation of the word lines 304 and the switch selection lines 314, 316, 318, 320, 322, 324, 326, 328, middle-of-line (MOL) processes may be carried out to the resulting structure as shown in FIGS. 15 and 16. By way of example, a dielectric material 1702 (e.g., a so-called poly-metal-dielectric (PMD) layer) may be deposited (e.g., by means of a chemical vapor deposition (CVD) process or a physical vapor deposition (PVD) process) on the auxiliary mask layer 1004 and the remaining exposed portions of the structure as shown in FIGS. 15 and 16. In an example, an oxide such as, e.g., silicon oxide may be used for the dielectric material 1702, although any other suitable dielectric material may be used in an alternative example. Then, contact holes 1704 may be formed (e.g., etched, e.g., by means of an anisotropic etching such as, e.g., by means of RIE etching) in the area above the counterdoped regions 912, 914, 916, 918, and between the switch selection lines 314, 316, 318, 320, 322, 324, 326, 328, thereby exposing respective upper surface portions of the counterdoped regions 912, 914, 916, 918. Then, in an example, optionally, an $n^+$-implantation process may be carried out through the contact holes 1704 using n-type doping atoms (e.g., phosphorous atoms, arsenic atoms, or antimon atoms may be used) to form $n^+$-doped regions 1706 within the exposed counterdoped regions 912, 914, 916, 918 which may serve as bit line contact plugs for the bit line connections. Then, the contact holes 1704 may be filled with electrically conductive material 1708 such as, e.g., tungsten (W) or tungsten silicide (WSi) or any other suitable material. Furthermore, a metal layer may be deposited (e.g., using a CVD or PVD) and then patterned such that bit lines 1710, which may be respectively electrically coupled to the electrically conductive material 1708 filled into the contact holes 1704. It should be mentioned that in an alternative example, an arbitrary number of metal layers may be provided in the back-end-of-line (BEOL) processing to connect the respective components in the memory cell arrangement.

Figure 18:
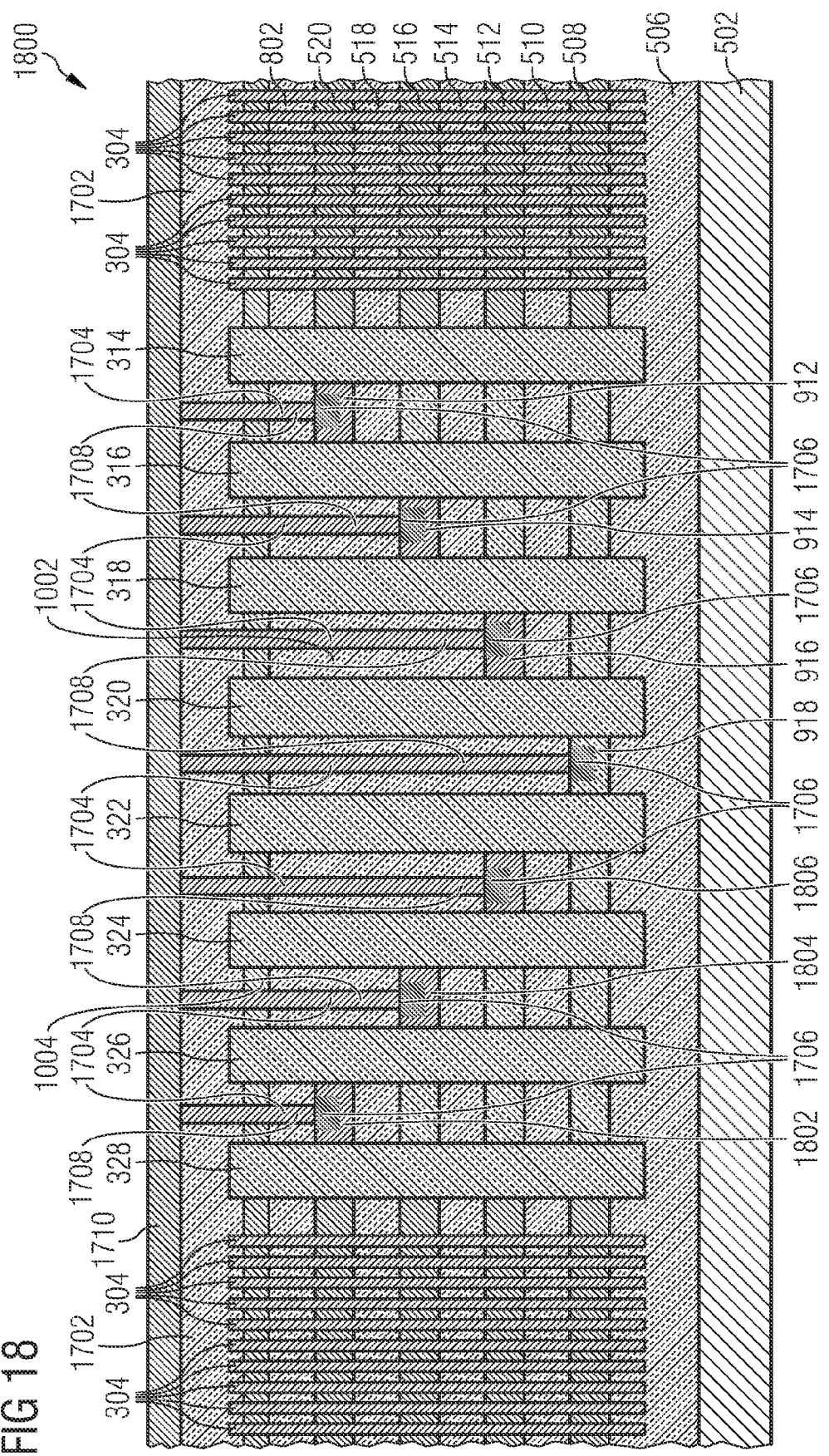
FIG. 18 shows yet another cross sectional view of a portion of a switch matrix region of FIG. 14 in accordance with an embodiment after the manufacturing of bit lines.

FIG. 18 shows yet another cross sectional view 1800 of a portion of a switch matrix region of FIG. 14 in accordance with an embodiment after the manufacturing of bit lines. FIG. 18 shows both sides of the switch matrix region 310 together with additional counterdoped regions 1802, 1804, 1806 which are formed in a similar manner as the counterdoped regions 912, 914, 916, 918. Thus, the switch matrix region 310 in accordance with an embodiment is completed.

In an embodiment, the metallization of the memory cell arrangement may be provided such that the bit lines are provided in the so called metallization plane 0 (i.e., in the first metallization plane above the word lines), and the bit lines run, e.g., perpendicular to the main direction of the word lines. Furthermore, supply lines may be provided in the so called metallization plane 1 (i.e., in the second metallization plane above the word lines, sometimes referred to as Metal 1) for contacting and reducing the RC delay of the well contacts (not shown), the source line 116 and the select gates. In an embodiment, one or more additional metallization planes may be provided above the mentioned metallization planes. Furthermore, it should be mentioned that in alternative embodiments, an arbitrary number of metallization planes may be provided and the above mentioned lines may be provided in different metallization planes than described above.

In another embodiment, the bit lines may be arranged in the metallization plane 1 (i.e., in the second metallization plane above the word lines) and may be connected with the contact plugs, wherein the metallization plane 0 (i.e., the first metallization plane above the word lines, sometimes referred to as Metal 0) may provide the well contacts and the supply lines for the select gates and a low ohmic source line further decreasing the ohmic resistance of the source line.

Figure 19:
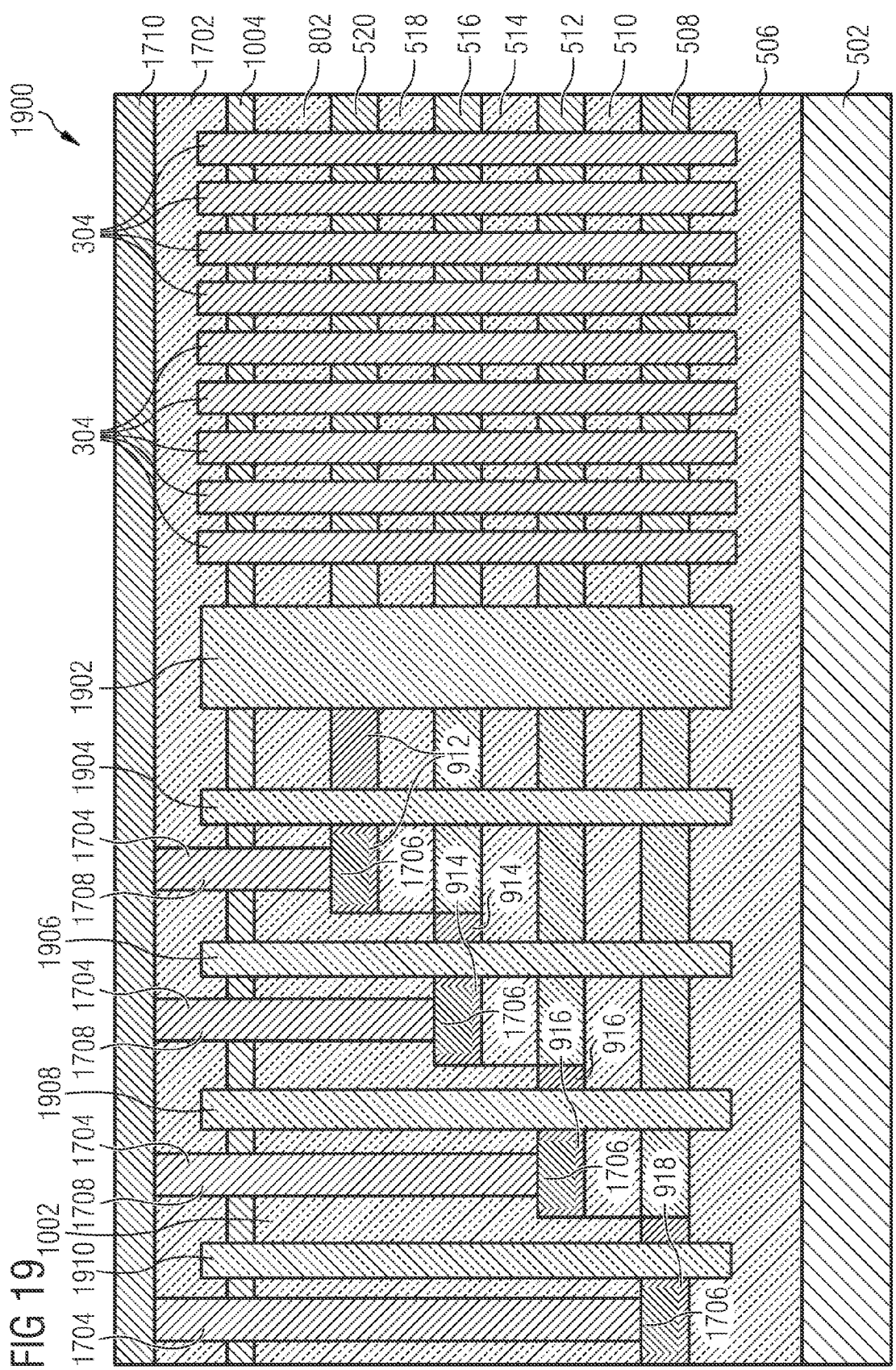
FIG. 19 shows a cross sectional view of a portion of a switch matrix region in accordance with another embodiment after the manufacturing of bit lines.

FIG. 19 shows a cross sectional view 1900 of a portion of the switch matrix region 310 in accordance with another embodiment after the manufacturing of bit lines. This embodiment is similar to the embodiments described above and is manufactured in a similar manner. Therefore, in order to avoid unnecessary repetition, only the differences of this embodiment compared with the embodiments described above will be explained in the following.

In the embodiment shown in FIG. 19, a wider switch selection line 1902 (wider than the select switch selection lines 314, 316, 318, 320, 322, 324, 326, 328) may additionally be provided for decoding as a commonly shared select gate. In this case, smaller select gates (and thus also narrower switch selection lines 1904, 1906, 1908, 1910 compared with the width of the switch selection lines 314, 316, 318, 320, 322, 324, 326, 328 may be provided) for decoding. This may save chip area for the memory cell field 202. Furthermore, in this embodiment, a low resistance may be provided (and thus higher read currents) due to shorter memory cell strings.

Figure 20:
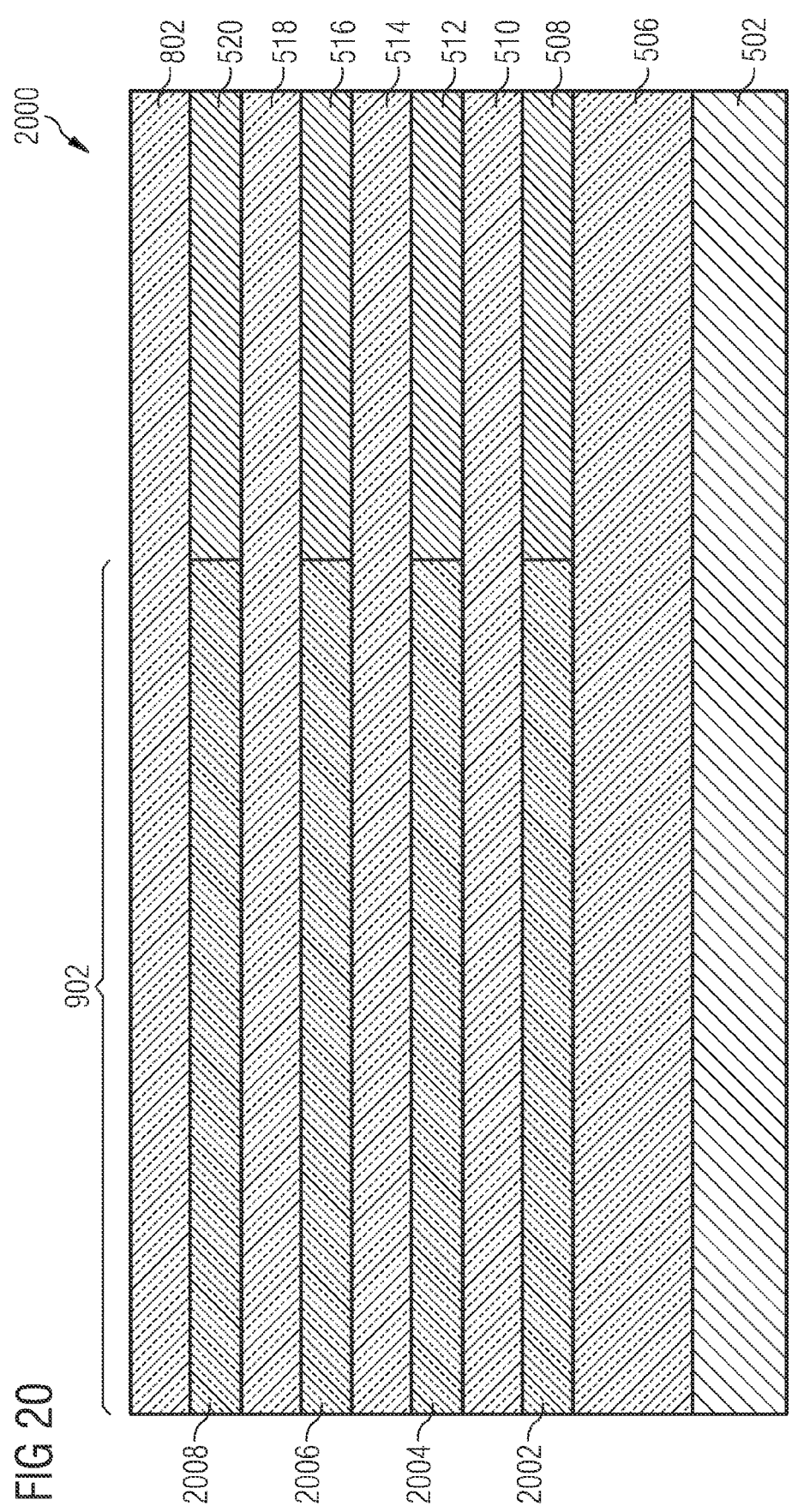
FIG. 20 shows a cross sectional view of a portion of a switch matrix region in accordance with yet another embodiment at a first time of the manufacturing.

FIG. 20 shows a cross sectional view 2000 of a portion of the switch matrix region 310 in accordance with yet another embodiment at a first time of the manufacturing. This embodiment is similar to the embodiments described above and is manufactured in a similar manner. Therefore, in order to avoid unnecessary repetition, only the differences of this embodiment compared with the embodiments described above will be explained in the following. This embodiment mainly differs in the way of manufacturing the staircase structure 804, as will be described in more detail below.

One difference of this embodiment compared with the embodiments shown in FIGS. 8 and 9, for example, may be seen in that the steps of the staircase structure in accordance with this embodiment is manufactured differently after a doping of all semiconductor layers 508, 512, 516, 520, in the staircase structure area 902. In this embodiment, the doping may be carried out using an ion implantation process. The ion implantation process may include an implantation of, e.g., n-type doping atoms (also referred to as donator atoms, e.g., phosphorous) using a sequence of threshold voltage implantation processes. The implantation energy may be selected such that the portions not covered by the lithographic mask of all semiconductor layers 508, 512, 516, 520 may be doped with the n-type doping atoms. In an example, the implantation energy may be selected to be in the range from about 10 keV to about 1000 keV. Furthermore, the concentration of the doping atoms in the implanted regions may be selected to be in the range from about $10^{17}$ cm$^{-3}$ to about $5*10^{17}$ cm$^{-3}$. In this way, doped regions 2002, 2004, 2006, 2008, may be formed in the semiconductor layers 508, 512, 516, 520, in the staircase structure area 902. In an example, phosphorous atoms may be used as doping atoms to form the doped regions 2002, 2004, 2006, 2008. In an alternative example, arsenic atoms or antimon atoms may be used as doping atoms to form the doped regions 2002, 2004, 2006, 2008.

Figure 21:
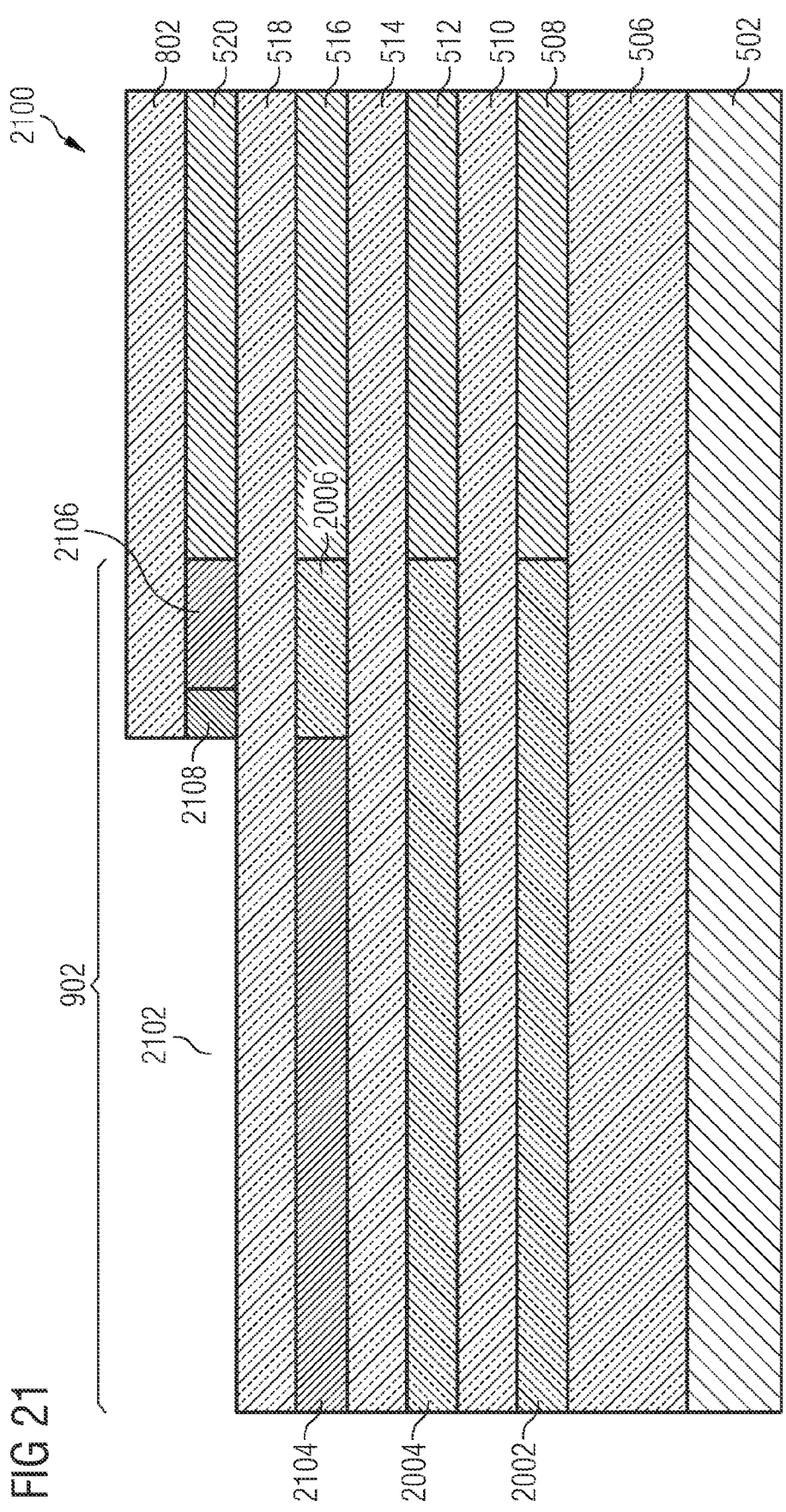
FIG. 21 shows a cross sectional view of a portion of a switch matrix region in accordance with yet another embodiment at a second time of the manufacturing.

FIG. 21 shows a cross sectional view 2100 of a portion of a switch matrix region 310 in accordance with yet another embodiment at a second time of the manufacturing.

Then, a first step 2102 may be formed, e.g. using a lithographic process and an etching process (e.g., an anisotropic etching process such as e.g. a RIE process), wherein the etching process may be stopped on the upper surface of the fourth insulating layer 518, which is thereby exposed. Next, in an example, a shallow ion implantation may be carried out to provide a counterdoping of portions of the doped regions 2006, 2008. The implantation energy in the shallow ion implantation may be set such that the doping atoms may be implanted in the respective uppermost semiconductor layer 516, 520, which is immediately beneath the uppermost and exposed insulating layers. Thus, illustratively, in lateral direction, only one of the semiconductor layers 516, 520, is respectively doped with doping atoms, and the portions of the semiconductor layer 508, 512, 516, 520, which are arranged below a further insulating layer or another semiconductor layer 508, 512, 516, 520, are not doped. Thus, in an example, the respective uppermost semiconductor layer 516, 520, is locally counterdoped in this implantation process, thereby forming counterdoped regions 2104, 2106. In an example, the counterdoped regions 2104, 2106, may be laterally displaced with respect to each other and may be arranged in different layers, e.g. in different semiconductor layers, in other words, also vertically displaced. In an example, the shallow ion implantation may be implemented as a p-type threshold voltage implantation. In an example, the counterdoped regions 2104, 2106, may be doped in such a manner that normally-off transistors may be formed using the counterdoped regions 2104, 2106, as the active areas and thus as the channel regions of the respective transistors to be formed. In an example, the implantation energy for the counter-implantation may be selected to be in the range from about 1 keV to about 10 keV. Furthermore, the concentration of the doping atoms in the counterdoped regions 2104, 2106, may be selected to be in the range from about $2*10^{17}$ cm$^{-3}$ to about $10^{18}$ cm$^{-3}$. In this way, the counterdoped regions 2104, 2106, may be formed in the semiconductor layers 516, 520, within and thus in the result possibly next to the doped regions 2006, 2008. In an example, boron atoms may be used as doping atoms to form the counterdoped regions 2104, 2106. Then, in an example, a tilted ion implantation process may be provided, e.g., using an implantation angle in the range between approximately 45° to approximately 60°, to form a first highly doped (e.g., n$^+$-doped) connection region 2108 in the counterdoped region 2106. The ion implantation may be an n-type implantation (e.g. using n-type doping atoms such phosphorous atoms, arsenic atoms or antimon atoms). Furthermore, the concentration of the doping atoms in the first highly doped connection region 2108 may be selected to be in the range from about $10^{20}$ cm$^{-3}$ to about $10^{21}$ cm$^3$.

Figure 22:
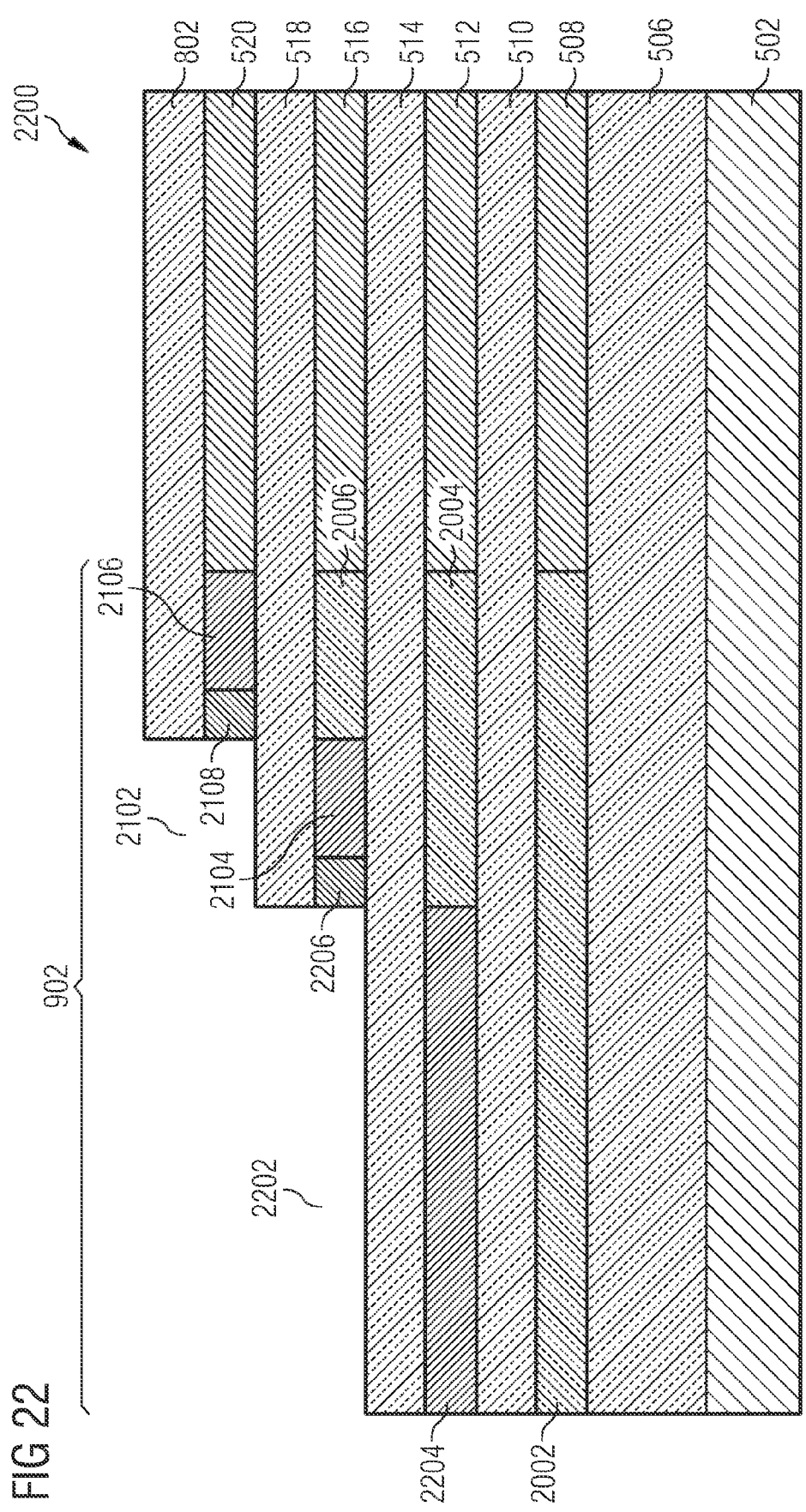
FIG. 22 shows a cross sectional view of a portion of a switch matrix region in accordance with yet another embodiment at a third time of the manufacturing.

FIG. 22 shows a cross sectional view 2200 of a portion of the switch matrix region 310 in accordance with yet another embodiment at a third time of the manufacturing.

Then, a second step 2202 may be formed, e.g., using a lithographic process and an etching process (e.g., an anisotropic etching process such as, e.g., a RIE process), wherein the etching process may be stopped on the upper surface of the third insulating layer 514, which is thereby exposed. Next, in an example, a shallow ion implantation may be carried out to provide a counterdoping of portions of the doped region 2004. The implantation energy in the shallow ion implantation may be set such that the doping atoms may be implanted in the respective uppermost semiconductor layer 514 (the already doped counterdoped regions 2104, 2106 may be covered by an appropriately set implantation mask; it is to be noted that in an implementation, the same mask may be used for the etching process in 2202 and the implanting process portion of process 2004), which is immediately beneath the uppermost and in this case only exposed insulating layer, e.g., the third insulating layer 514. Thus, illustratively, in lateral direction, only a portion of one semiconductor layer 512 is doped with doping atoms, and the portions of the semiconductor layer 508, 512, 516, 520, which are arranged below a further insulating layer or another semiconductor layer 508, 512, 516, 520, (or is covered by an implantation mask) are not doped. Thus, in an example, the respective uppermost exposed semiconductor layer 512 is locally counterdoped in this implantation process, thereby forming a further counterdoped region 2204. In an example, the further counterdoped region 2204 may be laterally displaced with respect to the previously formed counterdoped regions 2104, 2106, and may be arranged in a different layer, in other words, also vertically displaced. In an example, the shallow ion implantation may be implemented as a p-type threshold voltage implantation. In an example, the further counterdoped region 2204 may be doped in such a manner that a normally-off transistor may be formed using the further counterdoped region 2204 as the active areas and thus as the channel regions of the respective transistor to be formed. In an example, the implantation energy for the counter-implantation may be selected to be in the range from about 1 keV to about 10 keV. Furthermore, the concentration of the doping atoms in the further counterdoped region 2204 may be selected to be in the range from about $2*10^{17}$ cm$^{-3}$ to about $10^{18}$ cm$^{-3}$. In this way, the further counterdoped region 2204 may be formed in the second semiconductor layer 512 within and thus in the result possibly next to the doped region 2004. In an example, boron atoms may be used as doping atoms to form the further counterdoped region 2204. Then, in an example, a tilted ion implantation process may be provided, e.g., using an implantation angle in the range between approximately 45° to approximately 60°, to form a second highly doped (e.g., n$^+$-doped) connection region 2206 in the counterdoped region 2104. The ion implantation may be an n-type implantation (e.g., using n-type doping atoms such phosphorous atoms, arsenic atoms or antimon atoms). Furthermore, the concentration of the doping atoms in the second highly doped connection region 2206 may be selected to be in the range from about $10^{20}$ cm$^{-3}$ to about $10^{21}$ cm$^{-3}$.

Figure 23:
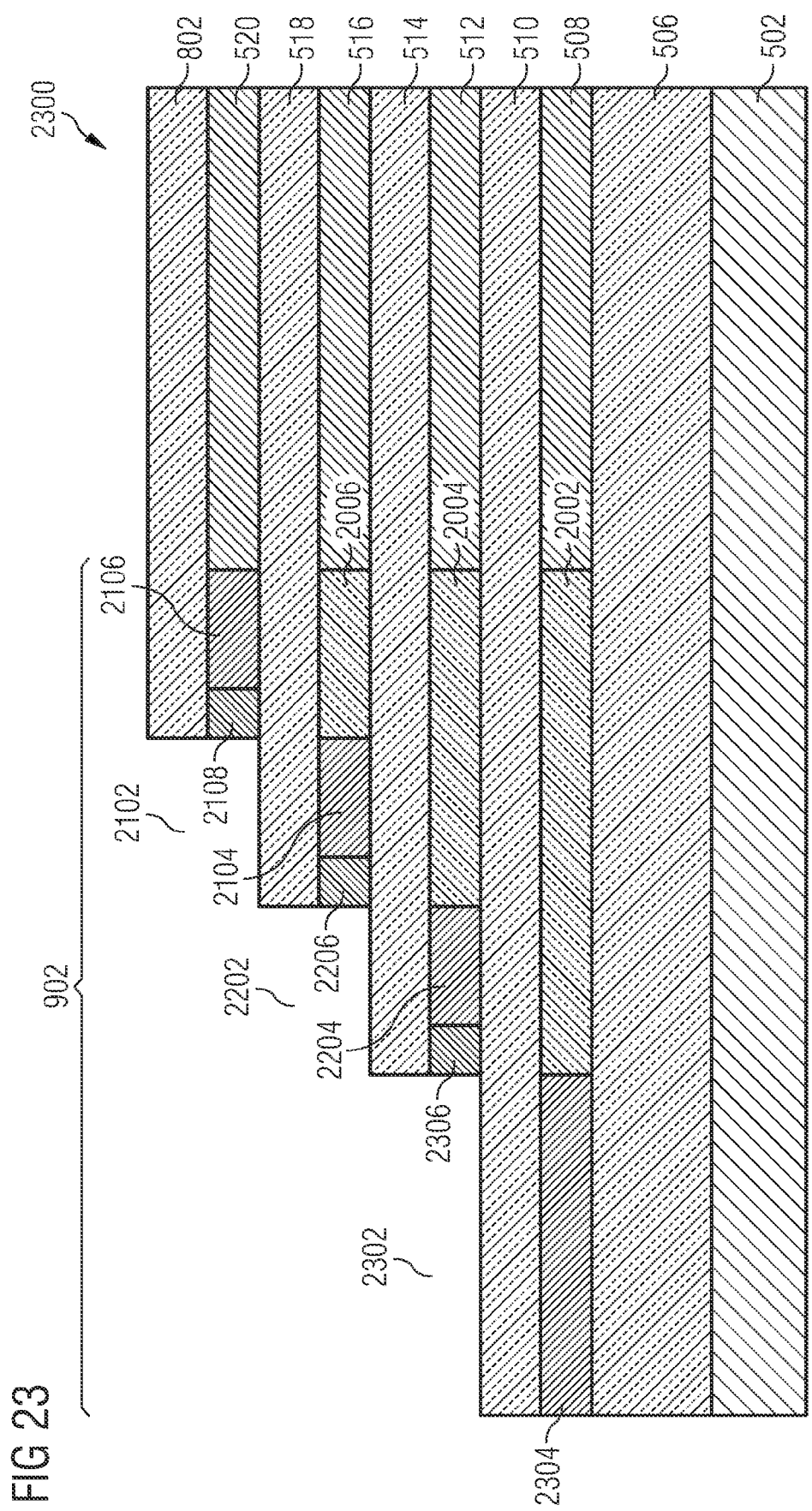
FIG. 23 shows a cross sectional view of a portion of a switch matrix region in accordance with yet another embodiment at a fourth time of the manufacturing.

FIG. 23 shows a cross sectional view 2300 of a portion of the switch matrix region 310 in accordance with yet another embodiment at a fourth time of the manufacturing.

Then, a third step 2302 may be formed, e.g., using a lithographic process and an etching process (e.g., an anisotropic etching process such as, e.g., a RIE process), wherein the etching process may be stopped on the upper surface of the second insulating layer 510, which is thereby exposed. Next, in an example, a shallow ion implantation may be carried out to provide a counterdoping of portions of the doped region 2002. The implantation energy in the shallow ion implantation may be set such that the doping atoms may be implanted in the respective uppermost semiconductor layer 510 (the already doped counterdoped regions 2104, 2106, and 2204 may be covered by an appropriately set implantation mask; it is to be noted that in an implementation, the same mask may be used for the etching process in 2302 and the implanting process portion of process 2002), which is immediately beneath the uppermost and in this case only exposed insulating layer, e.g., the second insulating layer 510. Thus, illustratively, in lateral direction, only a portion of one semiconductor layer 508 is doped with doping atoms, and the portions of the semiconductor layers 508, 512, 516, 520, which are arranged below a further insulating layer or another semiconductor layer 508, 512, 516, 520, (or is covered by an implantation mask) are not doped. Thus, in an example, the respective uppermost exposed semiconductor layer 508 is locally counterdoped in this implantation process, thereby forming a further counterdoped region 2304. In an example, the further counterdoped region 2304 may be laterally displaced with respect to the previously formed counterdoped regions 2104, 2106, 2204, and may be arranged in a different layer, in other words, also vertically displaced. In an example, the shallow ion implantation may be implemented as a p-type threshold voltage implantation. In an example, the further counterdoped region 2304 may be doped in such a manner that a normally-off transistor may be formed using the further counterdoped region 2304 as the active areas and thus as the channel regions of the respective transistor to be formed. In an example, the implantation energy for the counter-implantation may be selected to be in the range from about 1 keV to about 10 keV. Furthermore, the concentration of the doping atoms in the further counterdoped region 2304 may be selected to be in the range from about $2*10^{17}$ cm$^{-3}$ to about $10^{18}$ cm$^{-3}$. In this way, the further counterdoped region 2304 may be formed in the first semiconductor layer 508 within and thus in the result possibly next to the doped region 2002. In an example, boron atoms may be used as doping atoms to form the further counterdoped region 2304. Then, in an example, a tilted ion implantation process may be provided, e.g., using an implantation angle in the range between approximately 45° to approximately 60°, to form a third highly doped (e.g., n$^+$-doped) connection region 2306 in the counterdoped region 2204. The ion implantation may be an n-type implantation (e.g., using n-type doping atoms such phosphorous atoms, arsenic atoms or antimon atoms). Furthermore, the concentration of the doping atoms in the third highly doped connection region 2306 may be selected to be in the range from about $10^{20}$ cm$^{-3}$ to about $10^{21}$ cm$^{-3}$.

Figure 24:
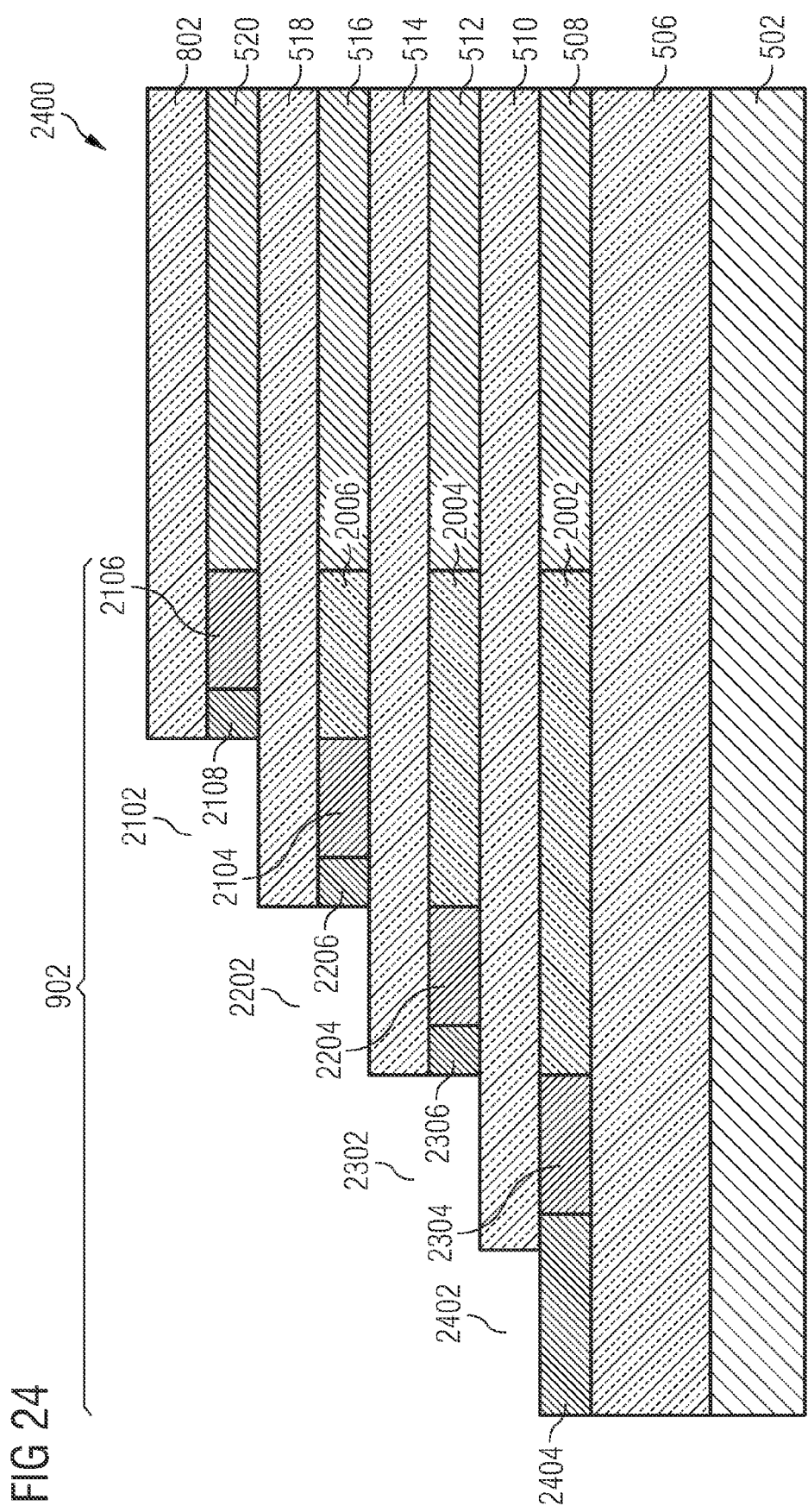
FIG. 24 shows a cross sectional view of a portion of a switch matrix region in accordance with yet another embodiment at a fifth time of the manufacturing.

FIG. 24 shows a cross sectional view 2400 of a portion of the switch matrix region 310 in accordance with yet another embodiment at a fifth time of the manufacturing.

Then, a fourth step 2402 may be formed, e.g., using a lithographic process and an etching process (e.g. an anisotropic etching process such as, e.g., a RIE process), wherein the etching process may be stopped on the upper surface of the first insulating layer 506, which is thereby exposed. Then, in an example, a non-tilted or a tilted ion implantation process may be provided, e.g., using an implantation angle in the range between approximately 0° to approximately 60°, to form a fourth highly doped (e.g., n$^+$-doped) connection region 2404 in the counterdoped region 2304. The ion implantation may be an n-type implantation (e.g., using n-type doping atoms such phosphorous atoms, arsenic atoms or antimon atoms). Furthermore, the concentration of the doping atoms in the fourth highly doped connection region 2404 may be selected to be in the range from about $10^{20}$ cm$^{-3}$ to about $10^{21}$ cm$^{-3}$.

Figure 25:
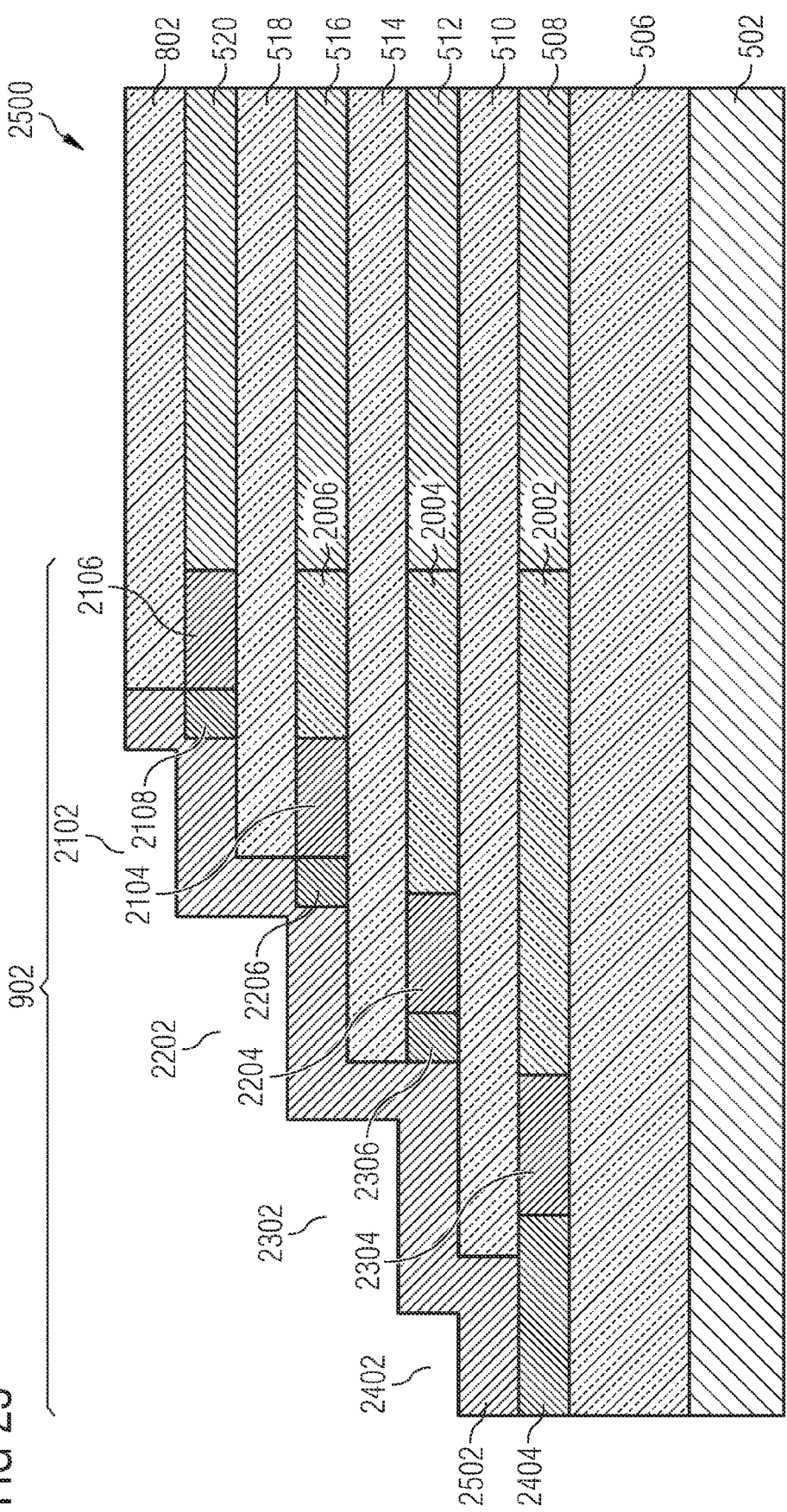
FIG. 25 shows a cross sectional view of a portion of a switch matrix region in accordance with yet another embodiment at a sixth time of the manufacturing.

FIG. 25 shows a cross sectional view 2500 of a portion of the switch matrix region 310 in accordance with yet another embodiment at a sixth time of the manufacturing.

Then, as shown in FIG. 25, a (doped or undoped) polysilicon layer 2502 (in an alternative example, a layer made of any other suitable electrically conductive material may be provided instead of the polysilicon layer 2502, e.g., a metal layer) may be deposited (e.g., using a CVD process) on the structure shown in FIG. 24. In an example, the polysilicon layer 2502 may be n$^+$-doped using phosphorous atoms, for example. As shown in FIG. 25, the polysilicon layer 2502 may be conformally deposited on the structure shown in FIG. 24, thereby covering and electrically contacting the connection regions 2108, 2206, 2306, 2404, etc., and/or the counterdoped regions 2104, 2106, 2204, 2304, etc. (in case no highly doped contact regions are provided).

Figure 26:
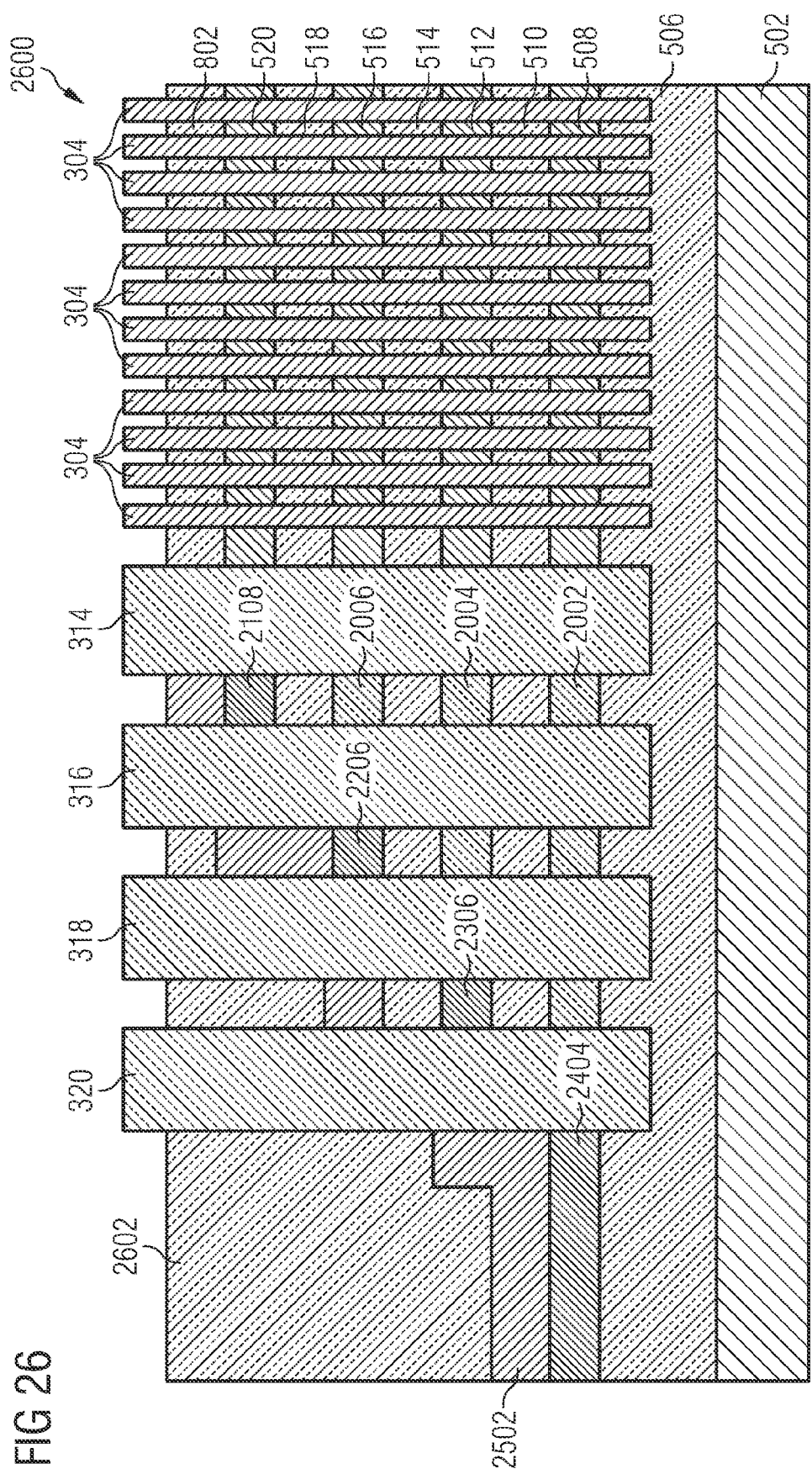
FIG. 26 shows a cross sectional view of a portion of a switch matrix region in accordance with yet another embodiment at a seventh time of the manufacturing.

FIG. 26 shows a cross sectional view 2600 of a portion of the switch matrix region 310 in accordance with yet another embodiment at a seventh time of the manufacturing.

Then, an insulating layer 2602 (e.g., an oxide layer 2602, e.g., a silicon oxide layer 2602) may be deposited to fill the space of the staircase structure area 902 at least up to the upper surface of the insulating layer 802, followed by a planarization process such as e.g. a CMP process down to the upper surface of the insulating layer 802. Then, in a similar manner as described above, the charge storing layer stack may be deposited and the gate contacts may be formed. Then, the polysilicon layer 2502 may be patterned.

Figure 27:
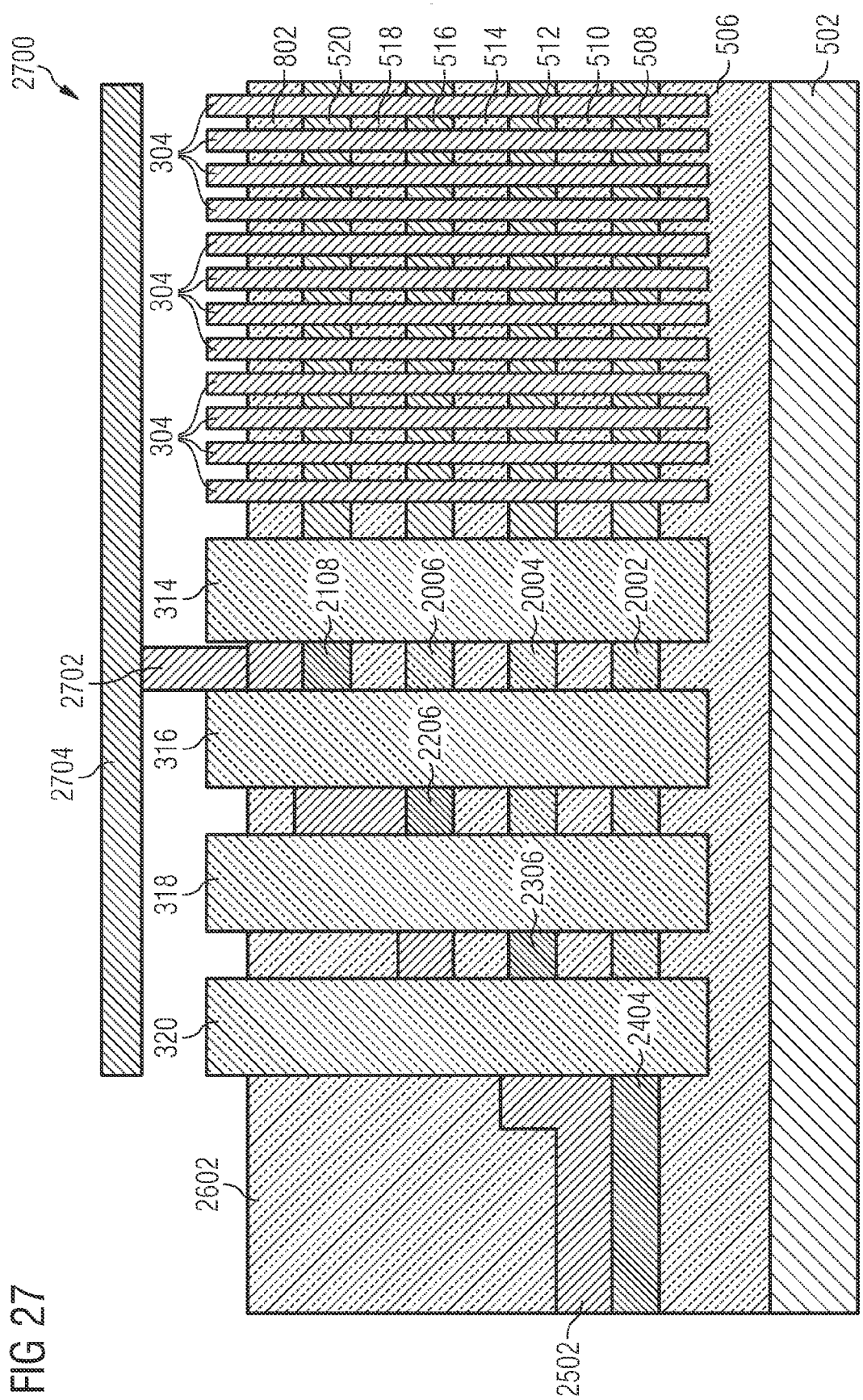
FIG. 27 shows a cross sectional view of a portion of a switch matrix region in accordance with yet another embodiment at an eighth time of the manufacturing.

FIG. 27 shows a cross sectional view 2700 of a portion of the switch matrix region 310 in accordance with yet another embodiment at an eighth time of the manufacturing.

Then, a contact hole (in an alternative example, a plurality of contact holes) may be formed in the insulating layer 2602 to expose a portion of the polysilicon layer 2502 (in an example, at any step of the staircase structure, e.g., in the uppermost step of the staircase structure). The contact hole may be filled with electrically conductive material 2702 (e.g., tungsten (W) or tungsten silicide (WSi)). In an example, then, a metal layer may be deposited (e.g., using a CVD process or a PVD process) and then patterned such that bit lines 2704, which may respectively be electrically coupled to the electrically conductive material 2702 filled in the contact hole. It should be mentioned that in an alternative example, an arbitrary number of metal layers may be provided in the back-end-of-line (BEOL) processing to connect the respective components in the memory cell arrangement. In accordance with this embodiment, only one contact hole is needed due to implementation of the n$^+$-polysilicon bridge, implemented e.g. by the polysilicon layer 2502. As discussed above, the landed contact (e.g., using the contact hole) could be placed on several positions within the staircase structure area 902.

Figure 28:
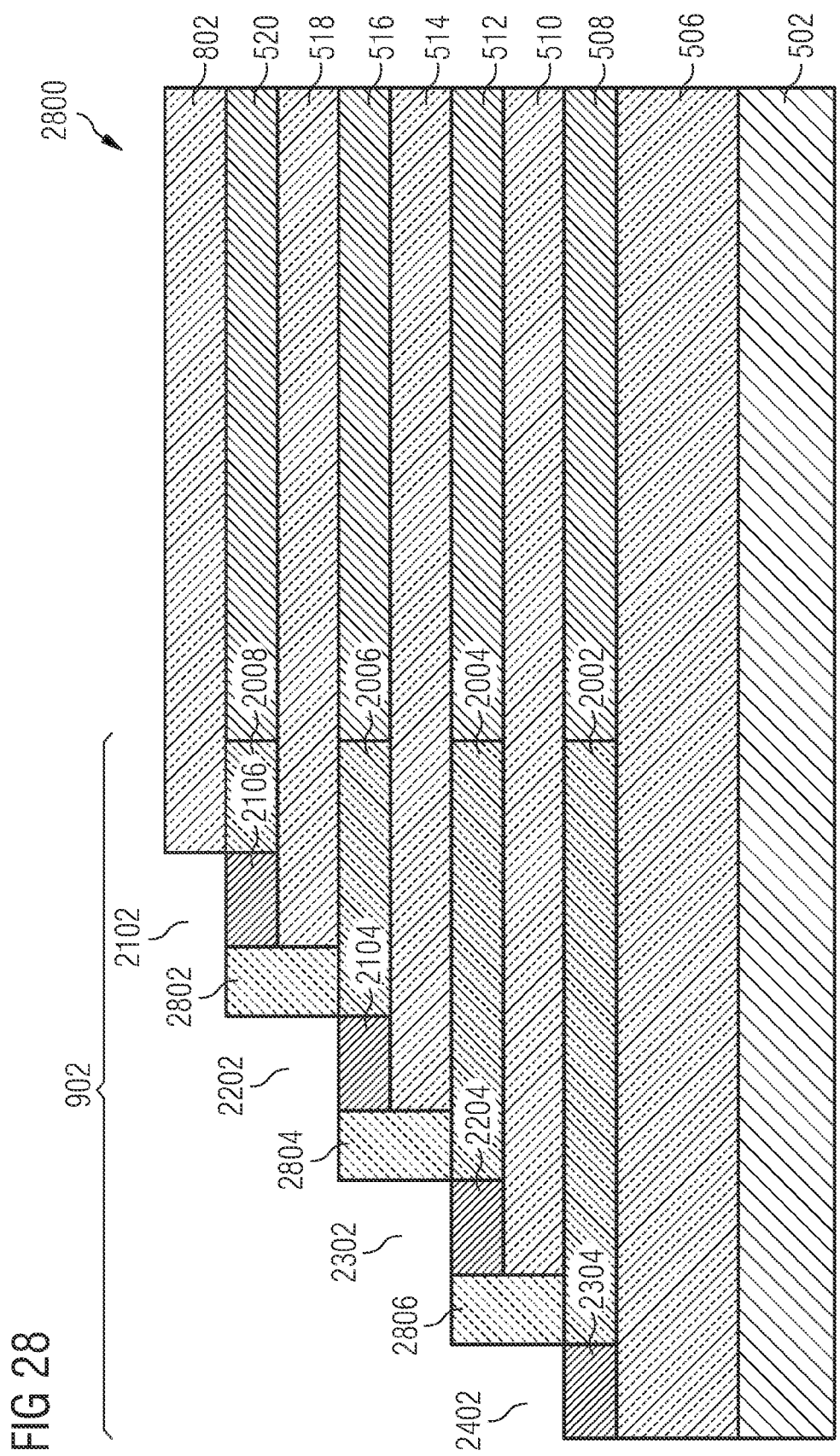
FIG. 28 shows a cross sectional view of a portion of a switch matrix region in accordance with yet another embodiment at a first time of the manufacturing.

FIG. 28 shows a cross sectional view 2800 of a portion of the switch matrix region 310 in accordance with yet another embodiment at a first time of the manufacturing.

Illustratively, this embodiment may be understood as a combination of the embodiment shown in FIG. 19 and the embodiment shown in FIGS. 20 to 27. Starting from a structure similar to that shown in FIG. 20, the respective steps 2102, 2202, 2302, 2402, may be formed in the staircase structure area 902 by a repeated process which may include (in each repetition) an anisotropic etching (e.g., a RIE etching) (e.g., thereby exposing the upper surface of the respective doped region 2002, 2004, 2006, 2008) of one respective step, a further anisotropic etching (e.g. a RIE etching), thereby exposing the upper surface of the following doped region 2002, 2004, 2006, forming spacers 2802, 2804, 2806 (e.g., made of an insulating material such as e.g. an oxide (e.g., silicon oxide), and counterdoping of the exposed region of the respective doped region 2002, 2004, 2006, 2008 to form the respective counterdoped regions 2104, 2106, 2204, 2304.

Figure 29:
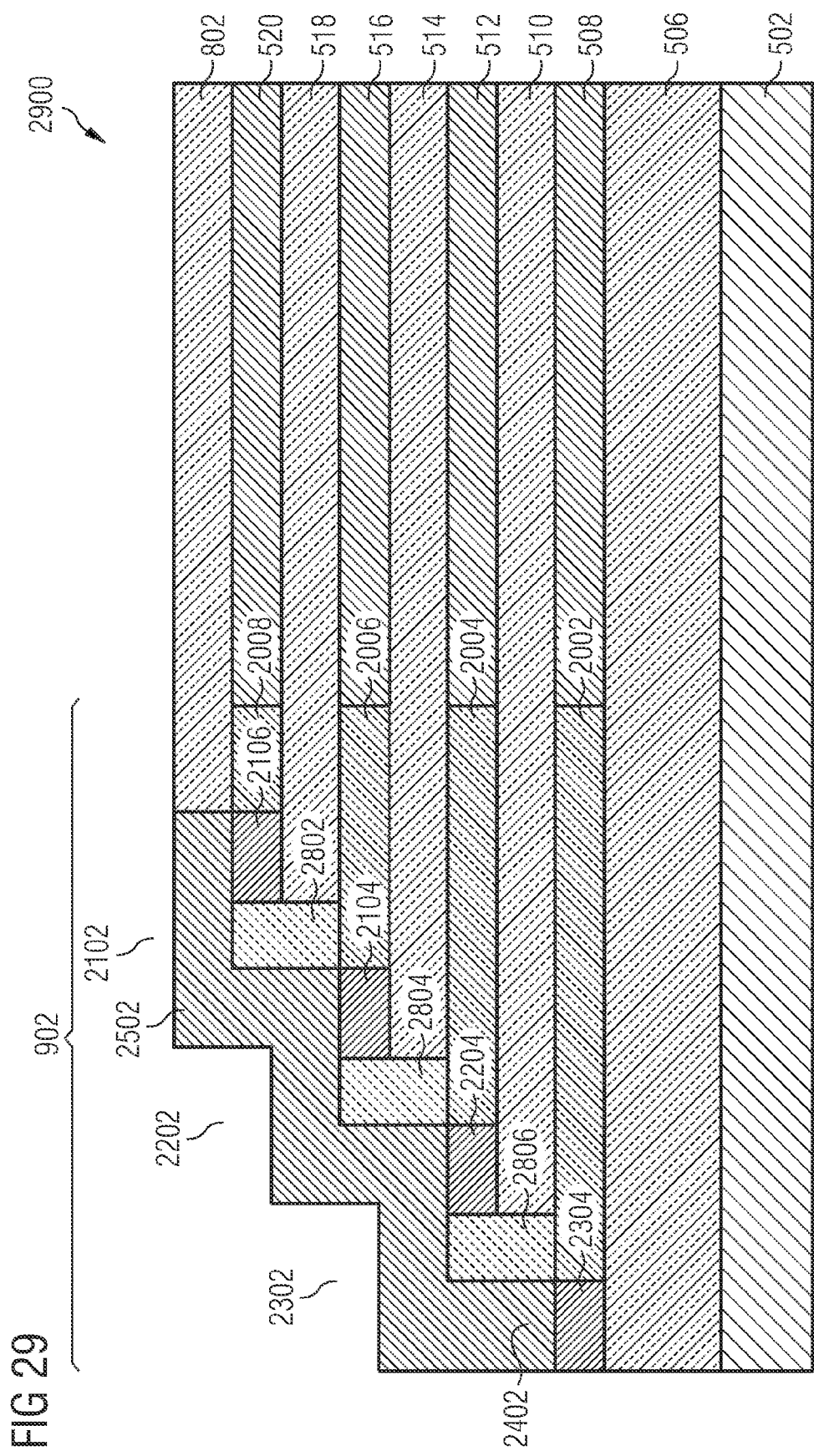
FIG. 29 shows a cross sectional view of a portion of a switch matrix region in accordance with yet another embodiment at a second time of the manufacturing.

FIG. 29 shows a cross sectional view 2900 of a portion of the switch matrix region 310 in accordance with yet another embodiment at a second time of the manufacturing.

Then, as shown in FIG. 29, a (doped or undoped) polysilicon layer 2502 (in an alternative example, a layer made of any other suitable electrically conductive material may be provided instead of the polysilicon layer 2502, e.g., a metal layer) may be deposited (e.g., using a CVD process) on the structure shown in FIG. 28. In an example, the polysilicon layer 2502 may be $n^+$-doped using phosphorous atoms, for example. As shown in FIG. 29, the polysilicon layer 2502 may be conformally deposited on the structure shown in FIG. 28, thereby covering and electrically contacting the connection regions 2108, 2206, 2306, 2404, etc., (not shown) and/or the counterdoped regions 2104, 2106, 2204, 2304, etc. (in case no highly doped contact regions are provided).

Figure 30:
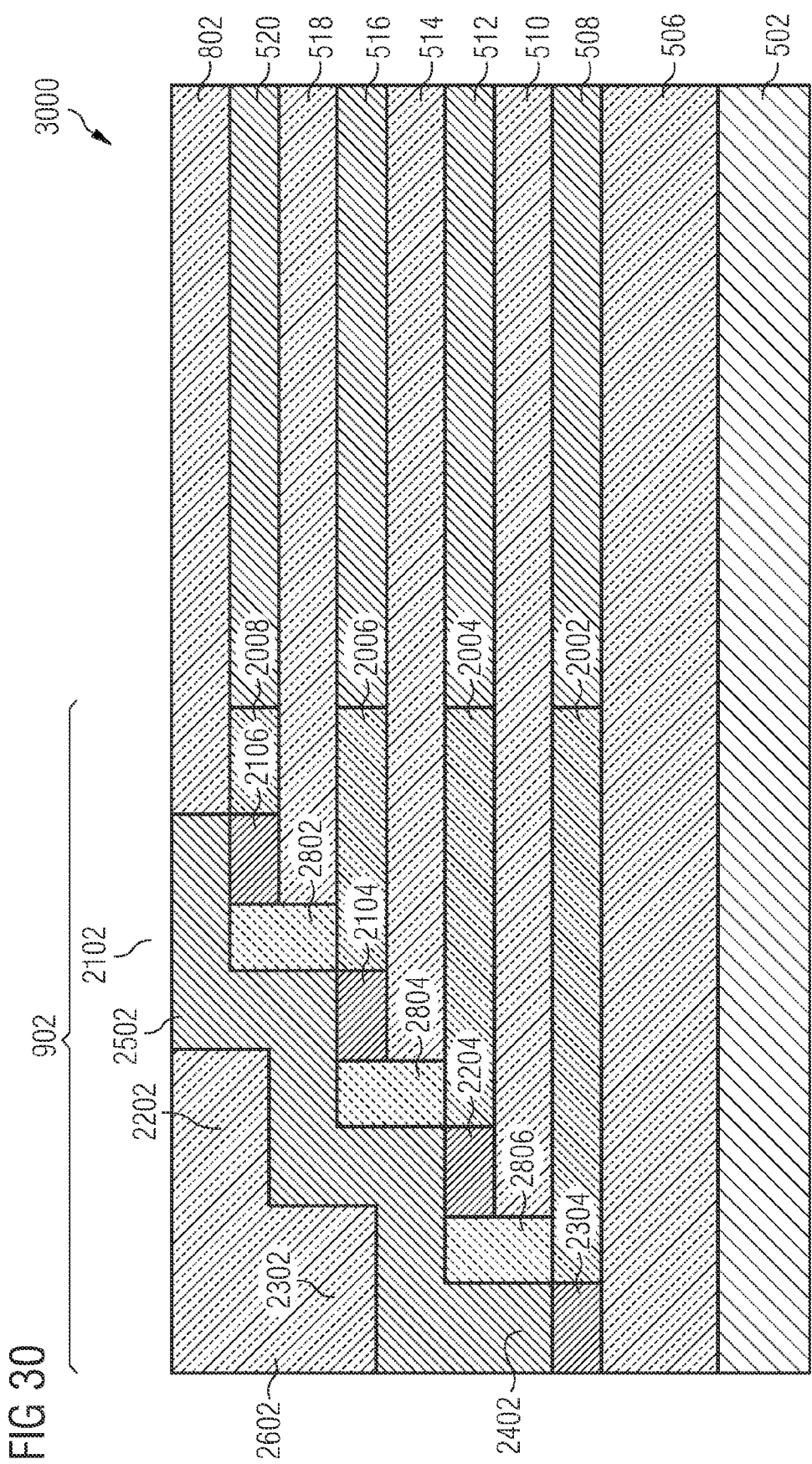
FIG. 30 shows a cross sectional view of a portion of a switch matrix region in accordance with yet another embodiment at a third time of the manufacturing.
Figure 31:
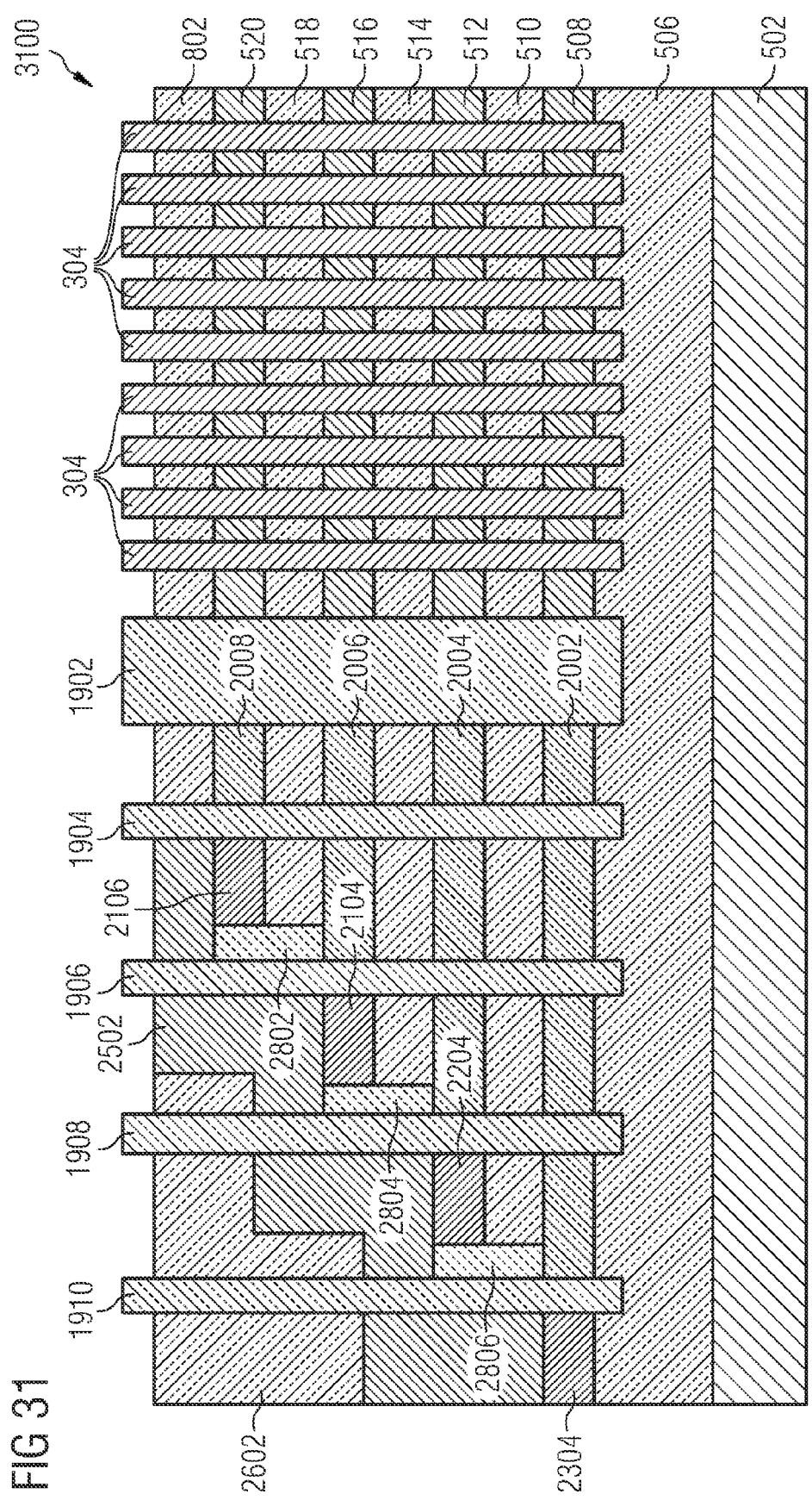
FIG. 31 shows a cross sectional view of a portion of a switch matrix region in accordance with yet another embodiment at a fourth time of the manufacturing.

FIG. 30 shows a cross sectional view 3000 of a portion of the switch matrix region 310 in accordance with yet another embodiment at a third time of the manufacturing. FIG. 31 shows a cross sectional view 3100 of a portion of a switch matrix region 310 in accordance with yet another embodiment at a fourth time of the manufacturing.

Then, an insulating layer 2602 (e.g., an oxide layer 2602, e.g., a silicon oxide layer 2602) may be deposited to fill the space of the staircase structure area 902 at least up to the upper surface of the insulating layer 802, followed by a planarization process such as e.g. a CMP process down to the upper surface of the insulating layer 802. Then, in a similar manner as described above and as shown in FIG. 31, the charge storing layer stack may be deposited and the gate contacts may be formed. Then, the polysilicon layer 2502 may be patterned. In the embodiment shown in FIG. 31, a wider switch selection line 1902 (wider than the select switch selection lines 314, 316, 318, 320, 322, 324, 326, 328) may additionally be provided for decoding as a commonly shared select gate. In this case, smaller select gates (and thus also narrower switch selection lines 1904, 1906, 1908, 1910 compared with the width of the switch selection lines 314, 316, 318, 320, 322, 324, 326, 328 may be provided) for decoding. This may save chip area for the memory cell field 202. Furthermore, in this embodiment, a low resistance may be provided (and thus higher read currents) due to shorter memory cell strings.

Figure 32:
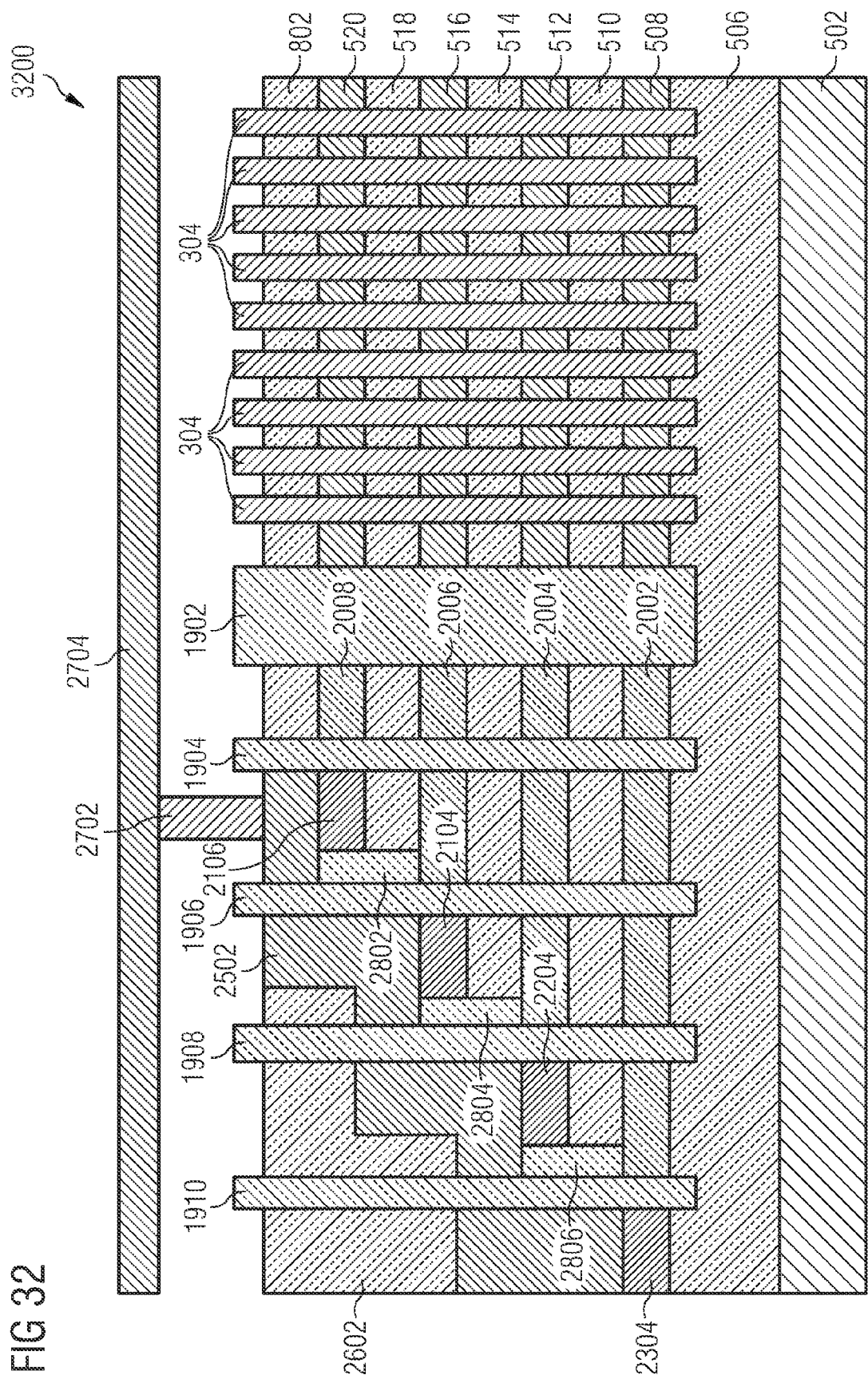
FIG. 32 shows a cross sectional view of a portion of a switch matrix region in accordance with yet another embodiment at a fifth time of the manufacturing.

FIG. 32 shows a cross sectional view 3200 of a portion of the switch matrix region 310 in accordance with yet another embodiment at a fifth time of the manufacturing.

Then, a contact hole (in an alternative example, a plurality of contact holes) may be formed in the insulating layer 2602 to expose a portion of the polysilicon layer 2502 (in an example, at any step of the staircase structure, e.g., in the uppermost step of the staircase structure). The contact hole may be filled with electrically conductive material 2702 (e.g., tungsten (W) or tungsten silicide (WSi)). In an example, then, a metal layer may be deposited (e.g., using a CVD or PVD) and then patterned such that bit lines 2704, which may respectively electrically coupled to the electrically conductive material 2702 filled into the contact hole. It should be mentioned that in an alternative example, an arbitrary number of metal layers may be provided in the back-end-of-line (BEOL) processing to connect the respective components in the memory cell arrangement. In accordance with this embodiment, only one contact hole is needed due to implementation of the $n^+$-polysilicon bridge, e.g., implemented by the polysilicon layer 2502. As discussed above, the landed contact (using the contact hole) could be placed on several positions within the staircase structure area 902.

With respect to the switch matrix region 310, in various embodiments, a first staircase may be formed first (one step for each memory layer, e.g., one step for each layer of memory cell strings) and a combination of n-implants and p-implants may be provided to create the select gate switch matrix. The staircase may allow a deep n-implant and a shallow p-implant with a very good depth control. The deep n-implants may be provided for the normally-on transistors to be formed, which may be arranged below the normally-off select transistors to be formed with the shallow p-implants.

In the following, various embodiment of the source line region 308 will be described in more detail. The source line region 308 may be provided, e.g., for a well contact and a source line contact.

Figure 33:
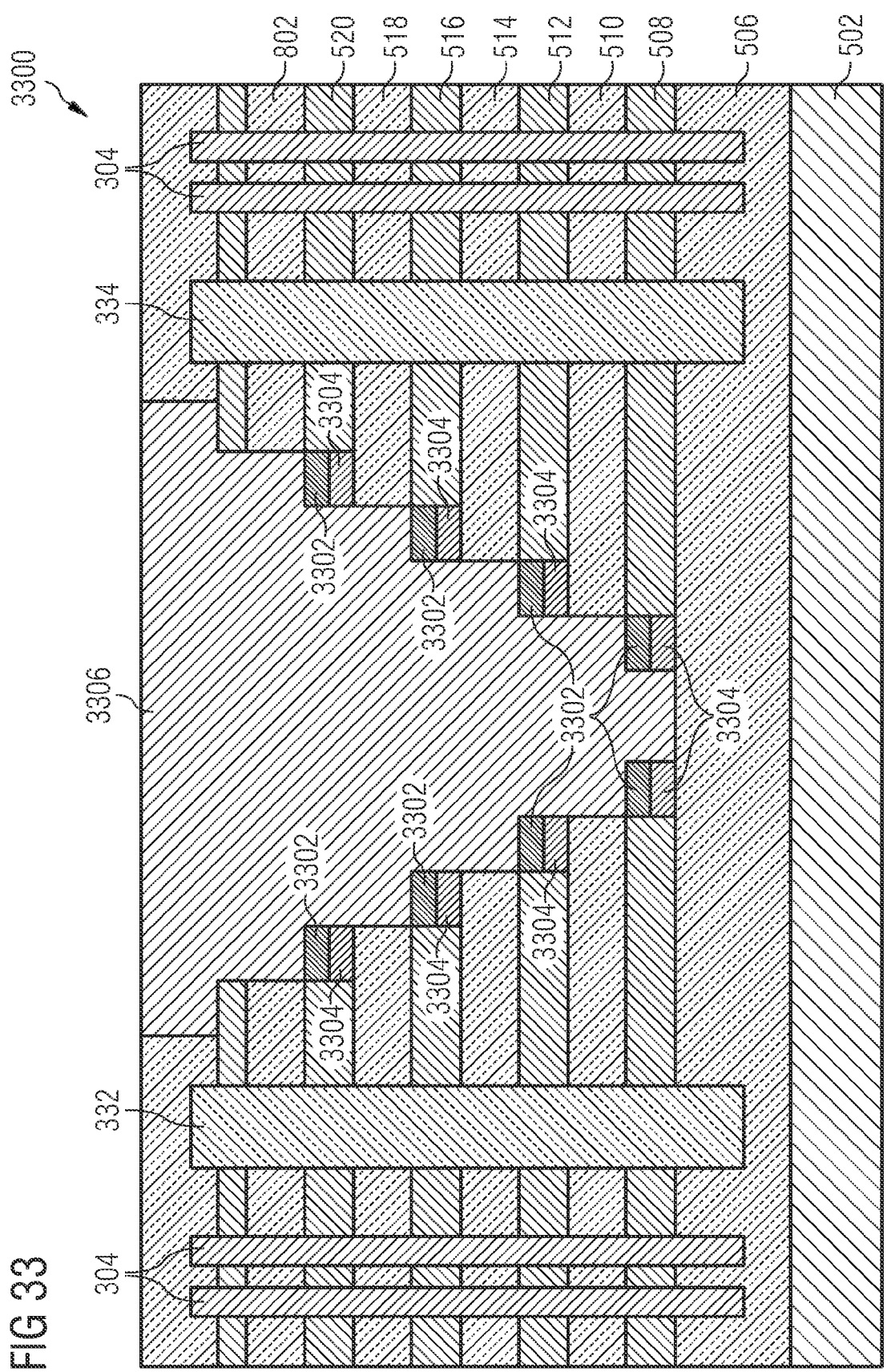
FIG. 33 shows a cross sectional view of a portion of a source line region in accordance with an embodiment.

FIG. 33 shows a cross sectional view 3300 of a portion of the source line region 308 in accordance with an embodiment.

In this embodiment, also in the source line region 308, a staircase structure may be formed, e.g. at the same time (but of course with a different mask pattern) as the bit line staircase structure 804 is formed, e.g., as described above. In the source line staircase structure, each step may include a stack of two inversely doped regions, e.g., an $n^+$-doped region 3302 (which may serve as a respective source/drain contact for a programming operation and/or a read operation) and a $p^+$-doped region 3304 (which may serve as a body contact for an erase operation) on top of each other, wherein the $n^+$-doped region 3302 may respectively be provided on top of the $p^+$-doped region 3304, or, in an alternative example, the $p^+$-doped region 3304 may respectively be provided on top of the $n^+$-doped region 3302. In this embodiment a steep staircase structure is provided in order to provide electrical connection down to the lower transistors (in other words to provide electrical connection down to the lowest semiconductor layer, e.g., to the first semiconductor layer 508).

In an example, the source line staircase structure may be formed at the beginning of the manufacturing process and, as discussed above, combined with the formation of the bit line staircase structure and intermediate buried with oxide. In an example, the formation of the source line staircase structure may be self-aligned. Furthermore, line-like source line etch processes may be used to remove the buried oxide later in the process. Then, the formed large contact region may be filled with electrically conductive material 3306 such as, e.g., titanium nitride/tungsten (TiN/W), followed by a planarization process (e.g., using CMP).

It should be noted that the whole source line staircase structure could in an alternative example also be etched after the gate contact or MOL formation (as e.g. described with reference to FIG. 17), followed by line-like contact as a staircase. Then the implants could be provided, followed by the contact fill and a planarization (e.g., using CMP).

Figure 34:
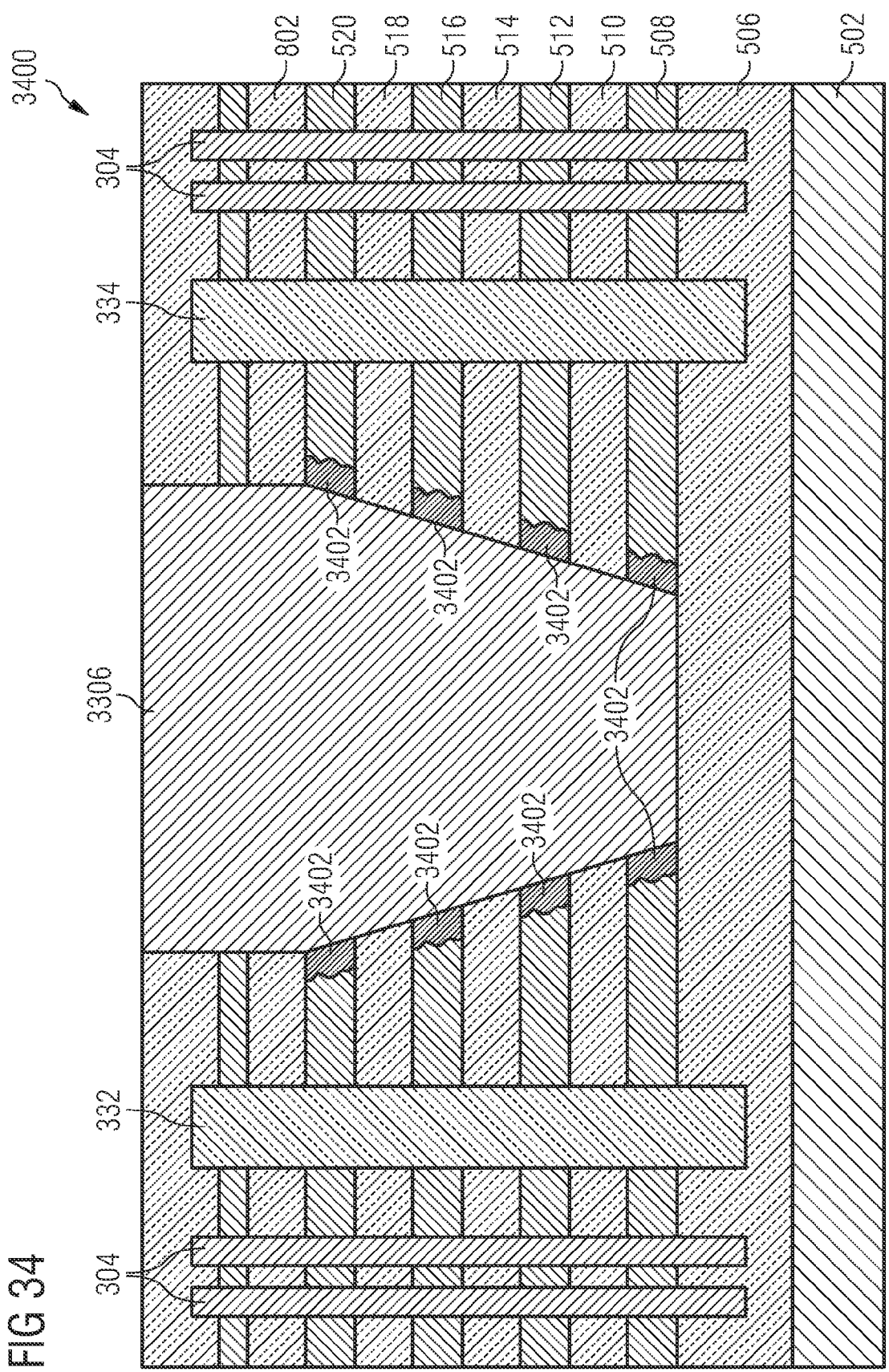
FIG. 34 shows a cross sectional view of a portion of a source line region in accordance with another embodiment.

FIG. 34 shows a cross sectional view 3400 of a portion of the source line region 308 in accordance with another embodiment.

In this embodiment, instead of the n$^+$-doped regions 3302 and the p$^+$-doped regions 3304 of FIG. 33, salicided sidewall contacts 3402 are provided to the specific stacked memory cells (e.g. to the respective memory cell strings). In an example, the source line region 310 may include a V-shaped source line construction. The salicided sidewall contacts 3402 may provide a schottky like contact without additional implants being required in order to avoid diode formation and to enable body contact (e.g., −20 V during an erase operation) and string contact (e.g., 0 V during a programming operation and/or a read operation). In an example, the common source line may be etched after the gate contact formation or the MOL formation, as described above. In an example, a line-like, tapered source line contact may be provided, which may then be salicided (e.g., forming titanium salicide (TiSi) or cobalt salicide (CoSi)), wherein the salicidation may be followed by a contact fill (e.g., using tungsten (W) or tungsten silicide (WSi) and a planarization process (e.g., using CMP).

Figure 35:
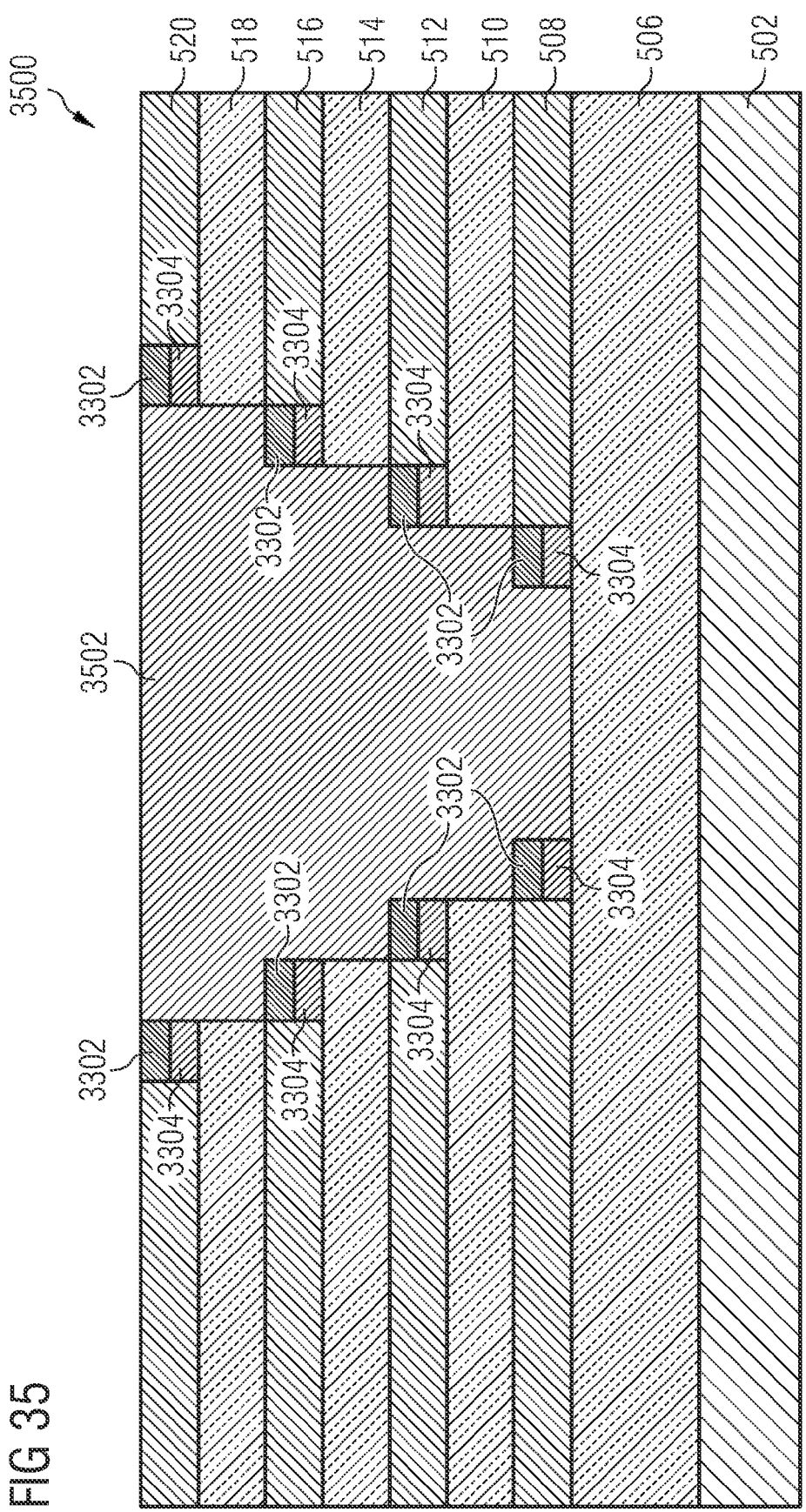
FIG. 35 shows a cross sectional view of a portion of a source line region in accordance with yet another embodiment at a first time of the manufacturing.

FIG. 35 shows a cross sectional view 3500 of a portion of the source line region 308 in accordance with yet another embodiment at a first time of the manufacturing.

This embodiment is similar to the embodiment shown in FIG. 33 with the difference, that the contact filling material 3502 is not a metal but an electrically conductive material having a higher temperature stability such as, e.g., polysilicon 3502. In this embodiment, the source line staircase structure may be formed at the beginning of the manufacturing process before the formation of the bit line staircase structure and the gate contacts and the MOL processes, etc. This is possible since the polysilicon 3502 of the source line contact is not destroyed during the high temperature processes used in the formation of the memory cells, for example. After the formation of the source line contact, shallow trench isolations (STI) may be formed in this embodiment.

Figure 36:
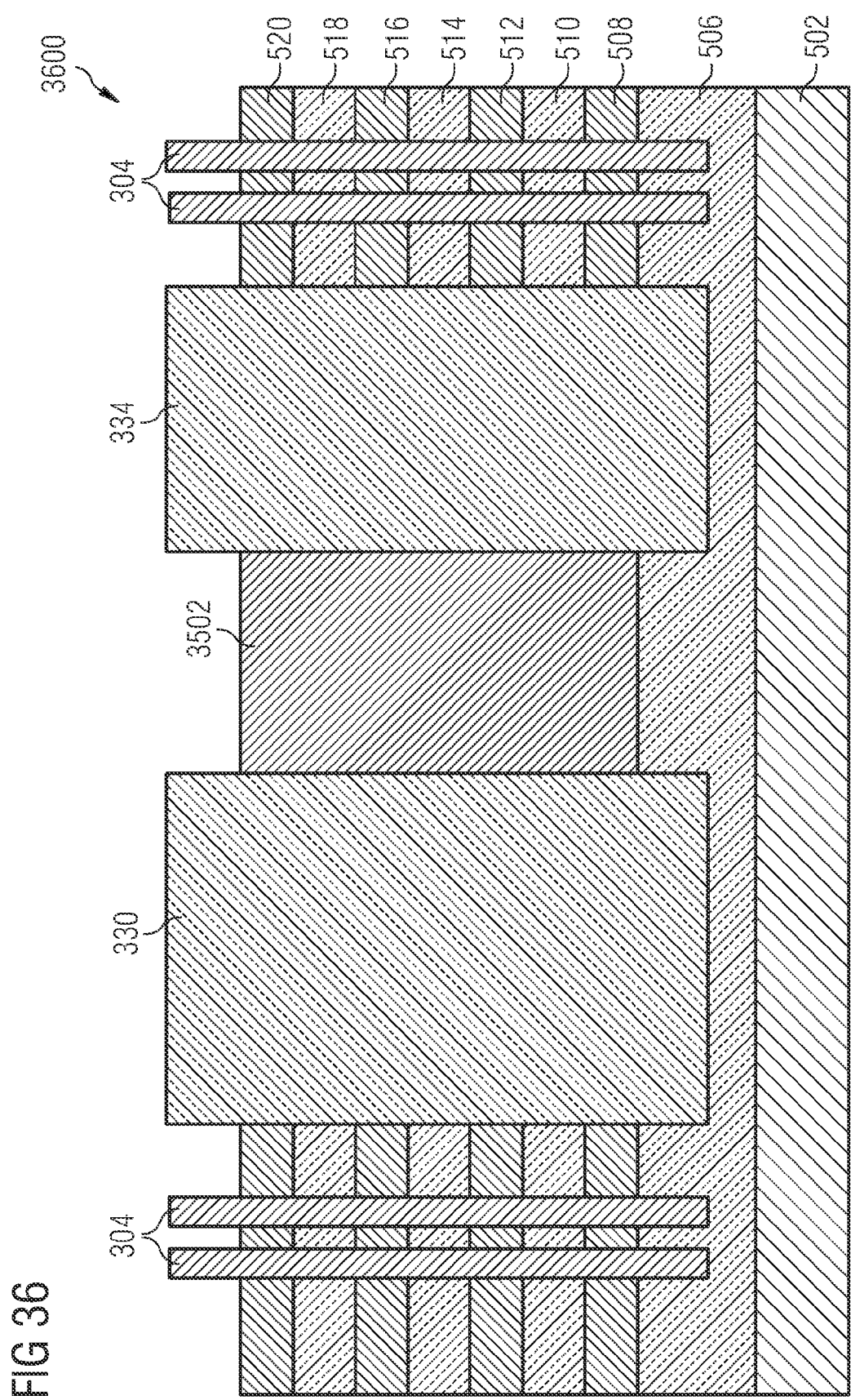
FIG. 36 shows a cross sectional view of a portion of a source line region in accordance with yet another embodiment at a second time of the manufacturing.

FIG. 36 shows a cross sectional view 3600 of a portion of the source line region 308 in accordance with yet another embodiment at a second time of the manufacturing.

After having deposited the polysilicon 3502, in this example, the charge storing layer stack (e.g., the charge trapping layer stack) may be deposited, followed by the formation of the gate contacts.

Figure 37:
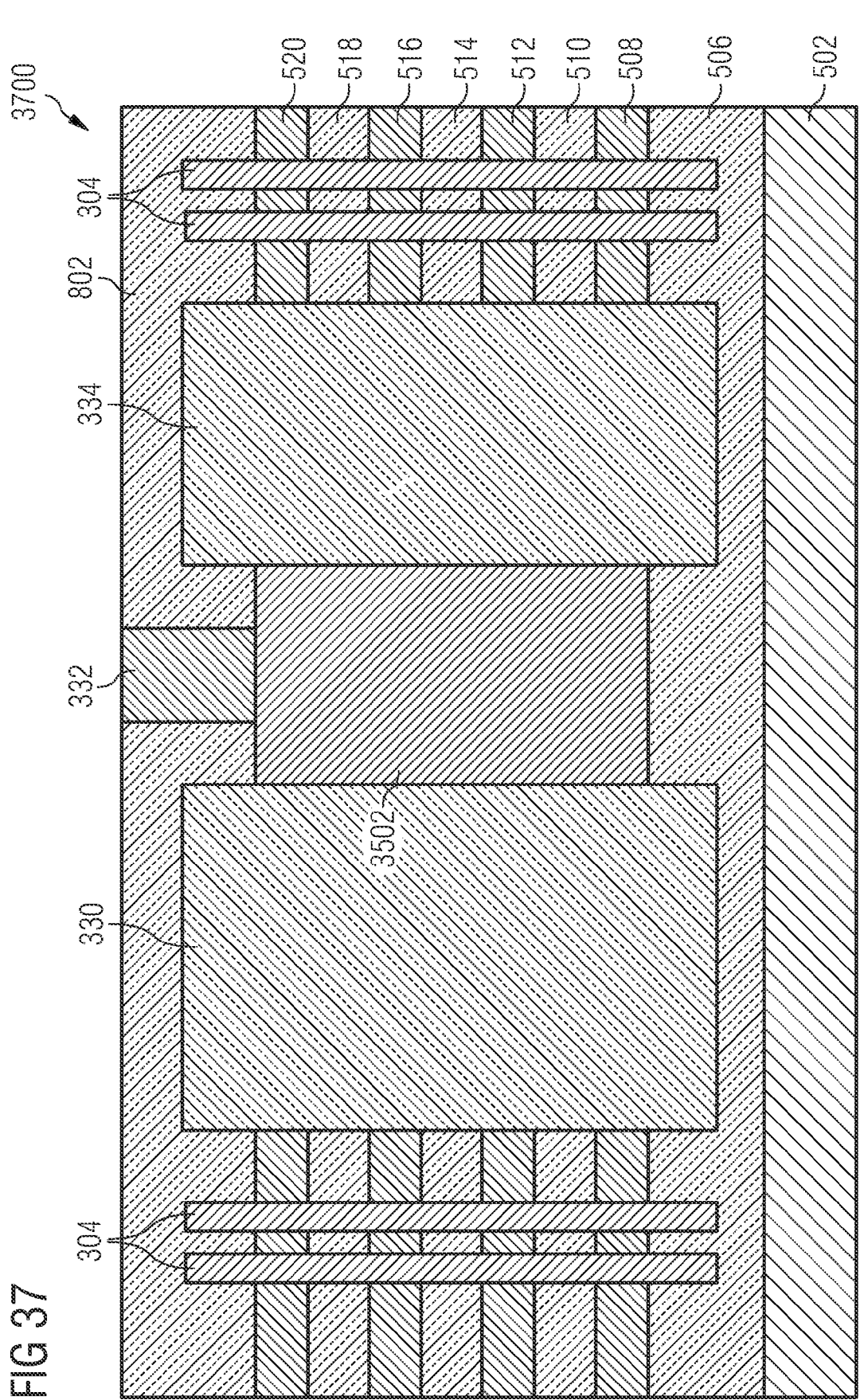
FIG. 37 shows a cross sectional view of a portion of a source line region in accordance with yet another embodiment at a third time of the manufacturing.

FIG. 37 shows a cross sectional view 3700 of a portion of the source line region 308 in accordance with yet another embodiment at a third time of the manufacturing.

Then, a further insulating layer 802 (which may be used as an auxiliary mask layer such as, e.g., as a hard mask layer), e.g., made of silicon dioxide, may be deposited on the upper surface of the fourth semiconductor layer 520. Next, a contact hole (which may have a line-like structure) may be formed (e.g. etched, e.g. using an anisotropic etching process such as, e.g., a RIE process), thereby exposing a portion of the upper surface of the polysilicon 3502, and the contact hole may be filled with electrically conductive material such as, e.g., tungsten (W) or tungsten silicide (WSi), thereby forming the source line contact of the source line 332 on top of the polysilicon 3502.

This embodiment provides a good connection, since the select gates 330, 334 are provided over a large area of the polysilicon 3502 filling. This may provide a homogeneous on-current in the respective layers (e.g., in the memory cell strings).

In various embodiments referring to the source line region 308, a staircase is proposed that allows an area optimized n$^+$/p$^+$-contact to the p-body of the memory cell strings, for example. The n$^+$/p$^+$-contacts placed on top of each other and which may be provided for each step of the staircase structure may be well defined due to the shallow implants provided in various embodiments. Another embodiment proposes a simple solution with a source line contact realized by an ohmic salicided contact (see, e.g., FIG. 34).

In various embodiments, an accurate control of doping profiles and a reliable operation of the select gates in a switch matrix region 310 for the select gates is not required. Thus, the various described embodiments are suitable even with a large number of layers being stacked above one another, e.g., in a fin structure.

Some features of various embodiments will be listed below:

In various embodiments, a staircase like structure may be provided for a bit line select matrix.

In various embodiments, a staircase structure may be made using a sequence of lithographic and etching processes or using a single lithographic process followed by a spacer and etch scheme.

In various embodiments, a combination of normally-on transistors and normally-off transistors may be provided.

In various embodiments, a method applicable to a stacked NAND memory cell field (e.g., a memory cell array), e.g., having two or more levels, is provided.

In various embodiments, a staircase like structure may be provided for a source line of a stacked memory field (e.g., a memory cell array).

In various embodiments, optionally, an additional select gate may be provided as a high voltage switch and shrunk select gates for the switch transistors, for example (thereby achieving area gain in case of many memory cell levels.

In various embodiments, optionally, a source line with a salicided contact to silicon bodies, for example, may be provided (with or without n$^+$/p$^+$-implants).

In various embodiments, optionally, non-SOI wafers and stacking of alternating oxide/silicon wafers by means of deposition may be provided.

In various embodiments, optionally, periphery in bulk silicon may be provided together with a removal of all SOI layers first in the periphery region.

In various embodiments, optionally, periphery circuitry may be provided in the top SOI (thus, additional memory levels may be buried, which may be used for conventional processing in the periphery, like contacts etc.

In an embodiment, an integrated circuit having a memory cell arrangement is provided. The memory cell arrangement may include a fin structure extending in a first direction. The fin structure may include a first memory cell structure having a plurality of first active regions of a first plurality of memory cells coupled with each other in serial connection in the first direction, and a second memory cell structure having a plurality of second active regions of a second plurality of memory cells coupled with each other in serial connection in the first direction, wherein the second memory cell structure is disposed above the first memory cell structure. The memory cell arrangement may further include a memory cell contact structure configured to electrically couple the first memory cell structure and the second memory cell structure. The memory cell contact structure may have a staircase structure, a first step of which is configured to electrically contact the first memory cell structure, and a second step of which is configured to electrically contact the second memory cell structure.

In an example of this embodiment, the integrated circuit may further include a plurality of charge storage layer structures disposed adjacent at least one sidewall of the fin structure covering at least a portion of the first active regions and at least a portion of the second active regions. The charge storage layer structure may include a floating gate layer structure. Alternatively, the charge storage layer structure may include a nanocrystalline type layer structure having nanocrystals embedded in a dielectric, the nanocrystals being configured to store electrical charges. Further alternatively, the charge storage layer structure may include a charge trapping layer structure, e.g., a nitride based charge trapping layer structure.

In another example of this embodiment, the integrated circuit may further include a switch arrangement including switches configured to individually select the memory cells. The switches may be formed by transistors. Furthermore, the switch arrangement may include normally-off select transistors and normally-on select transistors In another example of this embodiment, the fin structure may further include a first insulating layer disposed between the first memory cell structure and the second memory cell structure.

In yet another example of this embodiment, the fin structure may further include a second insulating layer disposed above the second active regions, and a third memory cell structure having a plurality of third active regions of a third plurality of memory cells coupled with each other in serial connection in the first direction. The third memory cell structure may be disposed above the second memory cell structure.

In yet another example of this embodiment, the fin structure may further include source/drain regions adjacent the first active regions and the second active regions, respectively.

In yet another example of this embodiment, the fin structure may be made of a semiconductor material, e.g., silicon.

In yet another example of this embodiment, the fin structure may further include a plurality of control gate layers disposed next to the charge storage layer structures.

In an example of this embodiment, the memory cell contact structure may include a plurality of contact holes, wherein each contact hole is coupled with a respective step of the staircase structure.

In another example of this embodiment, the integrated circuit may further include a bit line coupled with the memory cell contact structure.

In another example of this embodiment, the memory cell contact structure may be part of the fin structure.

In another example of this embodiment, the first step and the second step may each include a first doped region doped with doping atoms of a first conductivity type. The memory cell contact structure may further include second doped regions doped with doping atoms of a second conductivity type, wherein the second conductivity type may be different from the first conductivity type, wherein the second doped regions are disposed next to first doped regions in the first direction.

In another embodiment, an integrated circuit having a memory cell arrangement is provided. The memory cell arrangement may include a fin structure. The fin structure may include a first memory cell structure having at least one first active region of at least one first memory cell, a second memory cell structure having at least one second active region of at least one second memory cell, wherein the second memory cell structure is disposed above the first memory cell structure, and a memory cell contact structure configured to electrically couple the first memory cell structure and the second memory cell structure, wherein the memory cell contact structure has a staircase structure, a first step of which is configured to electrically contact the first memory cell structure, and a second step of which is configured to electrically contact the second memory cell structure.

In an example of this embodiment, the integrated circuit may further include a plurality of charge storage layer structures disposed adjacent at least one sidewall of the fin structure covering at least a portion of the first active regions and at least a portion of the second active regions. The charge storage layer structure may include a floating gate layer structure. Alternatively, the charge storage layer structure may include a nanocrystalline type layer structure having nanocrystals embedded in a dielectric, the nanocrystals being configured to store electrical charges. In another alternative, the charge storage layer structure may include a charge trapping layer structure.

In an example of this embodiment, the integrated circuit may further include a switch arrangement having switches configured to individually select the memory cells. The switches may be formed by transistors. Furthermore, the switch arrangement may include normally-off select transistors and normally-on select transistors.

In an example of this embodiment, the fin structure may further include a first insulating layer disposed between the first memory cell structure and the second memory cell structure.

In another example of this embodiment, the fin structure may further include a second insulating layer disposed above the second active regions, and a third memory cell structure having a plurality of third active regions of a third plurality of memory cells coupled with each other in serial connection in the first direction, wherein the third memory cell structure may be disposed above the second memory cell structure.

In another example of this embodiment, the fin structure may further include source/drain regions adjacent the first active regions and the second active regions, respectively.

In another example of this embodiment, the fin structure may be made of a semiconductor material, e.g., silicon.

In another example of this embodiment, the fin structure may further include a plurality of control gate layers disposed next to the charge storage layer structures.

In another example of this embodiment, the memory cell contact structure may include a plurality of contact holes, wherein each contact hole may be coupled with a respective step of the staircase structure.

In yet another example of this embodiment, the integrated circuit may further include a bit line coupled with the memory cell contact structure.

In yet another example of this embodiment, the memory cell contact structure may be part of the fin structure.

In yet another example of this embodiment, the first step and the second step each may include a first doped region doped with doping atoms of a first conductivity type. Furthermore, the memory cell contact structure may further include second doped regions doped with doping atoms of a second conductivity type, wherein the second conductivity type may be different from the first conductivity type. The second doped regions may be disposed next to first doped regions in the first direction.

In another embodiment, an integrated circuit having a memory cell arrangement is provided. The memory cell arrangement may include a substrate, a fin structure disposed above the substrate, and a memory cell contacting region. The fin structure may include a memory cell region having a plurality of memory cell structures being disposed above one another, wherein each memory cell structure may include an active region of a respective memory cell. The memory cell contacting region may be configured to electrically contact each of the memory cell structures, wherein the memory cell contacting region may include a plurality of contact regions, which are at least partially displaced with respect to each other in a direction parallel to the main processing surface of the substrate.

In an example of this embodiment, the memory cell contacting region may further include contact holes being arranged substantially perpendicular to the main processing surface of the substrate, wherein each contact hole may be configured to contact a respective one of the contact regions.

In an example of this embodiment, the integrated circuit may further include a plurality of charge storage layer structures disposed adjacent at least one sidewall of the fin structure covering at least a portion of the active regions. The charge storage layer structure may include a floating gate layer structure. Alternatively, the charge storage layer structure may include a nanocrystalline type layer structure having nanocrystals embedded in a dielectric, the nanocrystals being configured to store electrical charges. In another alternative, the charge storage layer structure may include a charge trapping layer structure.

In an example of this embodiment, the integrated circuit may further include a switch arrangement having switches configured to individually select the memory cells. The switches may be formed by transistors. Furthermore, the switch arrangement may include normally-off select transistors and normally-on select transistors.

In an example of this embodiment, the fin structure may further include an insulating layer disposed between two memory cell structures.

In another example of this embodiment, the fin structure may further include source/drain regions adjacent the active regions.

In yet another example of this embodiment, the fin structure may be made of a semiconductor material, e.g., silicon.

In another example of this embodiment, the fin structure may further include a plurality of control gate layers disposed next to the charge storage layer structures.

In yet another example of this embodiment, a bit line may be provided which may be coupled with the memory cell contact structure.

In yet another example of this embodiment, the memory cell contact structure may be part of the fin structure.

In yet another example of this embodiment, each contact region may include a first doped region doped with doping atoms of a first conductivity type. The memory cell contact structure may further include second doped regions doped with doping atoms of a second conductivity type, wherein the second conductivity type may be different from the first conductivity type. The second doped regions may be disposed next to the contact regions in the direction parallel to the main processing surface of the substrate.

In yet another example of this embodiment, the contact regions may be displaced with respect to each other in a direction perpendicular to the main processing surface of the substrate.

Figure 38:
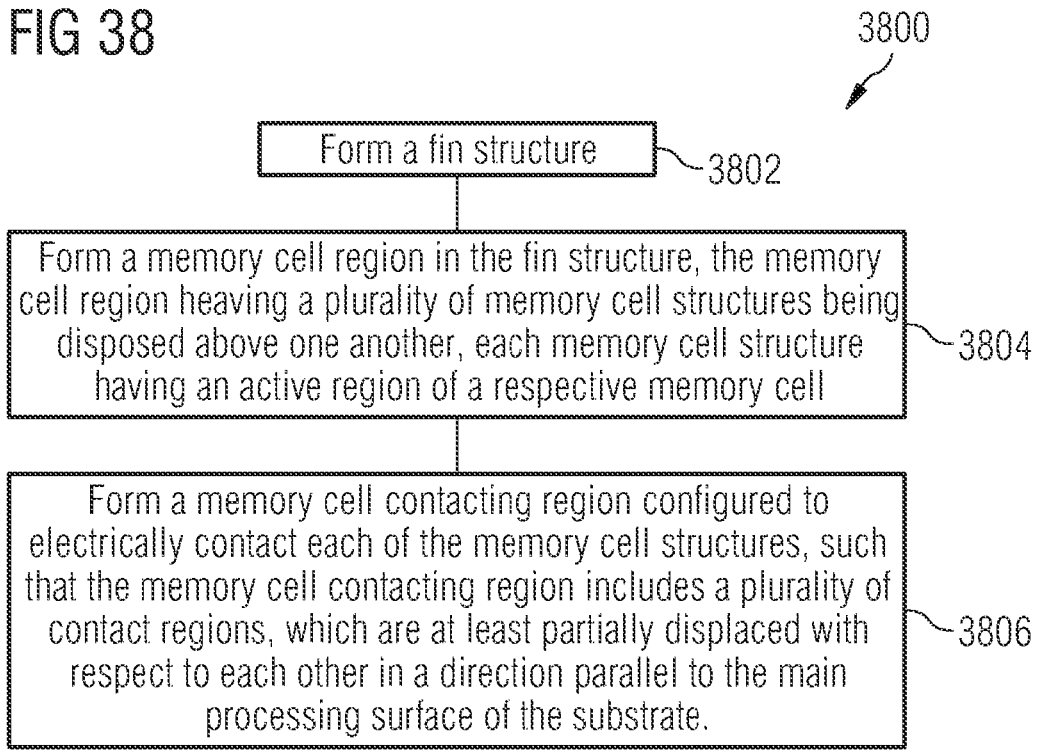
FIG. 38 shows a method for manufacturing an integrated circuit having a memory cell arrangement in accordance with an embodiment.

In another embodiment, a method 3800 for manufacturing an integrated circuit having a memory cell arrangement is provided as shown in FIG. 38. The method 3800 may include, in 3802, forming a fin structure. Then, in 3804, a memory cell region may be formed in the fin structure. The memory cell region may include a plurality of memory cell structures being disposed above one another. Each memory cell structure may include an active region of a respective memory cell. In 3806, a memory cell contacting region may be formed which is configured to electrically contact each of the memory cell structures, such that the memory cell contacting region includes a plurality of contact regions, which are at least partially displaced with respect to each other in a direction parallel to the main processing surface of the substrate.

Figure 39:
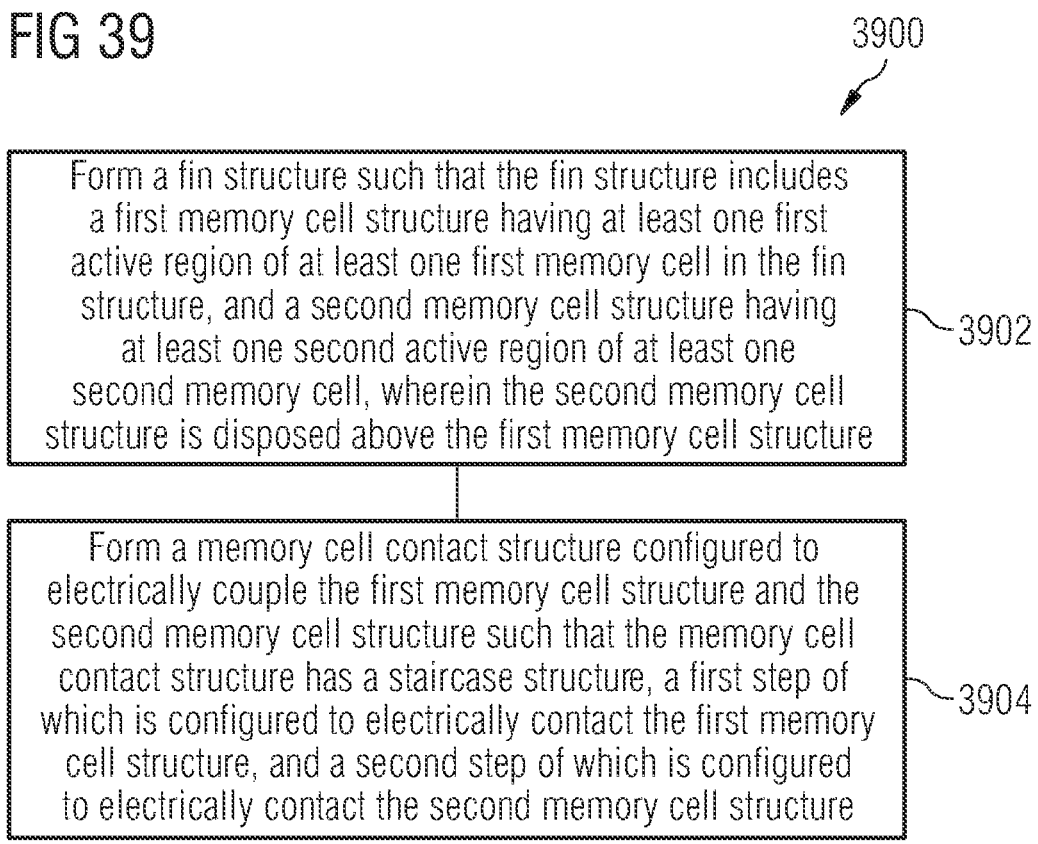
FIG. 39 shows a method for manufacturing an integrated circuit having a memory cell arrangement in accordance with another embodiment.

In another embodiment, a method 3900 for manufacturing an integrated circuit having a memory cell arrangement is provided as shown in FIG. 39. The method 3900 may include, in 3902, forming a fin structure such that the fin structure includes a first memory cell structure having at least one first active region of at least one first memory cell in the fin structure, and a second memory cell structure having at least one second active region of at least one second memory cell, wherein the second memory cell structure is disposed above the first memory cell structure. Then, in 3904, a memory cell contact structure may be formed which may be configured to electrically couple the first memory cell structure and the second memory cell structure, such that the memory cell contact structure has a staircase structure, a first step of which is configured to electrically contact the first memory cell structure, and a second step of which is configured to electrically contact the second memory cell structure.

Figure 40A:
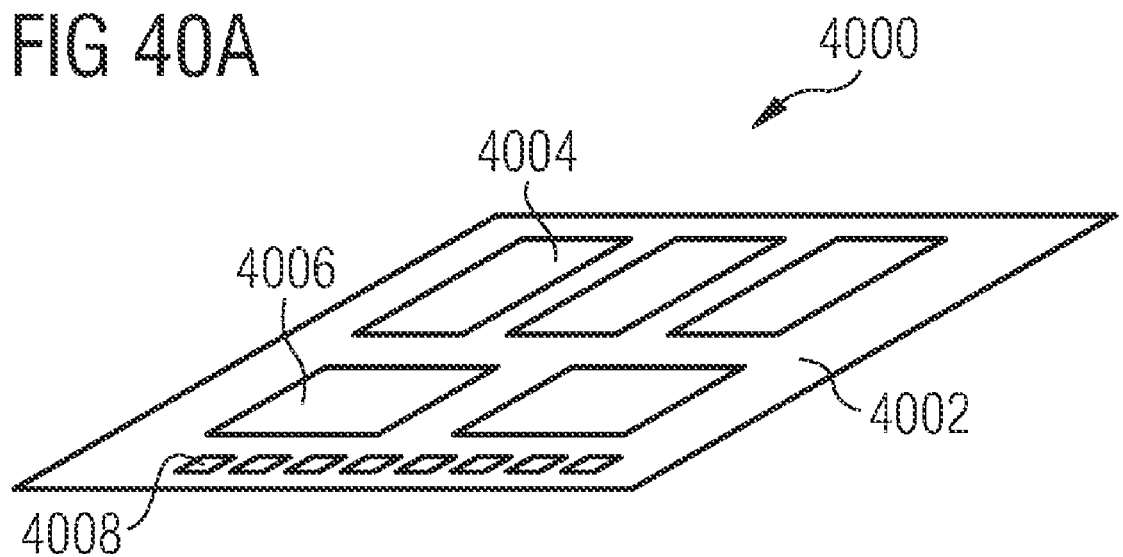
FIGS. 40A and 40B show a memory module (FIG. 40A) and a stackable memory module (FIG. 40B) in accordance with an embodiment.
Figure 40B:
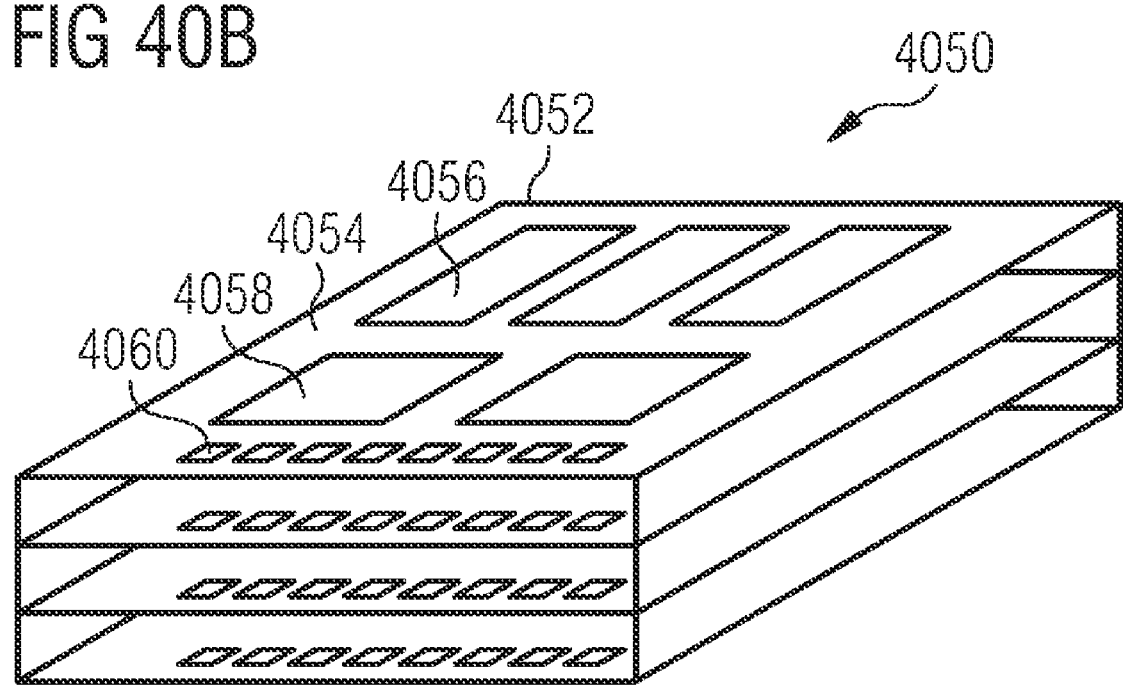

As shown in FIGS. 40A and 40B, in some embodiments, memory devices such as those described herein may be used in modules.

In FIG. 40A, a memory module 4000 is shown, on which one or more memory devices 4004 are arranged on a substrate 4002. The memory device 4004 may include numerous memory cells, each of which uses a memory element in accordance with an embodiment. The memory module 4000 may also include one or more electronic devices 4006, which may include memory, processing circuitry, control circuitry, addressing circuitry, bus interconnection circuitry, or other circuitry or electronic devices that may be combined on a module with a memory device, such as the memory device 4004. Additionally, the memory module 4000 may include multiple electrical connections 4008, which may be used to connect the memory module 4000 to other electronic components, including other modules.

As shown in FIG. 40B, in some embodiments, these modules may be stackable, to form a stack 4050. For example, a stackable memory module 4052 may contain one or more memory devices 4056, arranged on a stackable substrate 4054. The memory device 4056 contains memory cells that employ memory elements in accordance with an embodiment. The stackable memory module 4052 may also include one or more electronic devices 4058, which may include memory, processing circuitry, control circuitry, addressing circuitry, bus interconnection circuitry, or other circuitry or electronic devices that may be combined on a module with a memory device, such as the memory device 4056. Electrical connections 4060 are used to connect the stackable memory module 4052 with other modules in the stack 4050, or with other electronic devices. Other modules in the stack 4050 may include additional stackable memory modules, similar to the stackable memory module 4052 described above, or other types of stackable modules, such as stackable processing modules, control modules, communication modules, or other modules containing electronic components.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising a memory cell arrangement, the memory cell arrangement comprising:
   a fin structure extending in a first direction, the fin structure comprising:
      a first memory cell structure comprising a plurality of first active regions of a first plurality of memory cells coupled with each other in serial connection in the first direction;
      a second memory cell structure comprising a plurality of second active regions of a second plurality of memory cells coupled with each other in serial connection in the first direction, wherein the second memory cell structure is disposed above the first memory cell structure;
   a memory cell contact structure configured to electrically couple the first memory cell structure and the second memory cell structure, wherein the memory cell contact structure has a staircase structure, a first step of which is configured to electrically contact the first memory cell structure, and a second step of which is configured to electrically contact the second memory cell structure; and
   wherein the first step and the second step each comprises a first doped region doped with doping atoms of a first conductivity type, wherein the memory cell contact structure further comprises second doped regions doped with doping atoms of a second conductivity type, wherein the second conductivity type is different from the first conductivity type, wherein the second doped regions are disposed next to the first doped regions in the first direction.

2. The integrated circuit of claim 1, further comprising:
   a plurality of charge storage layer structures disposed adjacent at least one sidewall of the fin structure covering at least a portion of the first active regions and at least a portion of the second active regions.

3. The integrated circuit of claim 2, wherein each charge storage layer structure comprises a structure selected from the group consisting of:
   a floating gate layer structure;
   a nanocrystalline type layer structure comprising nanocrystals embedded in a dielectric, the nanocrystals being configured to store electrical charges; and
   a charge trapping layer structure.

4. The integrated circuit of claim 1, further comprising:
   a switch arrangement comprising switches configured to individually select the memory cells of the first and second plurality of memory cells.

5. The integrated circuit of claim 4, wherein the switches comprise transistors.

6. The integrated circuit of claim 1, wherein the memory cell contact structure comprises a plurality of contact holes, wherein each contact hole is coupled with a respective step of the staircase structure.

7. The integrated circuit of claim 1, further comprising:
   a bit line coupled with the memory cell contact structure.

8. An integrated circuit comprising a memory cell arrangement, the memory cell arrangement comprising:
   a fin structure, comprising:
      a first memory cell structure having at least one first active region of at least one first memory cell;
      a second memory cell structure having at least one second active region of at least one second memory cell, wherein the second memory cell structure is disposed above the first memory cell structure;
   a memory cell contact structure configured to electrically couple the first memory cell structure and the second memory cell structure, wherein the memory cell contact structure has a staircase structure, a first step of which is configured to electrically contact the first memory cell structure, and a second step of which is configured to electrically contact the second memory cell structure; and
   wherein the first step and the second step each comprise a first doped region doped with doping atoms of a first conductivity type, wherein the memory cell contact structure further comprises second doped regions doped with doping atoms of a second conductivity type, wherein the second conductivity type is different from the first conductivity type, wherein the second doped regions are disposed next to the first doped region in a first direction.

9. The integrated circuit of claim 8, further comprising:
   a plurality of charge storage layer structures disposed adjacent at least one sidewall of the fin structure covering at least a portion of the at least one first active region and at least a portion of the at least one second active region.

10. The integrated circuit of claim 8, further comprising:
    a switch arrangement comprising switches configured to individually select memory cells.

11. The integrated circuit of claim 10, wherein the switches comprise transistors.

12. The integrated circuit of claim 8, wherein the memory cell contact structure comprises a plurality of contact holes, wherein each contact hole is coupled with a respective step of the staircase structure.

13. The integrated circuit of claim 8, further comprising:
    a bit line coupled with the memory cell contact structure.

14. An integrated circuit comprising a memory cell arrangement, the memory cell arrangement comprising:
    a substrate;
    a fin structure disposed above the substrate, the fin structure comprising:
       a memory cell region comprising a plurality of memory cell structures being disposed above one another, each memory cell structure comprising an active region of a respective memory cell; and
    a memory cell contacting region configured to electrically contact each of the memory cell structures, wherein the memory cell contacting region comprises a plurality of contact regions which are at least partially displaced with respect to each other in a direction parallel to a main processing surface of the substrate; and
    wherein each of the plurality of contact regions comprises a first doped region doped with doping atoms of a first conductivity type, wherein each of the plurality of contact regions further comprises second doped regions doped with doping atoms of a second conductivity type, wherein the second conductivity type is different from the first conductivity type, wherein the second doped regions are disposed next to the first doped region in a first direction.

15. The integrated circuit of claim 14, wherein the memory cell contacting region further comprises contact holes arranged substantially perpendicular to a main processing surface of the substrate, wherein each contact hole is configured to contact a respective one of the contact regions.

16. The integrated circuit of claim 14, further comprising a bit line coupled with the memory cell contacting region.

17. The integrated circuit of claim 14, wherein each contact region comprises a first doped region doped with doping atoms of a first conductivity type.

18. The integrated circuit of claim 14, wherein the contact regions are displaced with respect to each other in a direction perpendicular to the main processing surface of the substrate.

19. A method for manufacturing an integrated circuit comprising a memory cell arrangement, the method comprising:
   forming a fin structure;
   forming a memory cell region in the fin structure, the memory cell region comprising a plurality of memory cell structures disposed above one another, each memory cell structure comprising an active region of a respective memory cell; and
   forming a memory cell contacting region configured to electrically contact each of the memory cell structures, such that the memory cell contacting region comprises a plurality of contact regions which are at least partially displaced with respect to each other in a direction parallel to a main processing surface of the substrate, wherein each of the plurality of contact regions comprises a first doped region doped with doping atoms of a first conductivity type, wherein each of the plurality of contact regions further comprises second doped regions doped with doping atoms of a second conductivity type, wherein the second conductivity type is different from the first conductivity type, wherein the second doped regions are disposed next to the first doped region in a first direction.

20. A method for manufacturing an integrated circuit comprising a memory cell arrangement, the method comprising:
   forming a fin structure such that the fin structure comprises a first memory cell structure having at least one first active region of at least one first memory cell in the fin structure, and a second memory cell structure having at least one second active region of at least one second memory cell, wherein the second memory cell structure is disposed above the first memory cell structure; and
   forming a memory cell contact structure configured to electrically couple the first memory cell structure and the second memory cell structure, such that the memory cell contact structure has a staircase structure, a first step of which is configured to electrically contact the first memory cell structure, and a second step of which is configured to electrically contact the second memory cell structure, wherein the first step and the second step each comprises a first doped region doped with doping atoms of a first conductivity type, wherein the memory cell contact structure further comprises second doped regions doped with doping atoms of a second conductivity type, wherein the second conductivity type is different from the first conductivity type, wherein the second doped regions are disposed next to the first doped regions in the first direction.

* * * * *